(12) United States Patent
Jo et al.

(10) Patent No.: US 8,530,889 B2
(45) Date of Patent: Sep. 10, 2013

(54) CARBON NANOTUBE COMPOSITE, ORGANIC SEMICONDUCTOR COMPOSITE, AND FIELD-EFFECT TRANSISTOR

(75) Inventors: Yukari Jo, Shiga (JP); Seiichiro Murase, Shiga (JP); Daisuke Kitazawa, Shiga (JP); Jun Tsukamoto, Shiga (JP)

(73) Assignee: Toray Industries, Inc., Tokyo (JP)

( * ) Notice: Subject to any disclaimer, the term of this patent is extended or adjusted under 35 U.S.C. 154(b) by 37 days.

(21) Appl. No.: 12/992,483

(22) PCT Filed: May 11, 2009

(86) PCT No.: PCT/JP2009/058734
§ 371 (c)(1),
(2), (4) Date: Jan. 28, 2011

(87) PCT Pub. No.: WO2009/139339
PCT Pub. Date: Nov. 19, 2009

(65) Prior Publication Data
US 2011/0121273 A1    May 26, 2011

(30) Foreign Application Priority Data

May 12, 2008  (JP) .................................. 2008-124293
Jan. 7, 2009  (JP) .................................. 2009-001389

(51) Int. Cl.
*H01L 51/30* (2006.01)

(52) U.S. Cl.
USPC ... 257/40; 438/99; 257/E51.005; 257/E51.025; 257/E51.029; 257/E51.04

(58) Field of Classification Search
USPC .............. 438/99; 257/40, E51.005, E51.025, 257/E51.029, E51.04; 977/783, 784
See application file for complete search history.

(56) References Cited

U.S. PATENT DOCUMENTS

| | | | | |
|---|---|---|---|---|
| 7,244,515 B2 * | 7/2007 | Doi et al. | | 428/690 |
| 7,296,576 B2 * | 11/2007 | Ait-Haddou et al. | | 528/397 |
| 7,777,303 B2 * | 8/2010 | Alivisatos et al. | | 257/615 |
| 7,982,130 B2 * | 7/2011 | Forrest et al. | | 136/263 |
| 2010/0006154 A1 * | 1/2010 | Kitazawa et al. | | 136/263 |
| 2010/0117034 A1 * | 5/2010 | Han et al. | | 252/510 |

FOREIGN PATENT DOCUMENTS

| EP | 1449887 A1 | 8/2004 |
|---|---|---|
| EP | 1542294 A1 | 6/2005 |
| JP | 2005089738 A | 4/2005 |
| JP | 2005-268550 A | 9/2005 |
| JP | 2006-265534 A | 10/2006 |
| JP | 2006265534 A | 10/2006 |
| JP | 2008-56909 A | 3/2008 |
| JP | 2008056909 A | 3/2008 |

OTHER PUBLICATIONS

International Search Report in related application PCT/JP2009/058734 mailed Jul. 7, 2009.
Supplementary European Search Report in related application PCT/JP2009058734 mailed May 2, 2011.

* cited by examiner

*Primary Examiner* — George Fourson, III
(74) *Attorney, Agent, or Firm* — Pillsbury Winthrop Shaw Pittman LLP

(57) ABSTRACT

A carbon nanotube composite in which a conjugated polymer containing repeating units containing a fused heteroaryl unit having a nitrogen-containing double bond in the ring, and a thiophene unit is attached to at least a part of the surface of a carbon nanotube. The present invention reduces the hysteresis of a field-effect transistor having a semiconductor layer containing a carbon nanotube.

10 Claims, 1 Drawing Sheet

CARBON NANOTUBE COMPOSITE, ORGANIC SEMICONDUCTOR COMPOSITE, AND FIELD-EFFECT TRANSISTOR

CROSS REFERENCE TO RELATED APPLICATIONS

This application is a U.S. National phase of International Application No. PCT/JP2009/058734, filed May 11, 2009, which in turn claims priority to Japanese Patent Application No. 2008-124293, filed on May 12, 2008 and Japanese Patent Application No. 2009-001389, filed on Jan. 7, 2009. The contents of each of which are incorporated herein by reference in their entirety.

TECHNICAL FIELD

The present invention relates to a carbon nanotube composite in which a conjugated polymer is attached to at least a part of the surface of a carbon nanotube, an organic semiconductor composite containing the carbon nanotube composite and an organic semiconductor, and a field-effect transistor.

BACKGROUND ART

In recent years, a field-effect transistor (hereinafter referred to as FET) using an organic semiconductor excellent in moldability as a semiconductor layer has been proposed. Since by utilizing an organic semiconductor as an ink, it becomes possible to form a circuit pattern directly on a substrate, by inkjet technique or screening technique, FET using the organic semiconductor is being studied actively in place of the conventional inorganic semiconductor.

As an important index showing performance of FET, mobility is exemplified. Improvement in mobility means improvement in switching property of FET. For example, in a liquid crystal display apparatus, it leads to realization of high gradation. In the case of the liquid crystal display apparatus, mobility of FET is required to be 0.1 $cm^2/V \cdot sec$ or more.

In addition, as another important index, there is hysteresis. Hysteresis expresses a variation wide of a current value relative to voltage history, and it is necessary to make a value of hysteresis small for stably driving FET.

As a technique for improving mobility, a method of using a polymer composite having a carbon nanotube composite, in which a conjugated polymer is attached to a part of the surface of a carbon nanotube (e.g. see Patent Literatures 1 to 3), is disclosed. However, when a semiconductor layer formed of the polymer composite containing a carbon nanotube composite is used, although mobility is improved, there was a problem that hysteresis is great.

PRIOR ART LITERATURE

Patent Literature
Patent Literature 1: JP-A No. 2006-265534 gazette (claims)
Patent Literature 2: JP-A No. 2003-96313 gazette (claims)
Patent Literature 3: JP-A No. 2005-89735 gazette (claims)

SUMMARY OF THE INVENTION

Problems to be Solved by the Invention

An object of the present invention is to reduce the hysteresis of a field-effect transistor having a semiconductor layer containing a carbon nanotube.

Means for Solving the Problems

The present invention is a carbon nanotube composite in which a conjugated polymer comprising repeating units containing a fused heteroaryl unit having a nitrogen-containing double bond in the ring and a thiophene unit is attached to at least a part of the surface of a carbon nanotube.

In addition, the present invention is a field-effect transistor having a gate electrode, a gate insulating layer, a semiconductor layer, a source electrode and a drain electrode, wherein the semiconductor layer contains the carbon nanotube composite.

Effects of the Invention

According to the present invention, a field-effect transistor exhibiting high mobility and having reduced hysteresis can be provided.

MODES FOR CARRYING OUT THE INVENTION

Figure 1:
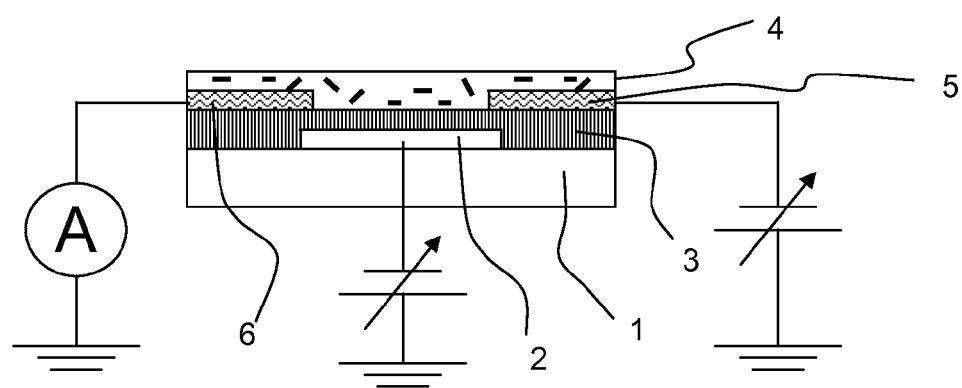
FIG. 1 is a schematic cross-sectional view showing FET which is one aspect of the present invention.

First, the carbon nanotube composite of the present invention will be described in detail. The carbon nanotube (hereinafter, referred to as CNT) composite of the present invention is a CNT composite in which a conjugated polymer comprising repeating units containing a fused heteroaryl unit having a nitrogen-containing double bond in the ring and a thiophene unit is attached to at least a part of the surface. In FET, while inclusion of CNT in a semiconductor layer can improve mobility, there was a problem that hysteresis is increased. As one cause for increase in hysteresis, it is thought that a trap amount due to impurities in CNT is changed depending on gate voltage history. In the present invention, hysteresis could be considerably improved while high mobility is retained, by using a CNT composite in which a conjugated polymer comprising repeating units containing a fused heteroaryl unit having a nitrogen-containing double bond in the ring and a thiophene unit is attached to at least a part of the surface of CNT. This is presumed that the trap can be decreased by a fused heteroaryl unit having a nitrogen-containing double bond in the ring, which is an electron withdrawing group. In addition, by a conjugated polymer having a thiophene unit, adherability between CNT and the conjugated polymer is increased, and CNT can be dispersed in a semiconductor layer well.

In the present invention, the state where the conjugated polymer is attached to at least a part of the surface of CNT means the state where a part or all of the surface of CNT is covered with the conjugated polymer. It is presumed that CNT can be covered with the conjugated polymer because interaction is generated by overlapping of π electron clouds derived from both conjugated structures. Whether CNT is covered with the conjugated polymer or not can be determined by a fact that the reflected color of covered CNT approaches the color of the conjugated polymer from the color of not covered CNT. Quantitatively, the presence of an attached substance, and a weight ratio of the attached substance relative to CNT can be identified by elementary analysis such as X-ray photoelectron spectrometry (XPS).

Examples of a method of attaching the conjugated polymer to CNT include (I) a method of adding CNT to a melted conjugated polymer, and mixing them, (II) a method of dissolving the conjugated polymer in a solvent, adding CNT thereto, and mixing them, (III) a method of pre-dispersing CNT in a solvent with ultrasound etc., and adding the conjugated polymer thereto, and mixing them, and (IV) a method of placing the conjugated polymer and CNT in a solvent, irradiating this mixed system with ultrasound, and mixing them. In the present invention, any method may be used, or a plurality of methods may be combined.

The conjugated polymer comprising repeating units containing a fused heteroaryl unit having a nitrogen-containing double bond in the ring, and a thiophene unit (hereinafter, referred to as conjugated polymer) may contain another unit in the repeating unit as far as it comprises these both units in the repeating unit. In addition, from a viewpoint of easy attachment to CNT, it is preferable that a weight average molecule weight is 1000 or more. Herein, the conjugated polymer refers to a compound in which a repeating unit has a conjugated structure, and a polymerization degree is 2 or more.

Examples of the fused heteroaryl unit having a nitrogen-containing double bond in the ring include units of thienopyrrole, pyrrolothiazole, pyrrolopyridazine, benzimidazole, benzotriazole, benzoxazole, benzothiazole, benzothiadiazole, quinoline, quinoxaline, benzotriazine, thienooxazole, thienopyridine, thienothiazine, and thienopyrazine. Among them, particularly, a benzothiadiazole unit or a quinoxaline unit is preferable. By having these units, trap derived from CNT can be more effectively decreased.

As the conjugated polymer, a conjugated polymer having the following structure is particularly preferable.

[Chemical formula 1]

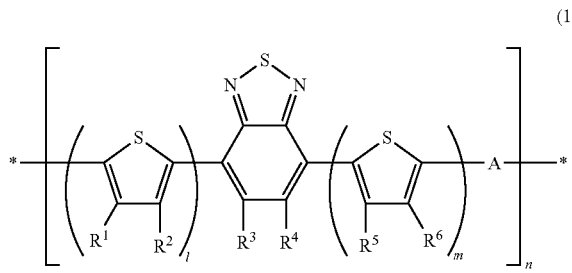

(1)

Wherein, $R^1$ to $R^6$ may be the same or different, and each represent hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an arylcarbonyloxy group or a silyl group. Alternatively, adjacent groups of $R^1$ to $R^6$ may form a ring structure. A is selected from a single bond, an arylene group, heteroarylene group except for a thienylene group, an ethenylene group, and an ethynylene group. l and m each represent an integer of 0 to 10, and $l+m \geq 1$. n represents a range of 2 to 1000. When l, m and n are 2 or more, $R^1$ to $R^6$ and A may be the same or different in each repeating unit.

The alkyl group represents a saturated aliphatic hydrocarbon group, such as a methyl group, an ethyl group, an n-propyl group, an isopropyl group, a n-butyl group, a sec-butyl group, and a tert-butyl group, and may or may not have a substituent. When the alkyl group has a substituent, the substituent is not particularly limited, and examples include an alkoxy group, an aryl group, a heteroaryl group etc., and these substituents may further have a substituent. In addition, the carbon number of the alkyl group is not particularly limited, but from a viewpoint of easy availability and the cost, the number is preferably 1 or more and 20 or less, more preferably 1 or more and 8 or less.

The cycloalkyl group represents a saturated alicyclic hydrocarbon group, such as a cyclopropyl group, a cyclohexyl group, a norbornyl group, and an adamantyl group, and may or may not have a substituent. When the cycloalkyl group has a substituent, the substituent is not particularly limited, but examples include an alkyl group, an alkoxy group, an aryl group, a heteroaryl group etc., and these substituents may further have a substituent. Explanation regarding these substituents are common to the following description, unless otherwise is indicated. The carbon number of the cycloalkyl group is not particularly limited, but a range of 3 or more and 20 or less is preferable.

The heterocyclic group represents a group derived from an aliphatic ring having an atom other than carbon, such as a pyran ring, a piperidine ring, and an amide ring in the ring, and may or may not have a substituent. The carbon number of the heterocyclic group is not particularly limited, but a range of 2 or more and 20 or less is preferable.

The alkenyl group represents an unsaturated aliphatic hydrocarbon group containing a double bond, such as a vinyl group, an allyl group, and a butadienyl group, and may or may not have a substituent. The carbon number of the alkenyl group is not particularly limited, but a range of 2 or more and 20 or less is preferable.

The cycloalkenyl group represents an unsaturated alicyclic hydrocarbon group containing a double bond, such as a cyclopentenyl group, a cyclopentadienyl group, and a cyclohexenyl group, and may or may not have a substituent. The carbon number of the cycloalkenyl group is not particularly limited, but a range of 3 or more and 20 or less is preferable.

The alkynyl group represents an unsaturated aliphatic hydrocarbon group containing a triple bond, such as an ethynyl group, and may or may not have a substituent. The carbon number of the alkynyl group is not particularly limited, but a range of 2 or more and 20 or less is preferable.

The alkoxy group represents a functional group in which one side of an ether bond is substituted with an aliphatic hydrocarbon group, such as a methoxy group, an ethoxy group, and a propoxy group, and may or may not have a substituent. The carbon number of the alkoxy group is not particularly limited, but a range of 1 or more and 20 or less is preferable.

The alkylthio group is such that an oxygen atom of an ether bond of an alkoxy group is substituted with a sulfur atom, and may or may not have a substituent. The carbon number of the alkylthio group is not particularly limited, but a range of 1 or more and 20 or less is preferable.

The arylether group represents a functional group in which one side of an ether bond is substituted with an aromatic hydrocarbon group, such as a phenoxy group, and a naphthoxy group, and may or may not have a substituent. The carbon number of the aryl ether group is not particularly limited, but a range of 6 or more and 40 or less is preferable.

The arylthioether group is such that an oxygen atom of an ether bond of an aryl ether group is substituted with a sulfur atom, and may or may not have a substituent. The carbon number of the arylthioether group is not particularly limited, but a range of 6 or more and 40 or less is preferable.

The aryl group represents an aromatic hydrocarbon group, such as a phenyl group, a naphthyl group, a biphenyl group, an anthracenyl group, a phenanthryl group, a terphenyl group, and a pyrenyl group, and may or may not have a substituent. The carbon number of the aryl group is not particularly limited, but a range of 6 or more 40 or less is preferable.

The heteroaryl group represents an aromatic group having one or more atoms other than carbon in a ring, such as a furanyl group, a thiophenyl group, a benzofuranyl group, a dibenzofuranyl group, a pyridyl group, and a quinolinyl group, and may or may not have a substituent. The carbon number of the heteroaryl group is not particularly limited, but a range of 2 or more and 30 or less is preferable.

The halogen atom represents fluorine, chlorine, bromine or iodine.

The alkylcarbonyl group represents a functional group in which one side of a carbonyl bond is substituted with an aliphatic hydrocarbon group, such as an acetyl group, and a hexanoyl group, and may or may not have a substituent. The carbon number of the alkylcarbonyl group is not particularly limited, but a range of 2 or more and 20 or less is preferable.

The arylcarbonyl group represents a functional group in which one side of a carbonyl bond is substituted with an aromatic hydrocarbon group, such as a benzoyl group, and may or may not have a substituent. The carbon number of the arylcarbonyl group is not particularly limited, but a range of 7 or more and 40 or less is preferable.

The alkoxycarbonyl group represents a functional group in which one side of a carbonyl bond is substituted with an alkoxy group, such as a methoxycarbonyl group, and may or may not have a substituent. The carbon number of the alkoxycarbonyl group is not particularly limited, but a range of 2 or more and 20 or less is preferable.

The aryloxycarbonyl group represents a functional group in which one side of a carbonyl bond is substituted with an aryloxy group, such as a phenoxycarbonyl group, and may or may not have a substituent. The carbon number of the aryloxycarbonyl group is not particularly limited, but a range of 7 or more and 40 or less is preferable.

The alkylcarbonyloxy group represents a functional group in which one side of an ether bond is substituted with an alkylcarbonyl group, such as an acetoxy group, and may or may not have a substituent. The carbon number of the alkylcarbonyloxy group is not particularly limited, but a range of 2 or more and 20 or less is preferable.

The arylcarbonyloxy group represents a functional group in which one side of an ether bond is substituted with an arylcarbonyl group, such as a benzoyloxy group, and may or may not have a substituent. The carbon number of the arylcarbonyloxy group is not particularly limited, but a range of 7 or more and 40 or less is preferable.

The carbamoyl group, the amino group and the silyl group may or may not have a substituent. When those groups have a substituent, examples thereof include an alkyl group, a cycloalkyl group, an aryl group, and a heteroaryl group, and these substituents may further have a substituent.

The case where adjacent groups are bound each other to form a ring structure will be described referring to the general formula (1). For example, $R^1$ and $R^2$ are bound each other to form a conjugated or non-conjugated fused ring. Constituent elements of the fused ring may contain nitrogen, oxygen, sulfur, phosphorus, and silicone atoms in addition to carbon, and may be further fused with another ring.

Then, A of the general formula (1) will be described. An arylene group represents a divalent (two places of binding sites) aromatic hydrocarbon group, and may be unsubstituted or substituted. Examples of a substituent when the arylene group is substituted, include the alkyl group, a heteroaryl group, and halogen. Preferable examples of the arylene group include a phenylene group, a naphthylene group, a biphenylene group, a phenanthrylene group, an anthrylene group, a terphenylene group, a pyrenylene group, a fluorenylene group, and a perylenylene group.

The heteroarylene group represents a divalent heterocyclic aromatic ring, and may be unsubstituted or substituted. Preferable examples of the heteroarylene group include divalent groups derived from a heterocyclic aromatic ring, such as benzofuran, dibenzofuran, benzothiophene, dibenzothiophene, benzodithiophene, benzosilol and dibenzosilol, in addition to a pyridylene group, a pyrazylene group, a quinolinylene, an isoquinolinylene group, a quinoxalylene group, an acridinylene group, an indolylene, and a carbazolylene group.

In the general formula (1), l and m represent an integer of 0 to 10, and $l+m \geqq 1$. Since by containing the thiophene unit in a structure, adherability with CNT is improved, and dispersibility of CNT is improved, l and m are each preferably 1 or more, further preferably $l+m \geqq 4$. In addition, from a viewpoint of easiness of synthesis of monomer, and polymerization thereafter, $l+m \leqq 12$ is preferable.

n represents a polymerization degree of the conjugated polymer, and is in a range of 2 to 1000. In view of easiness of attachment to CNT, n is preferably in a range of 3 to 500. In the present invention, a polymerization degree n is a value obtained from a weight average molecule weight. The weight average molecule weight is obtained by measurement using GPC (gel permeation chromatography), and conversion using a standard sample of polystyrene.

In addition, from easiness of formation of the CNT composite, it is preferable that the conjugated polymer is soluble in a solvent, and it is preferable that at least one of $R^1$ to $R^6$ is an alkyl group.

Examples of the conjugated polymers include conjugated polymers having the following structures.

[Chemical formula 2]

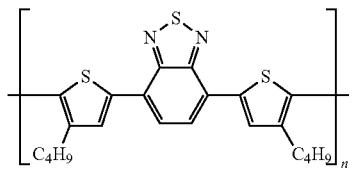

[1]

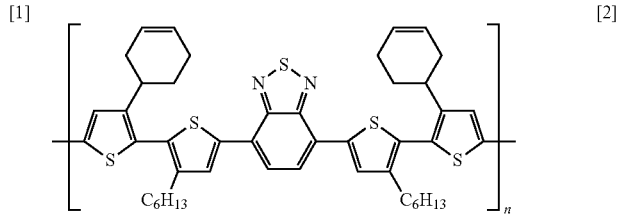

[2]

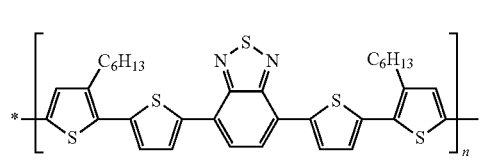
[3]
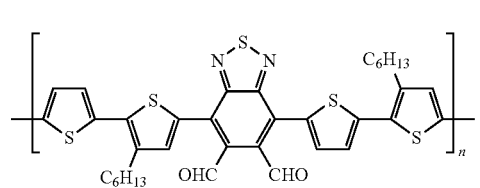
[4]
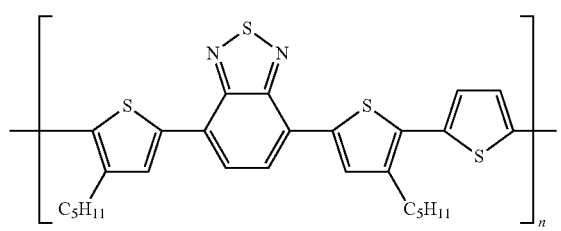
[5]
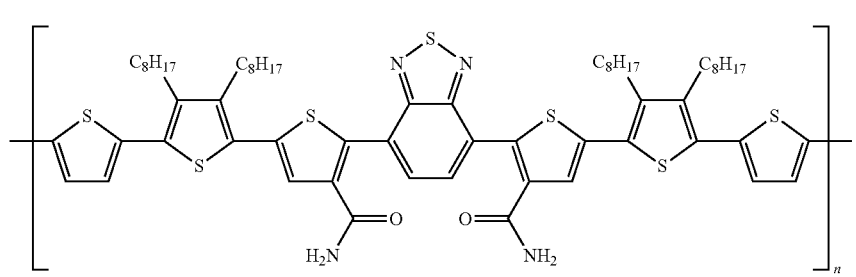
[6]
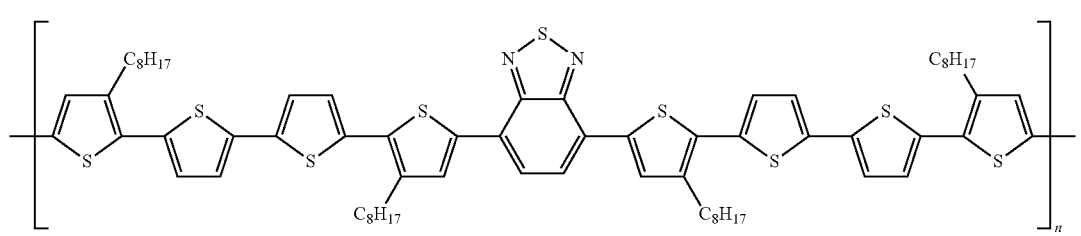
[7]
[Chemical formula 3]
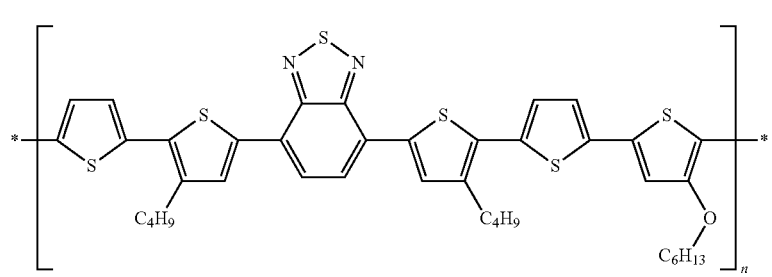
[8]
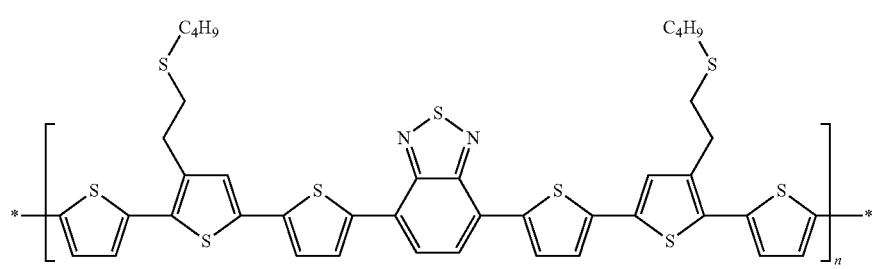
[9]

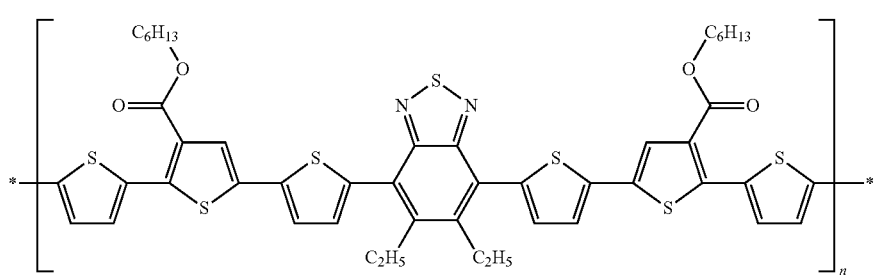
[10]
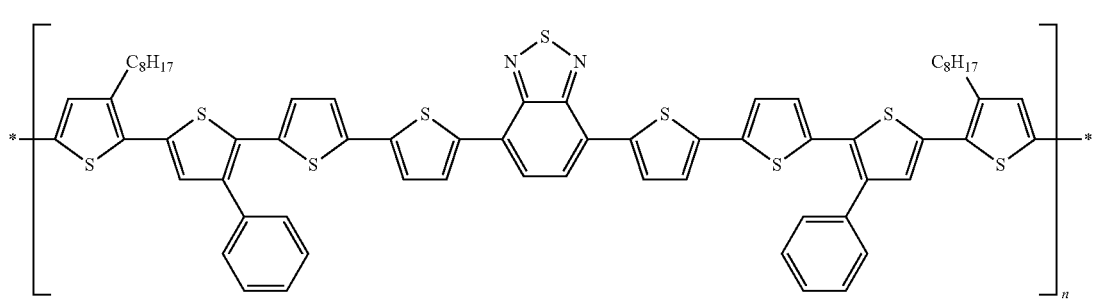
[11]
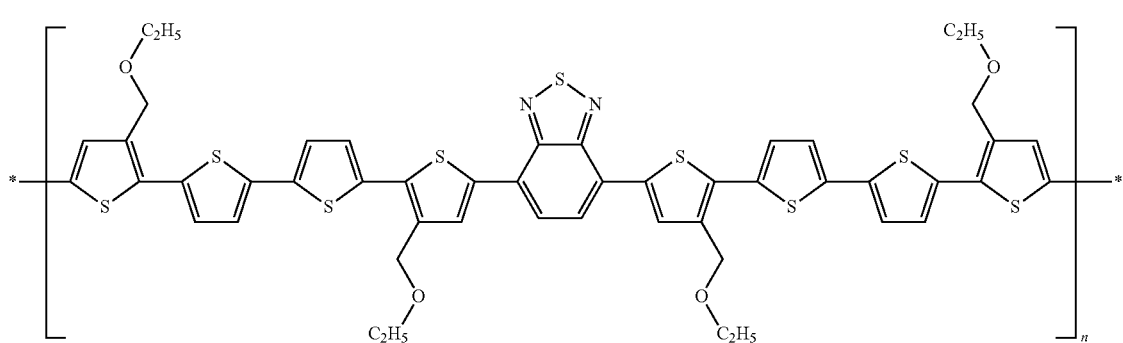
[12]
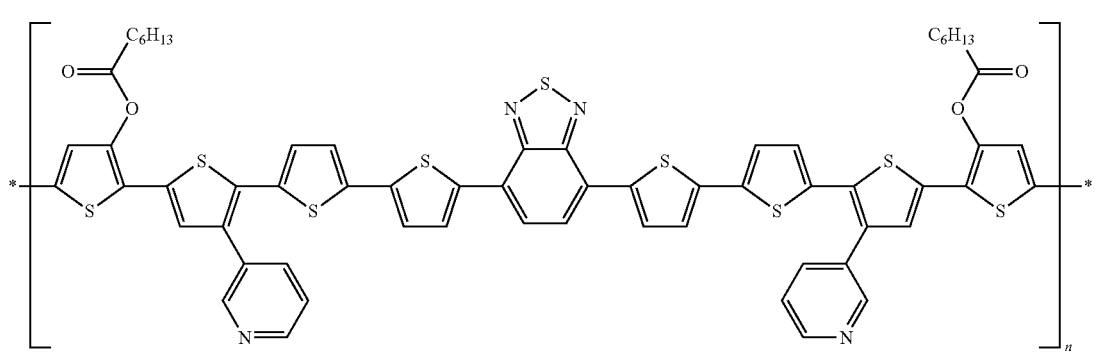
[13]
[Chemical formula 4]
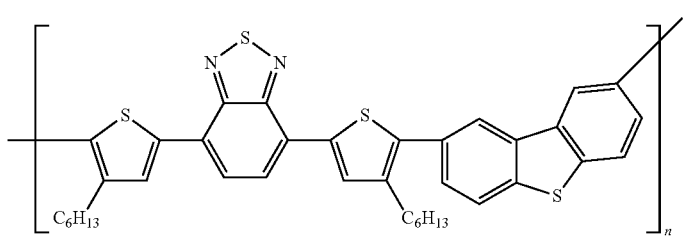
[14]

-continued
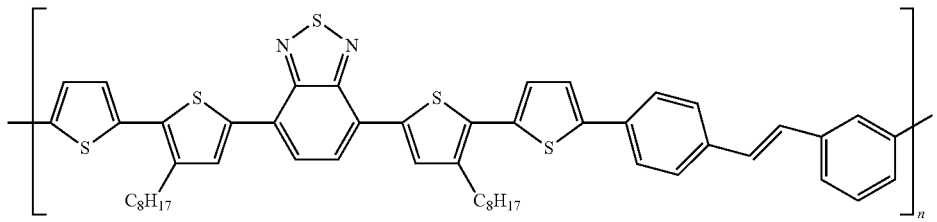
[15]
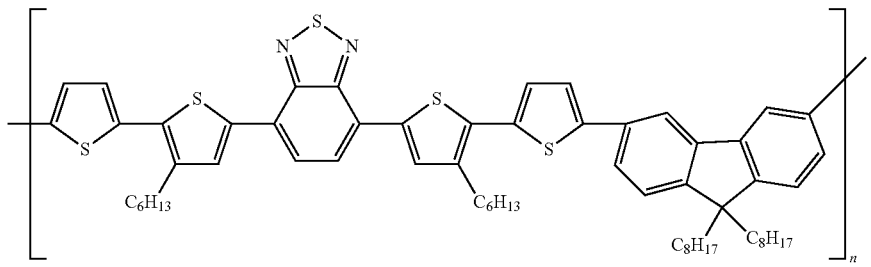
[16]
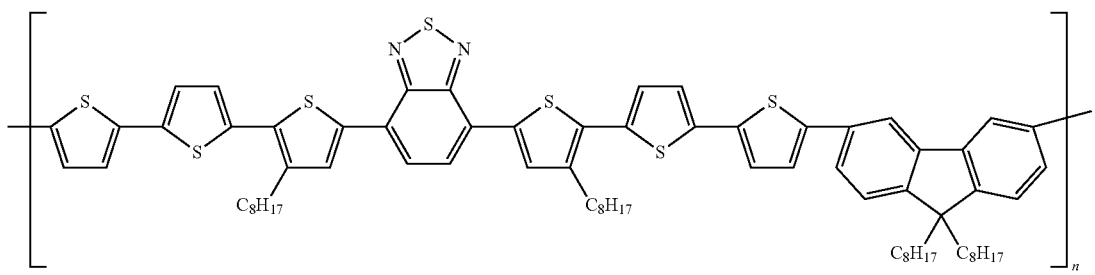
[17]
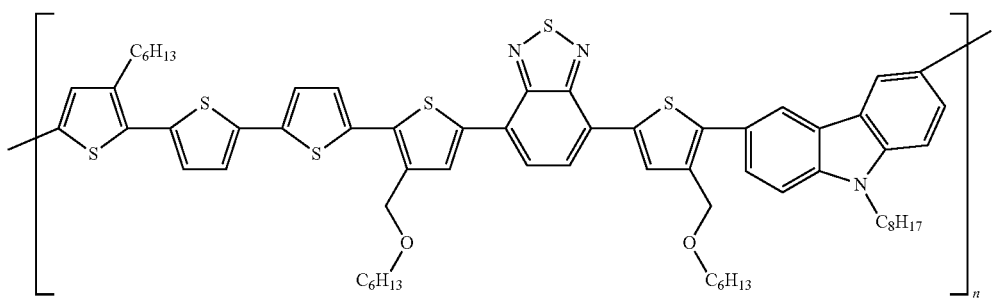
[18]
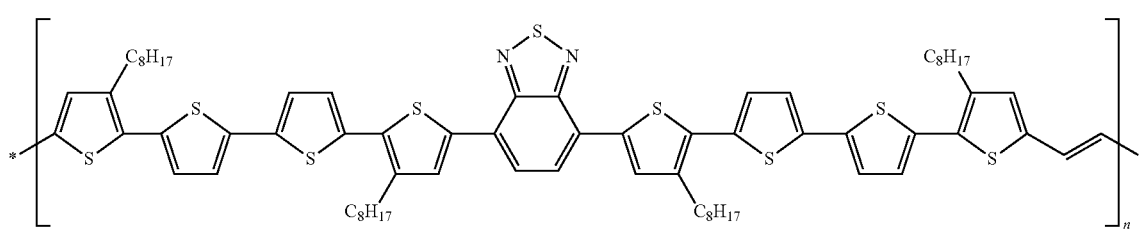
[19]
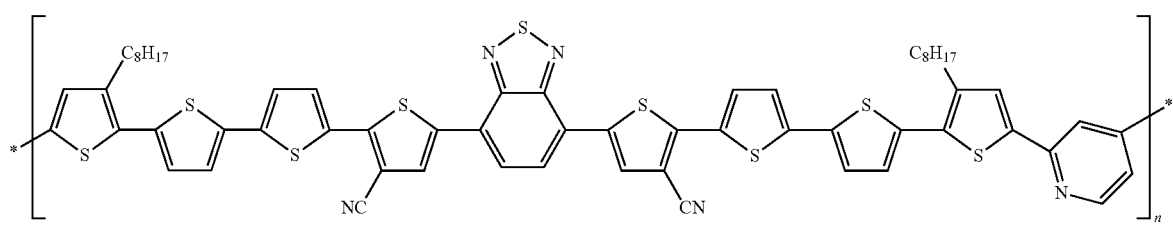
[20]

[Chemical formula 5]
[21]
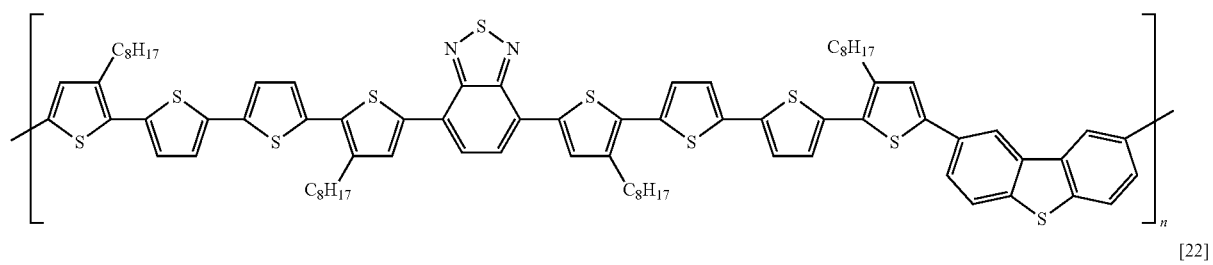
[22]
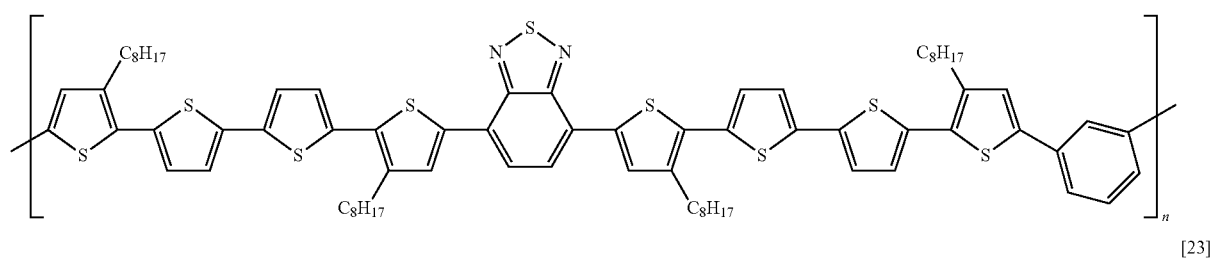
[23]
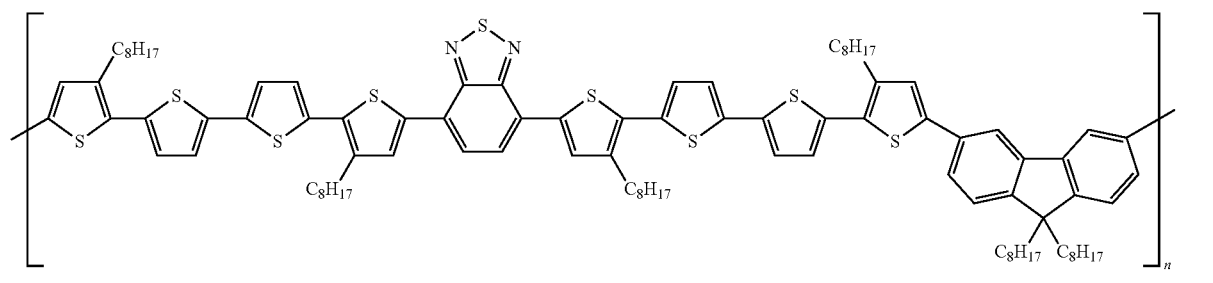
[24]
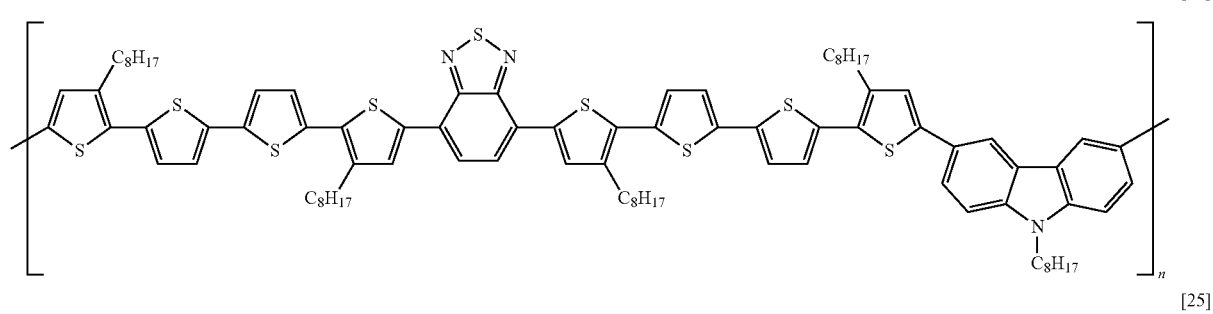
[25]
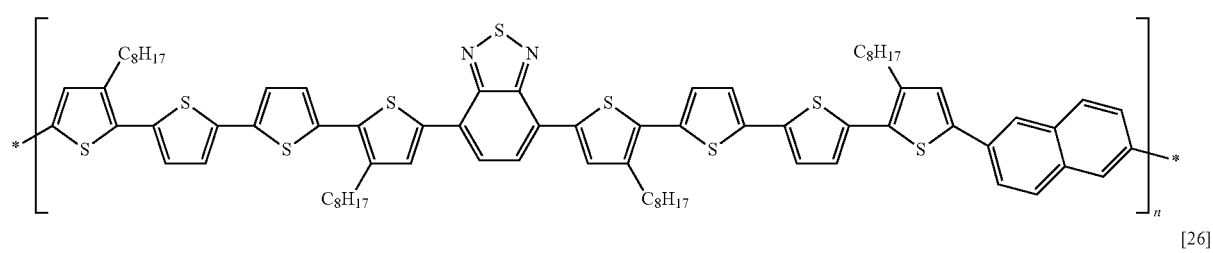
[26]
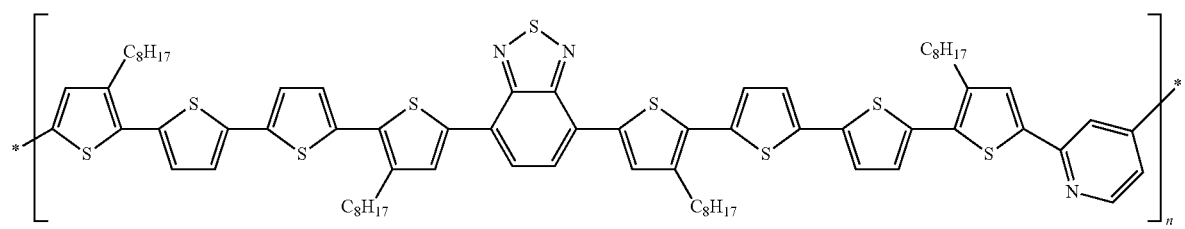

[Chemical formula 6]
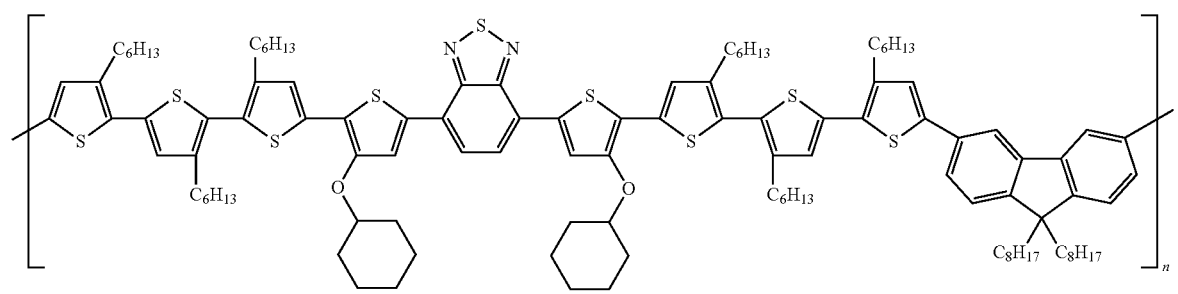
[27]
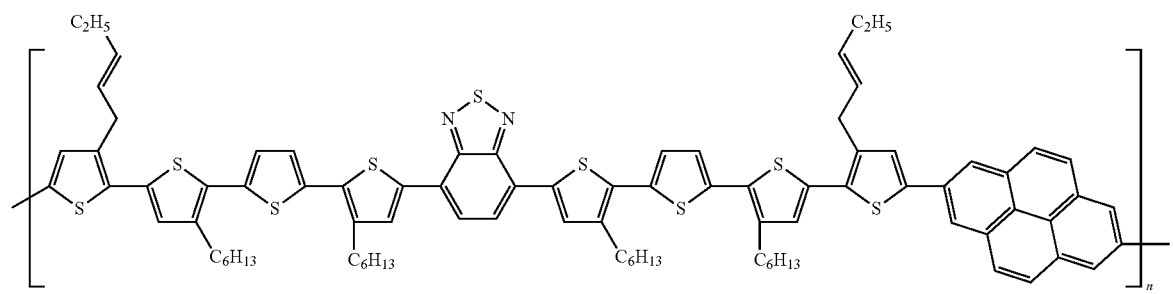
[28]
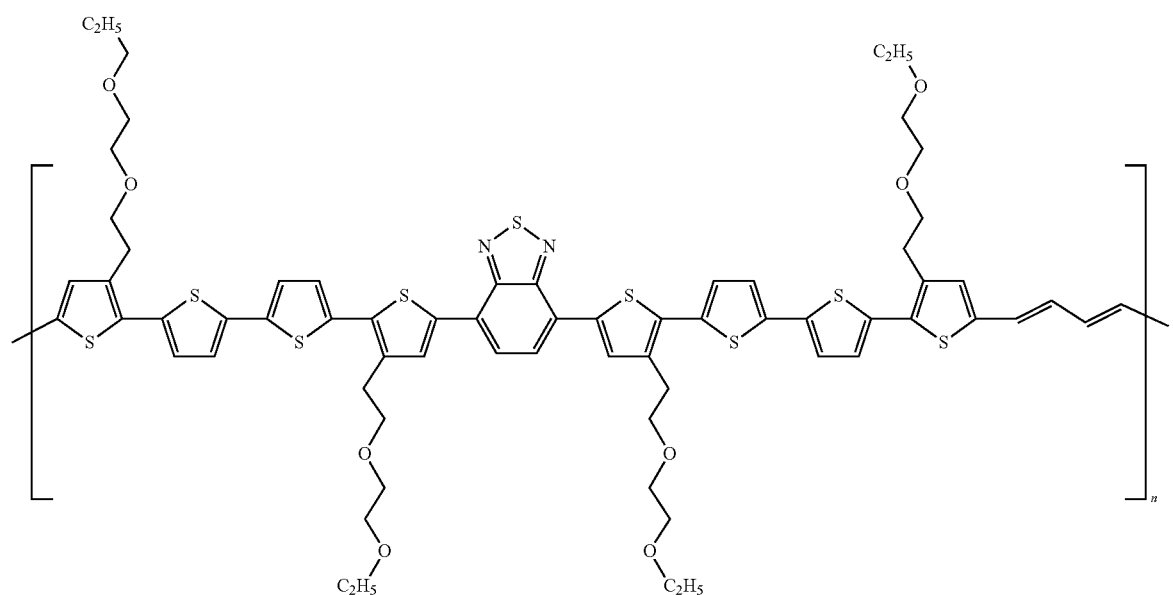
[29]
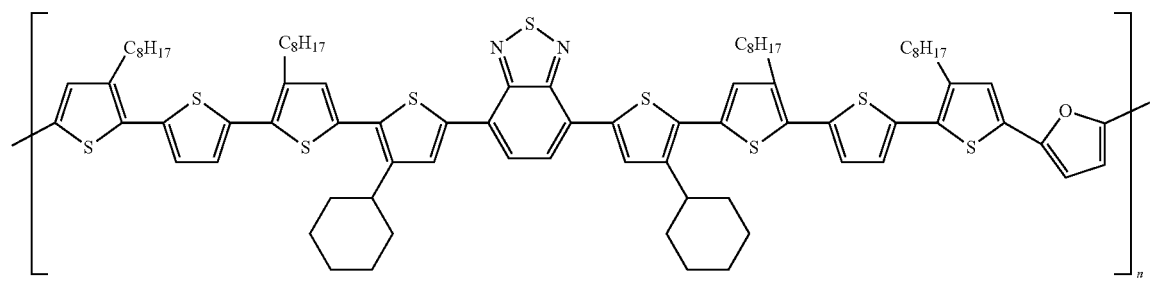
[30]

-continued
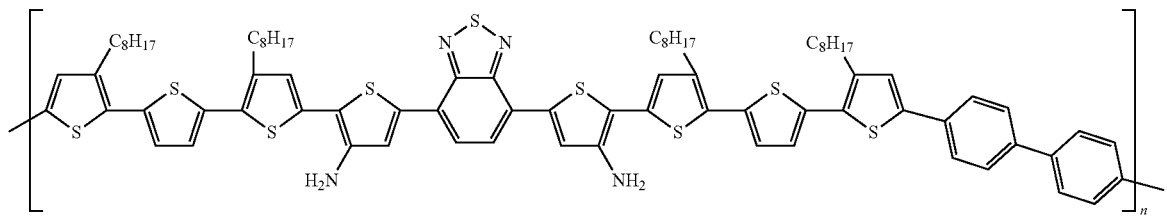
[31]
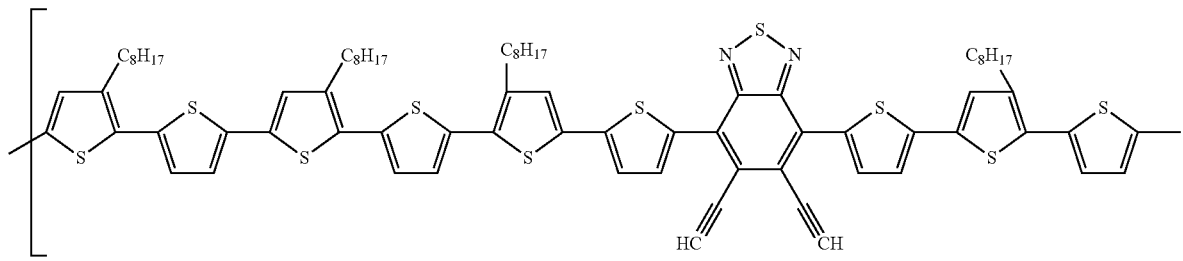
[32]
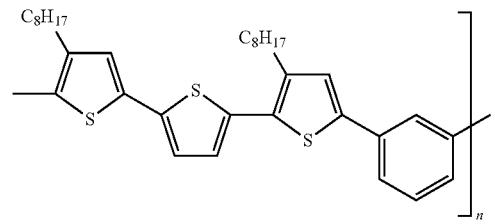
[Chemical formula 7]
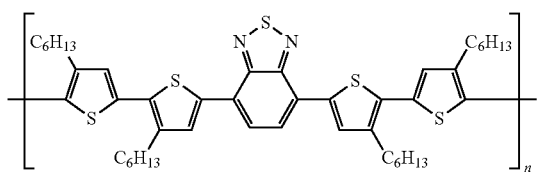
[33]
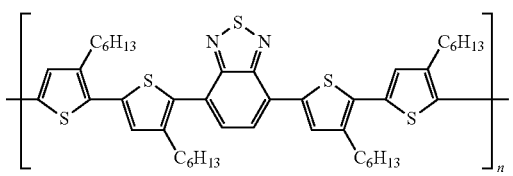
[34]
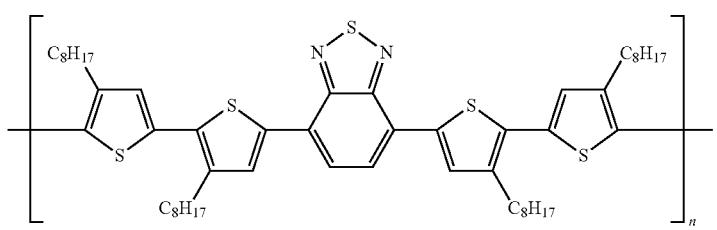
[35]
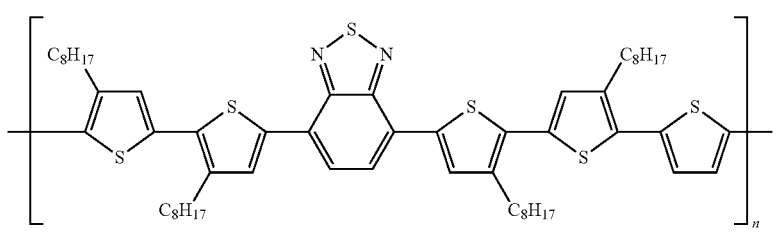
[36]

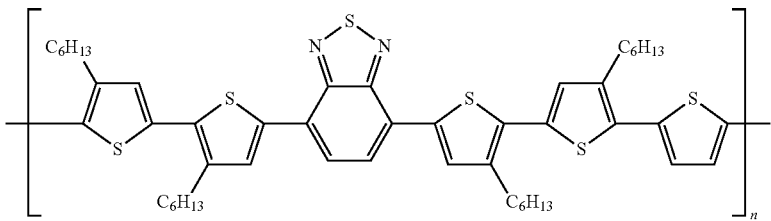
[37]
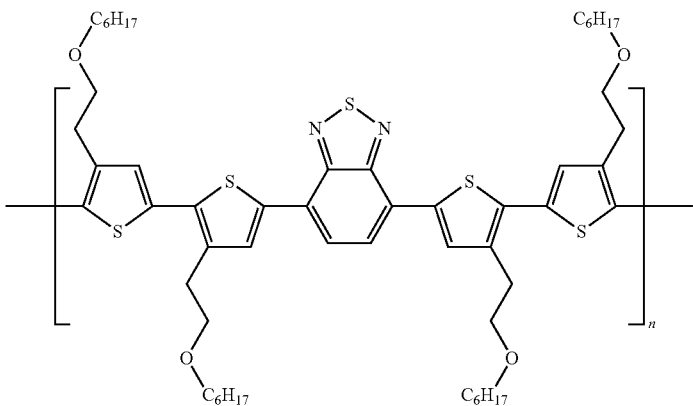
[38]
[Chemical formula 8]
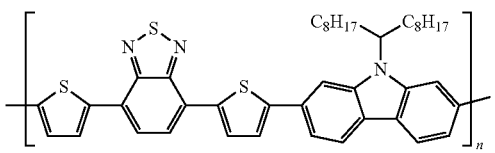
[39]
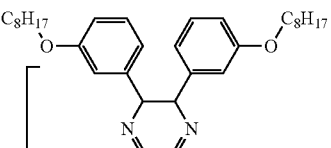
[40]
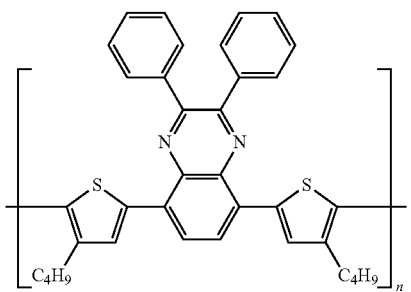
[41]
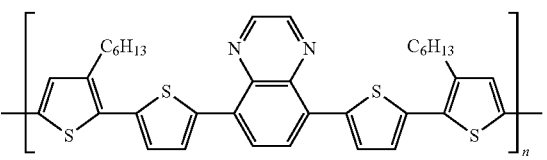
[42]
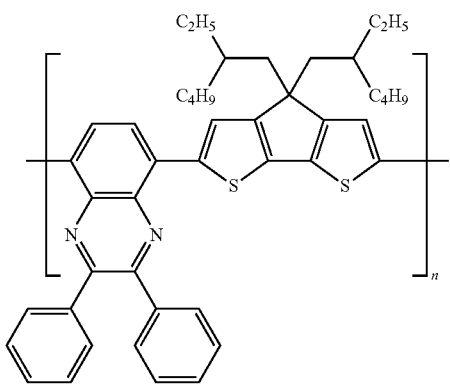
[43]

[Chemical formula 9]
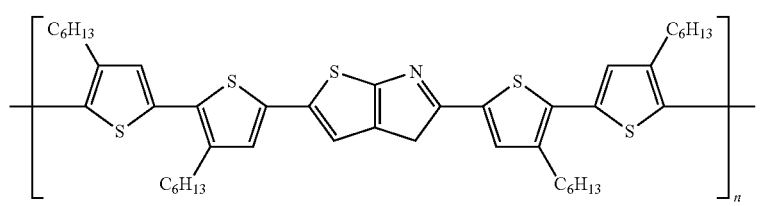 [44]
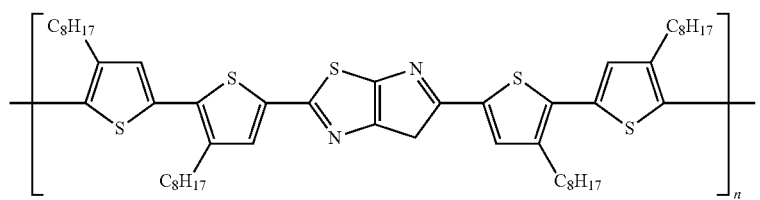 [45]
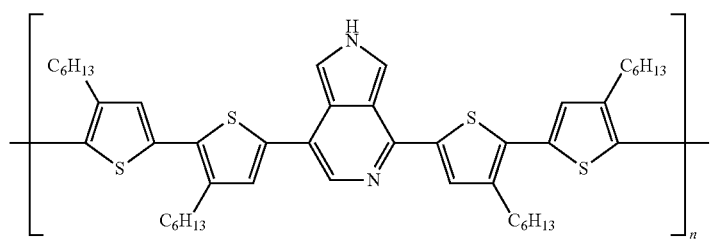 [46]
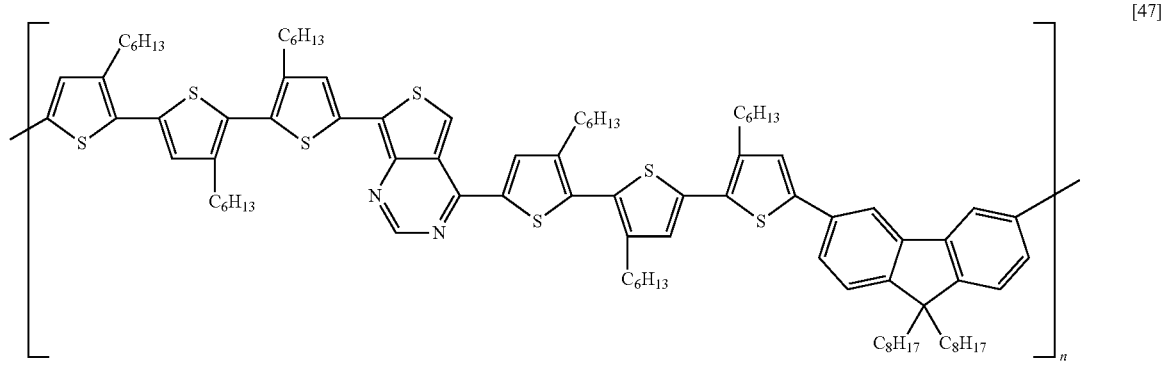 [47]
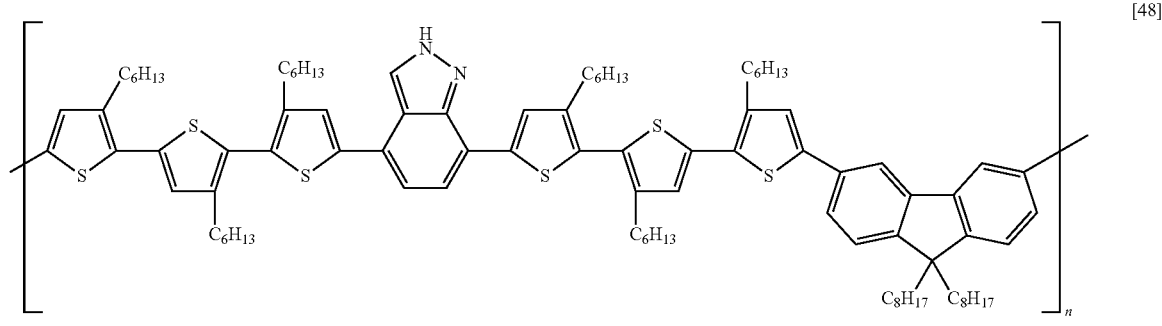 [48]
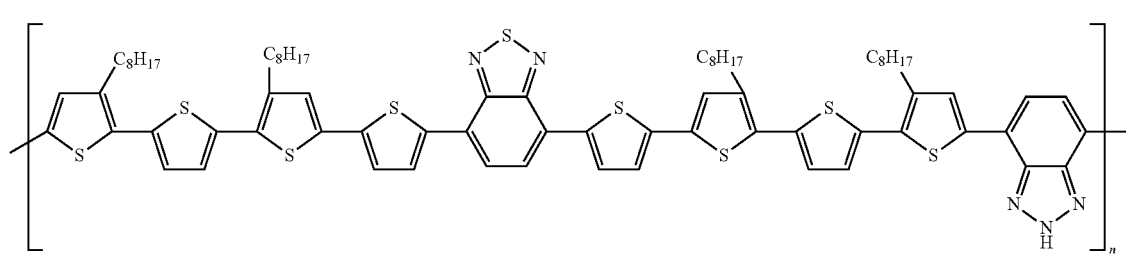 [49]

-continued

[Chemical formula 10]

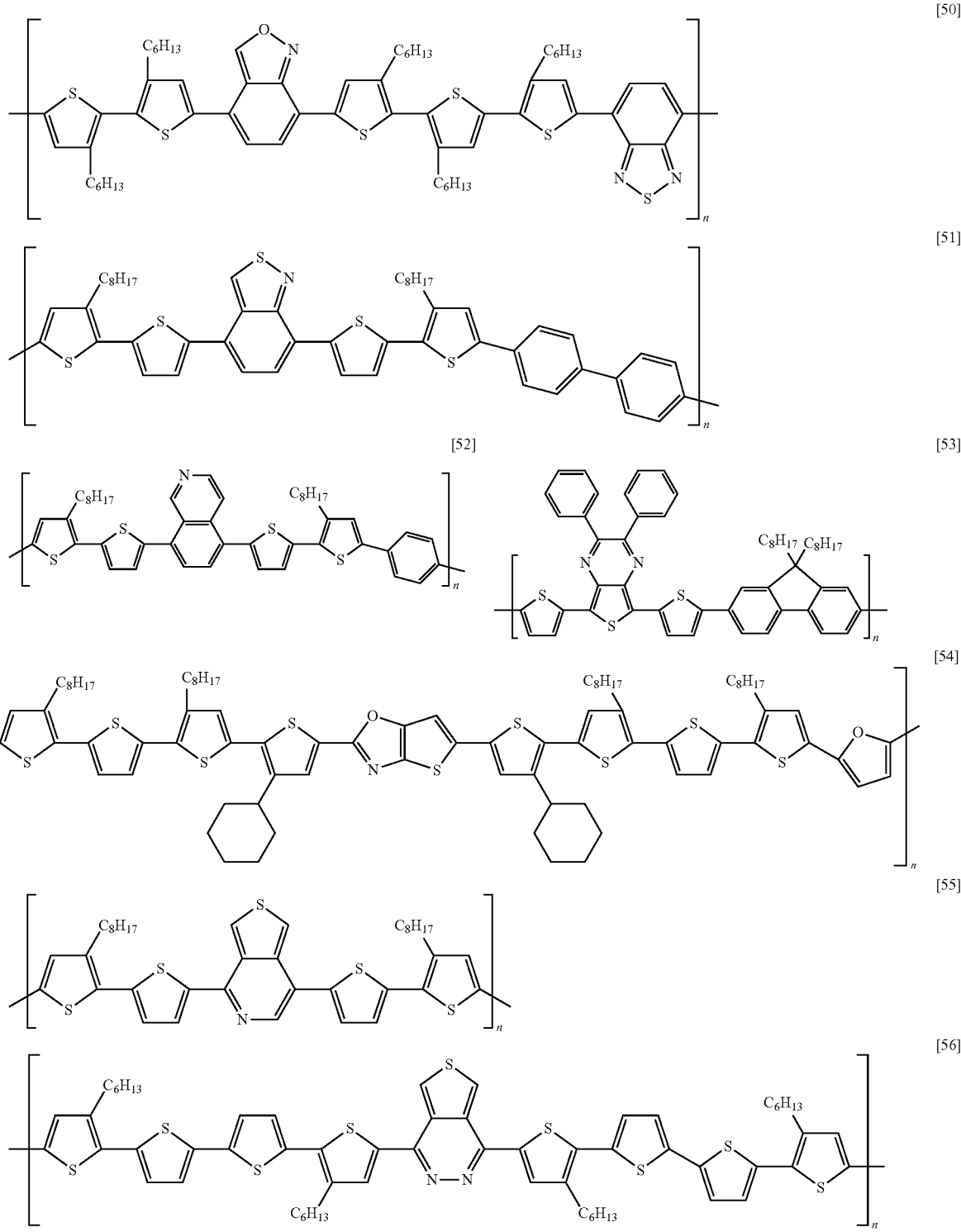

In addition, the conjugated polymer can be synthesized by the known method. For example, examples of a method of joining thiophene with a benzothiadiazole group include a method of coupling halogenated benzothiadiazole and thiopheneboronic acid or thiopheneboronic acid ester under a palladium catalyst, and a method of coupling halogenated benzothiadiazole and a thiophene Grignard reagent under a nickel or palladium catalyst. In addition, when other unit and the thiophene unit are joined, halogenated other unit and the thiophene unit can be coupled by the similar method. Further, the conjugated polymer can be obtained by introducing a polymerizable functional group into an end of the thus obtained monomer, and proceeding polymerization under a palladium catalyst or a nickel catalyst.

It is preferable that, in the conjugated polymer, impurities such as raw materials used in a synthesis process and byproducts are removed. As method of removing impurities, for example, a silica gel columngraphy method, a Soxhlet extraction method, a filtration method, an ion exchange method, and a chelate method can be used. Two or more kinds of these methods may be combined.

As CNT, any of monolayer CNT in which one carbon film (hereinafter, referred to as graphene sheet) is wound in a cylinder manner, bilayer CNT in which two graphene sheets are wound concentrically, and multilayer CNT in which a plurality of graphene sheets are wound concentrically may be used, and two or more kinds of them may be used. CNT can be obtained by an arc discharge method, a chemical vapor deposition method (CVD method), a laser abrasion method etc.

When used in a semiconductor layer of FET, it is preferable that the length of CNT is shorter than a distance between a source electrode and a drain electrode (channel length). An average length of CNT depends upon a channel length, and is preferably 2 μm or less, more preferably 0.5 μm or less. Since commercially available CNT has generally distribution in a length and contains CNT longer than a channel length in some cases, it is preferable to add a step of making CNT shorter than a channel length. For example, a method of cutting CNT into short fibers by acid treatment with nitric acid, or sulfuric acid, ultrasound treatment, or freezing grinding method is effective. In addition, combined use of separation with a filter is further preferable in that a purity of CNT is improved.

It is preferable to provide a step of uniformly dispersing CNT in a solvent, and filtering the dispersion with a filter. CNT having a size shorter than a channel length is effectively obtained by obtaining CNT having a size smaller than a filter pore diameter from a filtrate. In this case, as a filter, a membrane filter is preferably used. It is enough that the pore diameter of a filter used in filtration is smaller than a channel length, and the pore diameter is preferably 0.5 to 10 μm. As another method of shortening CNT, acid treatment, and freezing grinding treatment are exemplified.

In addition, the diameter of CNT is not particularly limited, but is preferably 1 nm or more and 100 nm or less, more preferably 50 nm or less.

The CNT composite of the present invention per se can be used as a semiconductor layer of FET, and an organic semiconductor composite containing the CNT composite and an organic semiconductor can be also preferably used. By uniformly dispersing the CNT composite in the organic semiconductor, it becomes possible to realize higher mobility while the properties of the organic semiconductor itself are maintained.

The organic semiconductor used in the organic semiconductor composite of the present invention can be used regardless of a molecular weight, as far as it is a material exhibiting semiconductivity. A material having high carrier mobility is preferable. In addition, since an organic semiconductor which is soluble in an organic solvent can simply form an organic semiconductor layer by applying a solution to a substrate or a film, it is preferable. A kind of the organic semiconductor is not particularly limited, but examples include polythiophenes such as poly-3-hexylthiophene, and polybenzothiophene; copolymers containing a thiophene unit in a main chain such as poly(2,5-bis(2-thienyl)-3,6-dipentadecylthieno[3,2-b]thioph ene), poly(4,8-dihexyl-2,6-bis(3-hexylthiophen-2-yl)benzo[1,2-b:4,5-b']dithiophene), poly (4-oethyl-2-(3-oethylthiophen-2-yl)thiazole), and poly(5,5'-bis(4-octylthiazol-2-yl)-2,2'-bithiophene); polypyrroles; poly(p-phenylenevinylene)s such as poly(p-phenylenevinylene); polyanilines; polyacetylenes; polydiacetylenes; polycarbazoles; polyfurans such as polyfuran, and polybenzofuran; polyheteroaryls containing a nitrogen-containing aromatic ring as a constitutional unit, such as pyridine, quinoline, phenanthroline, oxazole, and oxadiazole; fused polycyclic aromatic compounds such as anthracene, pyrene, naphthacene, pentacene, hexacene, and rubrene; nitrogen-containing aromatic compounds such as furan, thiophene, benzothiophene, dibenzofuran, pyridine, quinoline, phenanthroline, oxazole, and oxadiazole; aromatic amine derivatives, a representative of which is 4,4'-bis(N-(3-methylphenyl)-N-phenylamino)biphenyl; biscarbazole derivatives such as bis(N-allylcarbazole) and bis(N-alkylcarbazole); pyrazoline derivatives; stilbene-based compounds; hydrorazone-based compounds; metal pathalocyanines such as copper phthalocyanine; metal porphyrins such as copper porphyrin; distyrylbenzene derivatives; aminostyryl derivates; aromatic acetylene derivatives; fused ring tetracarboxylic acid diimides such as naphthalene-1,4,5,8-tetracarboxilic acid diimide, perylene-3,4,9,10-tetracarboxylic acid diimide; organic dyes such as merocyanine, phenoxazine, and rhodamine. Two or more kinds of them may be contained. Since the conjugated polymer contained in the CNT composite contains the thiophene unit, an organic semiconductor having the thiophene unit in a structure is preferable.

Examples of a method of forming an organic semiconductor composite include a method of mixing a solution containing the CNT composite, and an organic semiconductor or a solution thereof. In addition, if necessary, a heating step for promoting mixing, or an ultrasound irradiation step may be added, or a step of removing a solid component such as filtration may be added.

The content of the CNT composite in the organic semiconductor composite is preferably 0.01 part by weight or more and 3 parts by weight or less, more preferably 1 part by weight or less relative to 100 parts by weight of the organic semiconductor. By addition of the CNT composite in this range, mobility of the organic semiconductor can be considerably increased. However, when the CNT composite is mixed at an amount exceeding 3 parts by weight, a ratio of contact between CNTs is increased, and electrical conductivity of the organic semiconductor composite is increased, approaching metal state and, therefore, this is not preferable.

Then, the organic FET using the CNT composite of the present invention will be described. The organic FET of the present invention is an organic field-effect transistor having a gate electrode, a gate insulating layer, a semiconductor layer, a source electrode and a drain electrode, and the semiconductor layer contains the CNT composite of the present invention.

Figure 2:
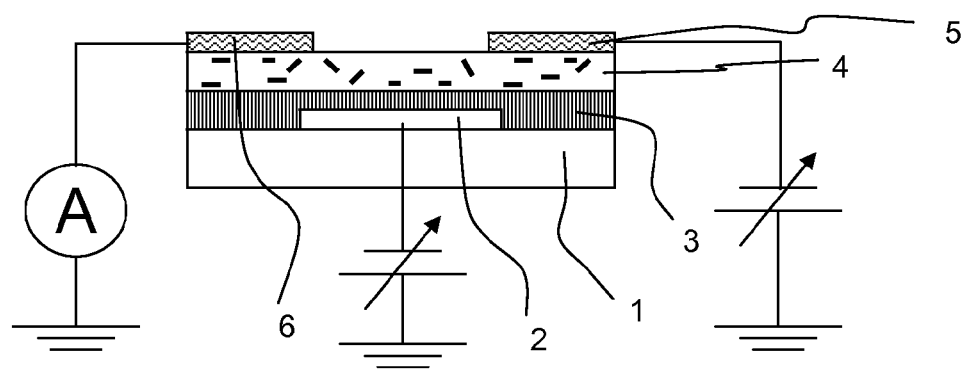
FIG. 2 is a schematic cross-sectional view showing FET which is another aspect of the present invention.

FIG. 1 and FIG. 2 are a schematic cross-sectional view showing an example of FET of the present invention. In FIG. 1, a source electrode 5 and a drain electrode 6 are formed on a substrate 1 having a gate electrode 2 covered with a gate insulating layer 3, and a semiconductor layer 4 containing the CNT composite is further formed thereon. In FIG. 2, the semiconductor layer 4 containing the CNT composite of the present invention is formed on the substrate 1 having the gate electrode 2 covered with the gate insulating layer 3, and the source electrode 5 and the drained electrode 6 are further formed thereon.

Examples of the material used in the substrate 1 include inorganic materials such as a silicon wafer, a glass, and an alumina sintered body, and organic materials such as polyimide, polyester, polycarbonate, polysulfone, polyethersulfone, polyethylene, polyphenylene sulfide, and polyparaxylene.

Examples of a material used in the gate electrode 2, the source electrode 5 and the drain electrode 6 include electrically conductive metal oxides such as tin oxide, indium oxide, and tin indium oxide (ITO); metals such as aluminum, indium, chromium. lithium, sodium, potassium, cesium, calcium, magnesium, palladium, molybdenum, amorphous silicon and polysilicon; alloys thereof; inorganic electrically conductive materials such as copper iodide and copper sulfide; electrically conductive polymers such as polythiophene, polypyrrole, polyaniline, and a complex of polyethylenedioxythiophene and polystyrenesulfonic acid, which were doped with iodine etc., to improve electrical conductivity, being not limiting. Alternatively, a plurality of materials may be used for laminating or mixing.

Examples of a method of forming the gate electrode 2, the source electrode 5 and the drain electrode 6 include resistance heating deposition, electron beam, sputtering, plating, CVD, ion plating coating, inkjet and printing, and there is not particularly limitation as far as conduction can be taken. In addition, as a method of forming an electrode pattern, an electrode film manufactured by the above method may be pattern-formed into a desired shape by the known photolithography, or may be pattern-formed via a desired shaped mask at deposition or sputtering of an electrode material.

A material used in the gate insulating layer 3 is not particularly limited, but examples include inorganic materials such as silicon oxide, and alumina; organic polymer materials such as polyimide, polyvinyl alcohol, polyvinyl chloride, polyethylene terephthalate, polyvinilidene fluoride, polysiloxane, and polyvinyl phenol (PVP); mixtures of inorganic material powders and organic polymer materials. The film thickness of the gate insulating layer is preferably 50 nm to 3 μm, more preferably 100 nm to 1 μm. The gate insulating layer may be a monolayer or multilayer. In addition, one layer may be formed of a plurality of insulating materials, or a plurality of insulating materials may be laminated to form a plurality of gate insulating layers.

Examples of a method of forming the gate insulating layer is not particularly limited, but include methods such as resistance heating deposition, electron beam, sputtering, CVD, ion plating, coating, inkjet and printing, and the method can be used depending on a material.

In FET of the present invention, the semiconductor layer 4 contains the CNT composite of the present invention. By inclusion of the CNT composite of the present invention in the semiconductor layer, hysteresis can be reduced while high mobility is retained.

Further, in the semiconductor layer 4, the organic semiconductor composite can be also preferably used. That is, it is preferable that, in addition to the CNT composite, the organic semiconductor is further contained in the semiconductor layer 4. By dispersing the CNT composite in the organic semiconductor uniformly, it becomes possible to realize higher mobility while properties of the organic semiconductor itself are maintained.

The semiconductor layer 4 may further contain an insulating material. Examples of the insulating material used herein are not limited to, but include poly(methyl methacrylate), polycarbonate, and polyethylene terephthalate.

The film thickness of the semiconductor layer 4 is preferably 5 nm or more and 100 nm or less. By adopting this range of a film thickness, formation of uniform film becomes easy. Furthermore, a current between source•drain which cannot be controlled by a gate voltage is suppressed, and an on off ratio of the organic FET can be enhanced. A film thickness can be measured with an atom force microscope, or by ellipsometry. In addition, the semiconductor layer 4 may be a monolayer or plural layers. In the case of the plural layers, a layer comprising a plurality of CNT composites of the present invention may be laminated, or a layer comprising the CNT composite and a layer comprising the organic semiconductor may be laminated.

As a method of forming the semiconductor layer 4, a dry method such as resistance heating deposition, electron beam, sputtering, and CVD can be also used, but from a viewpoint of the manufacturing cost and adaptability to a great area, it is preferable to use a coating method. Specifically, a spin coating method, a blade coating method, a slit die coating method, a screen printing method, a bar coater method, a casting method, a printing transference method, an immersion pulling method, and an inkjet method can be preferably used. The coating method can be selected depending on coated film properties to be obtained, such as coated film thickness control and orientation control. Thereupon, examples of a solvent used in a semiconductor coating solution containing the CNT composite include tetrahydrofuran, toluene, xylene, 1,2,3-trimethylbenzene, 1,2,3,5-tetramethylbenzene, 1,3-diethylbenzene, 1,4-diethylbenzene, 1,3,5-triethylbenzene, 1,3-diisopropylbenzene, 1,4-isopropylbenzene, 1,4-dipropylbenzene, butylbenzene, isobutylbenzene, 1,3,5-triisopropylbenzene, dichloromethane, dichloroethane, chloroform, chlorobenzene, dichlorobenzene, o-chlorotoluene, 1,2-dihydronaphthalene, 1,2,3,4-tetrahydronaphthalene, ethyl benzoate, ethyl 2,4,6-trimethylbenzoate, ethyl 2-ethoxybenzoate, o-toluidine, m-toluidine, and p-toluidine. Two or more kinds of these solvents may be used. In addition, the formed coated film may be annealing-treated under the atmospheric pressure, under reduced pressure or under the inert gas atmosphere (under nitrogen or argon atmosphere).

In addition, an orienting layer may be provided between the gate insulating layer 3 and the semiconductor layer 4. In the orienting layer, the known materials such as a silane compound, a titanium compound, an organic acid, and a heterorganic acid can be used and, among them, a silane compound is preferable.

In view of resistance of the orienting layer, the film thickness of the orienting layer is preferably 10 nm or less, further preferably, a monomolecular film. In addition, the orienting layer also includes, for example, an orienting layer formed by chemically binding the organic silane compound and a gate insulating layer surface. By chemically reacting a silyl group and a gate insulating layer surface, a dense and firm film can be formed. When an unreacted silane compound is laminated on a firm film after a reaction, an unreacted silane compound is removed by washing, and a monomolecular film formed by chemically binding a silyl group and a gate insulating layer surface can be obtained.

In the present invention, it is preferable that a second insulating layer formed on an opposite side of the gate insulating layer relative to the semiconductor layer is possessed. By possession of the second insulating layer, hysteresis can be further improved while high mobility and a high on off ratio are retained, and a threshold voltage can be reduced. Herein, on an opposite side of the gate insulating layer relative to the semiconductor layer refers to, for example, a lower side of the semiconductor layer when a gate insulating layer is possessed on an upper side of the semiconductor layer. That is, it is meant that the gate insulating layer and the second insulating layer are possessed on both of a front side and a back side of a film plane of the semiconductor layer, respectively. By formation of the second insulating layer, it is presumed that hysteresis and a threshold voltage can be improved by interrupting the semiconductor layer from oxygen and moisture and, at the same time, removing a moisture adsorbed onto a semiconductor layer surface.

A material used in the second insulating layer is not particularly limited, but examples include specifically inorganic materials such as silicon oxide, and alumina, organic polymer materials such as polyimide and a derivative thereof, polyvinyl alcohol, polyvinyl chloride, polyethylene terephthlate, polyvinylidene fluoride, polysiloxane and a derivative thereof, polyvinylphenol and a derivative thereof; or mixtures of inorganic material powders and organic polymer materials, and mixtures of organic low-molecular materials and organic polymer materials. Among them, it is preferable that organic polymer materials which can be manufactured by a coating method such as inkjet are used. Particularly, when organic polymer materials selected from the group consisting of polyfluoroethylene, polynorbornene, polysiloxane, polyimide, polystyrene, polycarbonate and a derivative thereof, polyacrylic acid derivative, a polymethacrylic acid derivative, and a copolymer containing them are used, the effect of reducing hysteresis and a threshold voltage is increased, being preferable. A polyacrylic acid derivative, a polymethacrylic acid derivative, or a copolymer containing them is particularly preferable.

The film thickness of the second insulating layer is generally 50 nm to 10 µm, preferably 100 nm to 3 µm. The second insulating layer may be a monolayer or multilayer. In addition, one layer may be formed of a plurality of insulating materials, or the second insulating layer may be formed by laminating a plurality of insulating materials.

A method of forming the second insulating layer is not particularly limited, but dry methods such as resistance heating deposition, electron beam, sputtering, and CVD can be also used, but from a viewpoint of the manufacturing cost and adaptation to a great area, it is preferable to use a coating method. As the coating method, specifically, a spin coating method, a blade coating method, a slit die coating method, a screen printing method, a bar coater method, a casting method, a printing transference method, an immersion pulling method, an inkjet method, a drop casting method can be preferably used. The coating method can be selected depending on the coated film properties to be obtained, such as coated film thickness control and orientation control.

A solvent for dissolving an insulating material used in the second insulating layer is not particularly limited, but examples include ethers such as ethylene glycol monomethyl ether, ethylene glycol monoethyl ether, propylene glycol monomethyl ether, propylene glycol monoethyl ether, propylene glycol mono n-butyl ether, propylene glycol mono t-butyl ether, ethylene glycol dimethyl ether, ethylene glycol diethyl ether, ethylene glycol dibutyl ether, and diethylene glycol ethyl methyl ether; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetone, methyl ethyl ketone, methyl propyl ketone, methyl butyl ketone, methyl isobutyl ketone, cyclopentatnone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; aromatic hydrocarbons such as toluene, and xylene. Two or more kinds of them may be used. Among them, it is preferable that a solvent having a boiling point of 110 to 200° C. at one atm is contained. When a boiling point is 110° C. or higher, vaporization of a solvent is suppressed at solution coating, and coating property becomes good. When a boiling point is 200° C. or lower, a solvent remaining in an insulating film is present at a small amount, and an insulating layer having good heat resistance and chemical resistance is obtained. In addition, the formed coated film may be annealing-treated under the atmospheric pressure, under reduced pressure, or under the inert gas atmosphere (under nitrogen or argon atmosphere).

In the present invention, it is preferable that at least one layer of the gate insulating layer, the semiconductor layer and the second insulating layer contains an amine compound. By attachment of the amine compound to the CNT composite, extra carries are trapped, and it becomes possible to further reduce a threshold voltage. The amine compound is not particularly limited, but examples include methylamine, trimethylamine, triethylamine, ethyldiisopropylamine, hexylamine, dodecylamine, 3-aminopropyltriethoxysilane, 2-methoxymethylamine, piperidine, piperazine, N-methylpiperadone, aniline, toluidine, pyridylamine, aminoquinoline, benzylamine, julolidine, triphenylamine, N-ethylcarbazole, polyvinylcarbazole, polypyrolle, polyaniline, ethylenediamine, 4,4'-bis(diphenylamino)biphenyl, ethyl 3-aminobenzoate, and pyrimidopyrimidine. The amine compound may be contained in any of the gate insulating layer, the semiconductor layer and the second insulating layer and, when contained in the second insulating layer, a threshold voltage can be considerably reduced without deteriorating other properties, being preferable.

The amount of addition of the amine compound to the second insulating layer is preferably 0.1 part by weight or more and 20 parts by weight or less, further preferably 0.5 part by weight or more and 10 parts by weight or less relative to 100 parts by weight of an insulating material used in the second insulating layer.

The amine compound may be added to a part of the second insulating layer, or may be contained in a whole of the second insulating layer. When added to a part of the second insulating layer, it is preferable that the amine compound is added on a semiconductor layer side so that the CNT composite in the semiconductor layer, and the amine compound can interact.

The thus formed FET can control a current flowing between the source electrode and the drain electrode (current between source and drain) by changing a gate voltage. Mobility of FET can be calculated using the following (a) equation.

$$\mu=(\delta Id/\delta Vg)L \cdot D/(W \cdot \epsilon_r \cdot \epsilon \cdot Vsd) \tag{a}$$

Wherein, Id is a current between source and drain (A), Vsd is a voltage between source and drain (V), Vg is a gate voltage (V), D is a thickness of a gate insulating layer (m), L is a channel length (M), W is a channel width (m), $\epsilon_r$ is a specific dielectric constant of a gate insulating layer (3.3 in case of polysiloxane), and E is a vacuum dielectric constant (8.85× $10^{-12}$ F/m).

In addition, an on off ratio can be obtained from a ratio Id (on current)/Id (off current) of a maximum of Id (Id (on current)) and minimum of Id (Id (off current)) when the gate voltage is changed in the predetermined range.

Hysteresis can be obtained from an absolute value of a difference between a gate voltage $Vg^1$ at Id=$10^{-8}$ (A) upon application of Vg from positive to negative, and a gate voltage $Vg^2$ at Id=$10^{-8}$ (A) upon application of Vg from negative to positive $|Vg^1-Vg^2|$.

A threshold voltage can be obtained from an intersection between an extension line of a linear part and a Vg axis in an Id-Vg graph.

EXAMPLES

The present invention will be further specifically described below based on Examples. The present invention is not limited to the following Examples.

Herein, for $^1$H-NMR measurement, an FT-NMR apparatus (JEOL JNM-EX270 manufactured by JEOL Ltd.), was used.

In addition, an average molecular weight (number average molecular weight, weight average molecular weight) was measured using a GPC apparatus (high speed GPC apparatus HLC 8220GPC, manufactured by TOSOH) by pumping chloroform as a mobile phase. Using a calibration line obtained by measuring a relationship between an elution time and a molecular weight using a polystyrene standard sample, an average molecular weight of a sample was calculated by an absolute calibration line method. A polymerization degree n was calculated by the following equation.

Polymerization degree n=[(weight average molecular weight)/(molecular weight of one monomer unit)]

Synthesis Example 1

Synthesis of Compound [21]

The compound [21] was synthesized by a method shown in the formula 1.

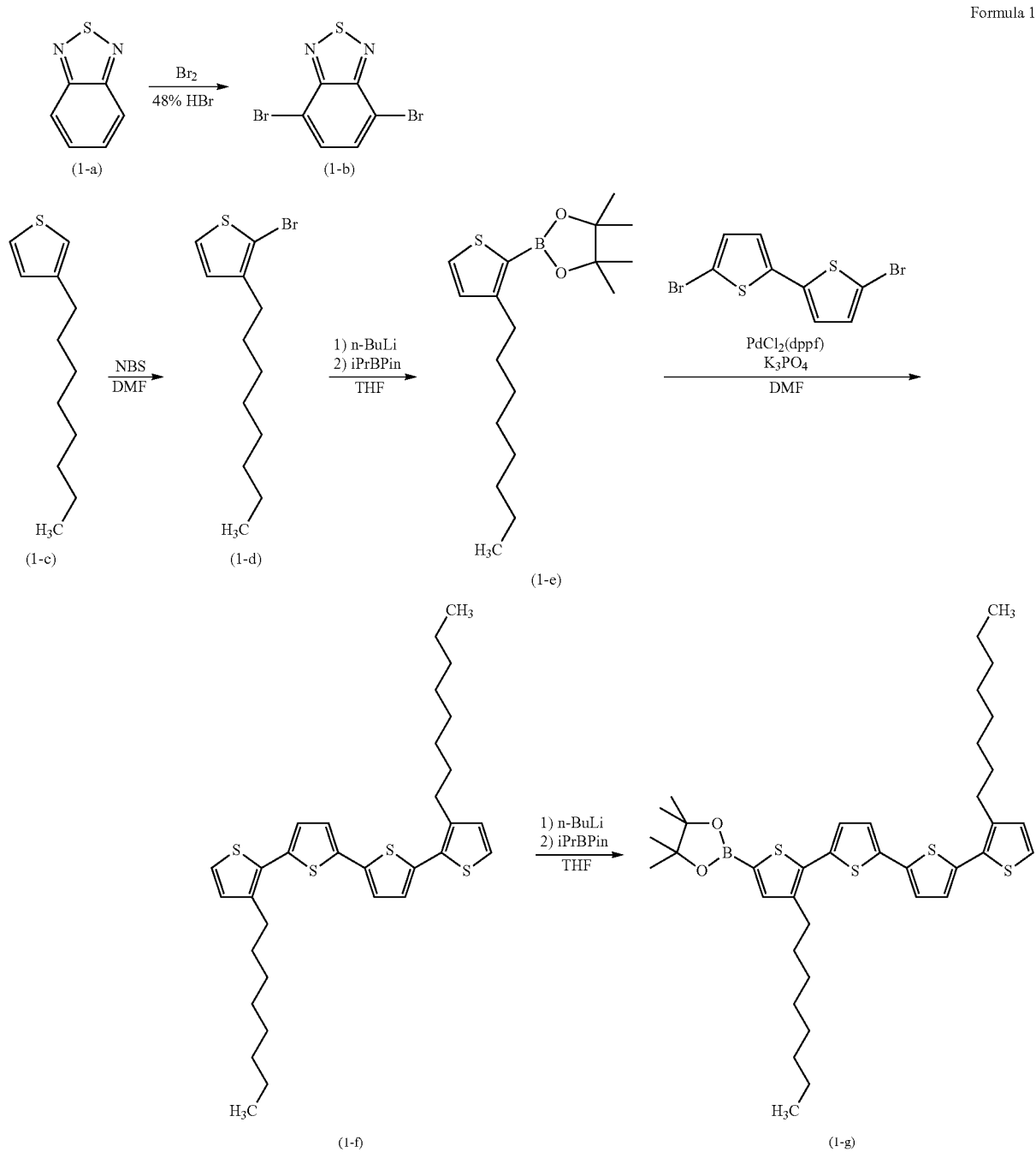

-continued
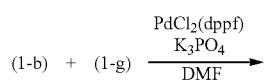
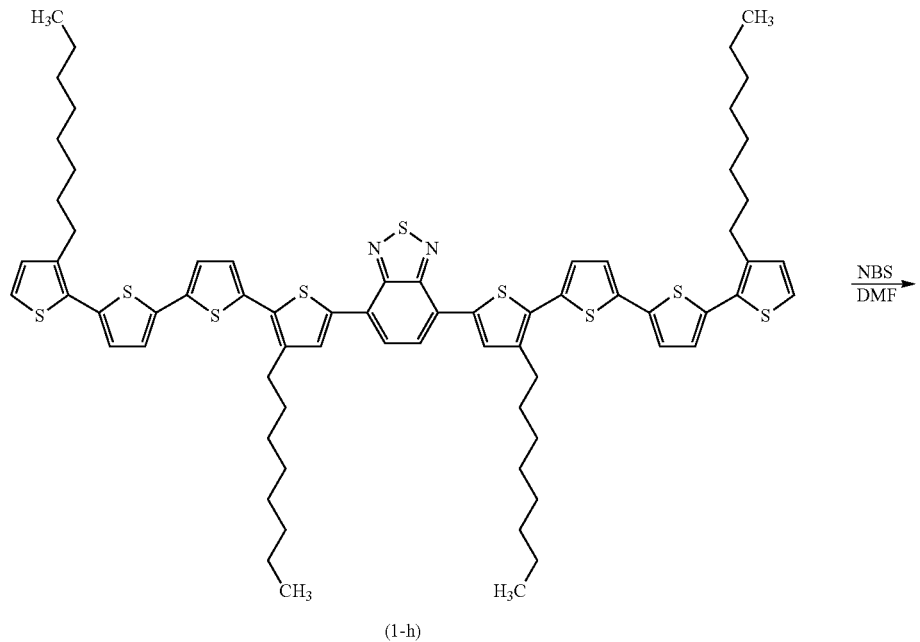
(1-h)
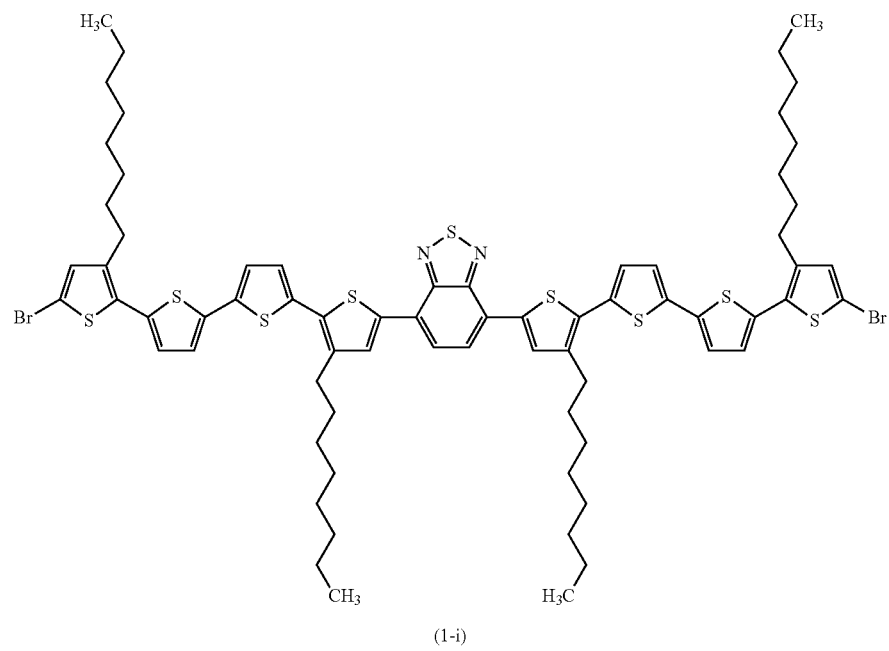
(1-i)
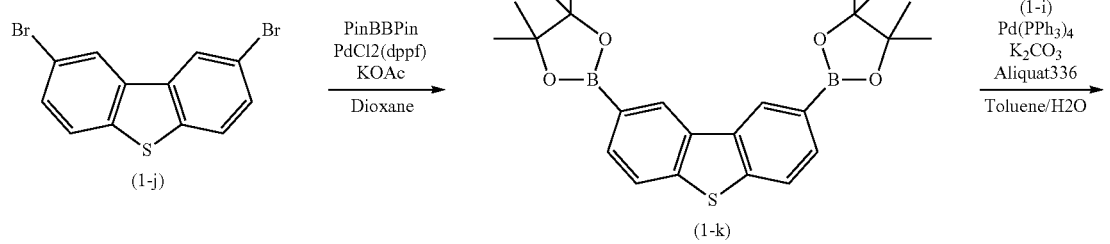

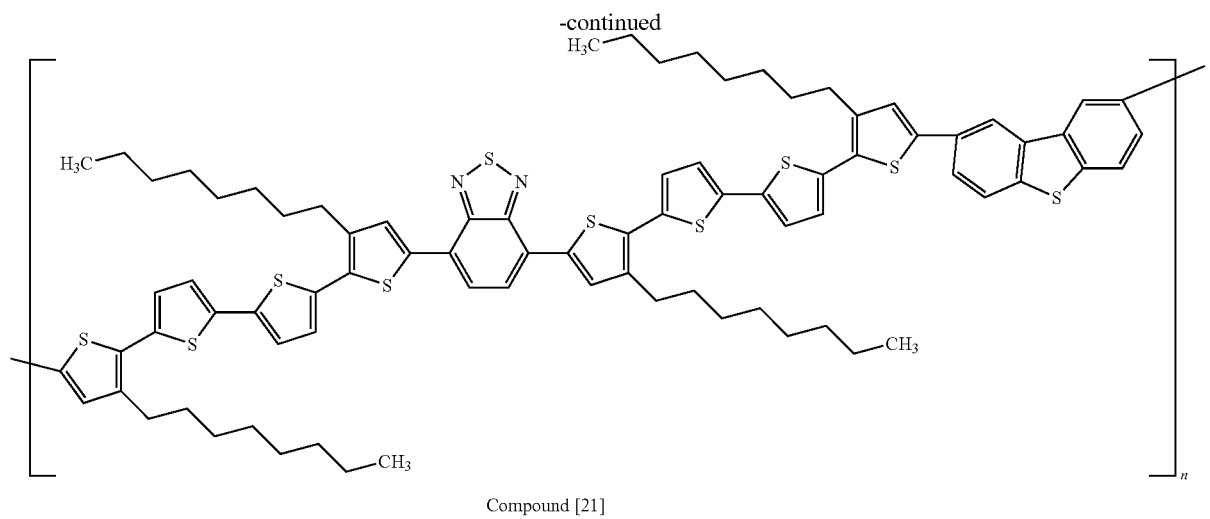

Compound [21]

To 150 ml of 48% hydrobromic acid were added 4.3 g of a compound (1-a) (manufactured by Tokyo Chemical Industry Co., Ltd.) and 10 g of bromine (manufactured by Wako Pure Chemical Industries, Ltd.), and the mixture was stirred at 120° C. for 3 hours. The reaction was cooled to room temperature, and the precipitated solid was filtered through a glass filter, and washed with 1000 ml of water and 100 ml of acetone. The resulting solid was vacuum-dried at 60° C. to obtain 6.72 g of a compound (1-b).

In 100 ml of dimethylformamide was dissolved 10.2 g of a compound (1-c), 9.24 g of N-bromosuccinimide (manufactured by Wako Pure Chemical Industries, Ltd.) was added, and the mixture was stirred at room temperature for 3 hours under a nitrogen atmosphere. To the resulting solution were added 200 ml of water, 200 ml of hexane and 200 ml of dichloromethane, and an organic layer was taken. The resulting organic layer was washed with 200 ml of water, and dried over magnesium sulfate. The resulting solution was purified by column chromatography (filler: silica gel, eluent: hexane) to obtain 14.4 g of a compound (1-d).

In 200 ml of tetrahydrofuran was dissolved 14.2 g of the compound (1-d), and the solution was cooled to −80° C. After 35 ml of n-butyllithium (1.6 M hexane solution) (manufactured by Wako Pure Chemical Industries, Ltd.) was added, a temperature was raised to −50° C., and the solution was cooled to −80° C. again. 2-Isopropoxy-4,4,5,5-tetramethyl-1,3,2-dioxaborolane (13.6 ml) (manufactured by Wako Pure Chemical Industries, Ltd.) was added, a temperature was raised to room temperature, and the mixture was stirred for 4 hours under a nitrogen atmosphere. To the resulting solution were added 200 ml of a 1 N aqueous ammonium chloride solution, and 200 ml of ethyl acetate, and the organic layer was taken. The resulting organic layer was washed with 200 ml of water, and dried over magnesium sulfate. The resulting solution was purified by column chromatography (filler: silica gel, eluent: hexane/dichloromethane) to obtain 14.83 g of a compound (1-e).

To 200 ml of dimethylformamide were added 14.83 g of the compound (1-e), 6.78 g of 5,5'-dibromo-2,2'-bithiophene (manufactured by Tokyo Chemical Industry Co., Ltd.), 26.6 g of potassium phosphate (manufactured by Wako Pure Chemical Industries, Ltd.) and 1.7 g of [bis(diphenylphosphino)ferrocene]dichloropalladium (manufactured by Aldrich) were further added under a nitrogen atmosphere, and the mixture was stirred at 100° C. for 4 hours. To the resulting solution were added 500 ml of water and 300 ml of ethyl acetate, an organic layer was taken. The resulting organic layer was washed with 500 ml of water, and dried over magnesium sulfate. The resulting solution was purified by column chromatography (filler: silica gel, eluent: hexane) to obtain 4.53 g of a compound (1-f)

In 40 ml of tetrahydrofuran was dissolved 4.53 g of the compound (1-f), and the solution was cooled to −80° C. After 6.1 ml of n-butyllithium (1.6 M hexane solution) was added, a temperature was raised to −5° C., and the solution was cooled to −80° C. again. 2-Isopropoxy-4,4,5,5-tetramethyl-1,3,2-dioxaborolane (2.3 ml) was added, a temperature was raised to room temperature, and the mixture was stirred for 2 hours under a nitrogen atmosphere. To the resulting solution were added 150 ml of a 1 N aqueous ammonium chloride solution and 200 ml of ethyl acetate, and the organic layer was taken. The resulting organic layer was washed with 200 ml of water, and dried over magnesium sulfate. The resulting solution was purified by column chromatography (filler: silica gel, eluent: dichloromethane/hexane) to obtain 2.31 g of a compound (1-g).

To 17 ml of dimethylformamide were added 0.498 g of the compound (1-b) and 2.31 g of the compound (1-g), 2.17 g of potassium phosphate and 0.14 g of [bis(diphenylphosphino)ferrocene]dichloropalladium (manufactured by Aldrich) were further added under a nitrogen atmosphere, and the mixture was stirred at 90° C. for 7 hours. To the resulting solution were added 200 ml of water and 100 ml of chloroform, and the organic layer was taken. After the resulting organic layer was washed with 200 ml of water, and dried over magnesium sulfate. The resulting solution was purified by column chromatography (filler: silica gel, eluent: dichloromethane/hexane) to obtain 1.29 g of a compound (1-h). The results of $^1$H-NMR of the compound (1-h) are shown. $^1$H-NMR (CD$^2$Cl$^2$, (d-ppm)): 8.00 (s, 2H), 7.84 (s, 2H), 7.20-7.15 (m, 8H), 7.04 (d, 2H), 6.95 (d, 2H), 2.88 (t, 4H), 2.79 (t, 4H), 1.77-1.29 (m, 48H), 0.88 (m, 12H)

In 15 ml of chloroform was dissolved 0.734 g of the compound (1-h), 0.23 g of N-bromosuccinimide/10 ml of dimethylformamide were added, and the mixture was stirred at room temperature for 9 hours under a nitrogen atmosphere. To the resulting solution were added 100 ml of water and 100 ml of chloroform, and the organic layer was taken. The resulting organic layer was washed with 200 ml of water, and dried over magnesium sulfate. The resulting solution was purified by column chromatography (filler: silica gel, eluent: dichloromethane/hexane) to obtain 0.58 g of a compound (1-i).

To 7 ml of 1,4-dioxane were added 0.5 g of a compound (1-j), 0.85 g of bis(pinacolato)diboron (manufactured by BASF), and 0.86 g of potassium acetate (manufactured by Wako Pure Chemical Industries, Ltd.), and 0.21 g of [bis(diphenylphosphino)ferrocene]dichloropalladium was further added under a nitrogen atmosphere, and the mixture was stirred at 80° C. for 7 hours. To the resulting solution were added 100 ml of water and 100 ml of ethyl acetate, and the organic layer was taken. The resulting organic layer was washed with 100 ml of water, and dried over magnesium sulfate. The resulting solution was purified by column chromatography (filler: silica gel, eluent: dichloromethane) to obtain 57 mg of a compound (1-k).

In 6 ml of toluene were dissolved 93 mg of the compound (1-i), and 19.3 mg of the compound (1-k). Two milliliter of water, 0.18 g of potassium carbonate, 7.7 mg of tetrakis(triphenylphosphine)palladium (0) (manufactured by Tokyo Chemical Industry Co., Ltd.) and one droplet of Aliquat (R) 336 (manufactured by Aldrich) were added thereto, and the mixture was stirred at 100° C. for 25 hours under a nitrogen atmosphere. Then, 40 mg of phenylboronic acid was added, and the mixture was stirred at 100° C. for 7 hours. To the resulting solution was added 50 ml of methanol, and the produced solid was filtered, and washed sequentially with methanol, water, methanol, and acetone. The resulting solid was dissolved in chloroform, passed through a silica gel short column (eluent: chloroform), and concentrated to dryness to obtain 30 mg of a compound [21]. A weight average molecular weight was 4367, a number average molecular weight was 3475, and a polymerization degree n was 3.1.

Synthesis Example 2

Synthesis of Compound [22]

The compound [22] was synthesized by a method shown in the formula 2.

[Chemical formula 12]

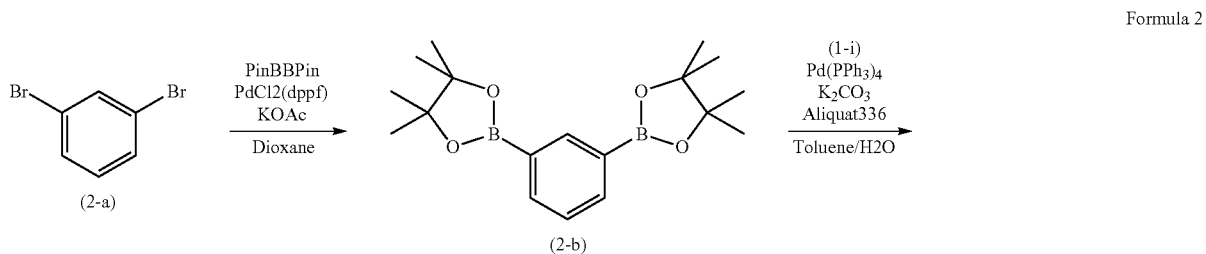

Formula 2

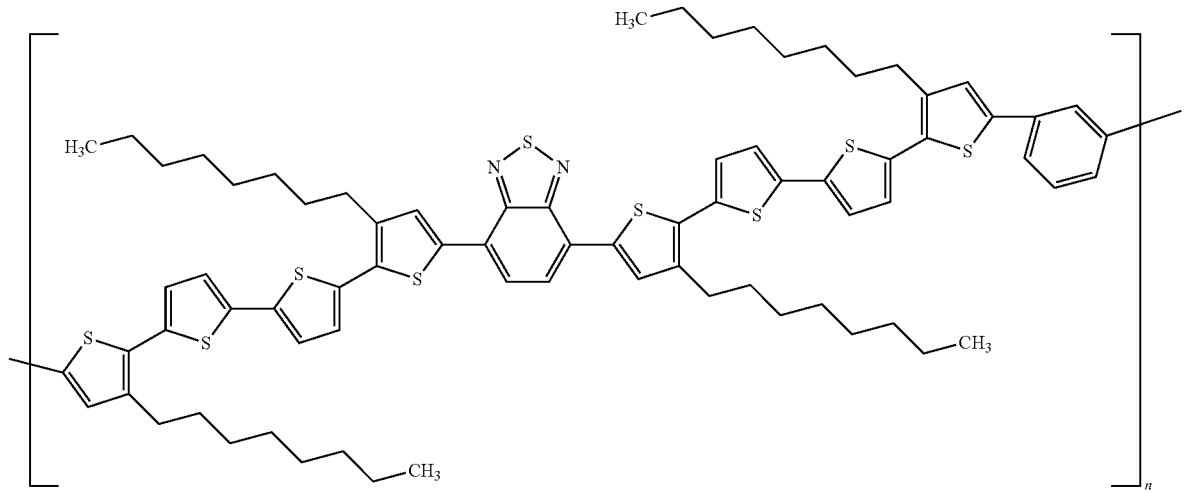

Compound [22]

To 7 ml of 1,4-dioxane were added 0.34 g of a compound (2-a), 0.85 g of bis(pinacolato) diboron, and 0.86 g of potassium acetate, 0.21 g of [bis(diphenylphosphino) ferrocene] dichloropalladium was further added under a nitrogen atmosphere, and the mixture was stirred at 80° C. for 9 hours. To the resulting solution were added 100 ml of water and 100 ml of ethyl acetate, and the organic layer was taken. The resulting organic layer was washed with 100 ml of water, and dried over magnesium sulfate. The resulting solution was purified by column chromatography (filler: silica gel, eluent: dichloromethane) to obtain 167 mg of a compound (2-b).

In 6 ml of toluene were dissolved 110 mg of the compound (1-i) and 17 mg of the compound (2-b). Two milliliter of water, 0.22 g of potassium carbonate, 9 mg of tetrakis (triphenylphosphine) palladium (0) and one droplet of Alquat (R) 336 (manufactured by Aldrich) were added thereto, and the mixture was stirred at 100° C. for 45 hours under a nitrogen atmosphere. Then, 40 mg of phenylboronic acid was added, and the mixture was stirred at 100° C. for 4 hour's. To the resulting solution was added 50 ml of methanol, and the produced solid was filtered, and washed sequentially with methanol, water, methanol and acetone. The resulting solid was dissolved in chloroform, passed through a silica gel short column (eluent: chloroform), and concentrated to dryness to obtain 75 mf of a compound [22]. A weight average molecular weight was 8691, a number average molecular weight was 5676, and polymerization degree n was 6.7.

Synthesis Example 3

Synthesis of Compound [23]

The compound [23] was synthesized by a method shown in the formula 3.

[Chemical formula 13]

Formula 3

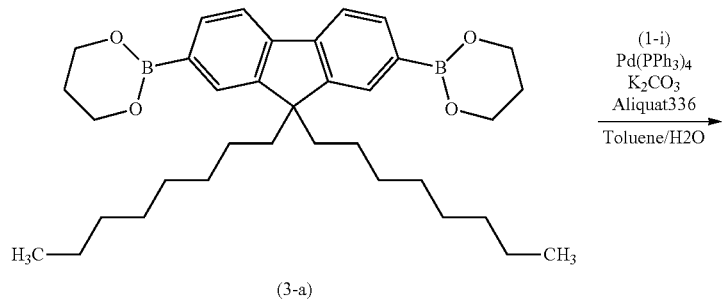

(3-a)

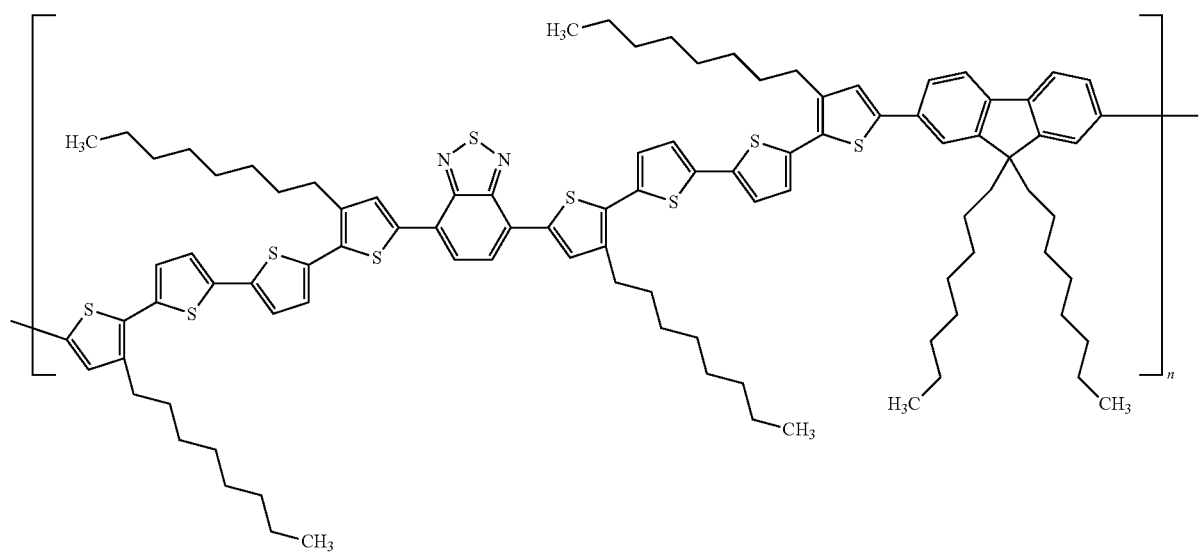

Compound [23]

In 5 ml of toluene were dissolved 57 mg of the compound (1-i) and 18 mg of a compound (3-a). Two milliliter of water, 0.11 g of potassium carbonate, 4.7 mg of tetrakis(triphenylphosphine)palladium (0) and one droplet of Aliquat (R) 336 (manufactured by Aldrich) were added thereto, and the mixture was stirred at 100° C. for 75 hours under a nitrogen atmosphere. Then, 40 mg of phenylboronic acid was added, the mixture was stirred at 100° C. for 5 hours. To the resulting solution was added 50 ml of methanol, and the produced solid was filtered, and washed sequentially with methanol, water, methanol and acetone. The resulting solid was dissolved in chloroform, passed through a silica gel short column (eluent: chloroform), and concentrated to dryness to obtain 55 mg of a compound [23]. A weight average molecular weight was 43230, a number average molecular weight was 14419, and a polymerization degree n was 26.5.

Synthesis Example 4

The compound [24] was synthesized by a method shown in the formula 4.

[Chemical formula 14]

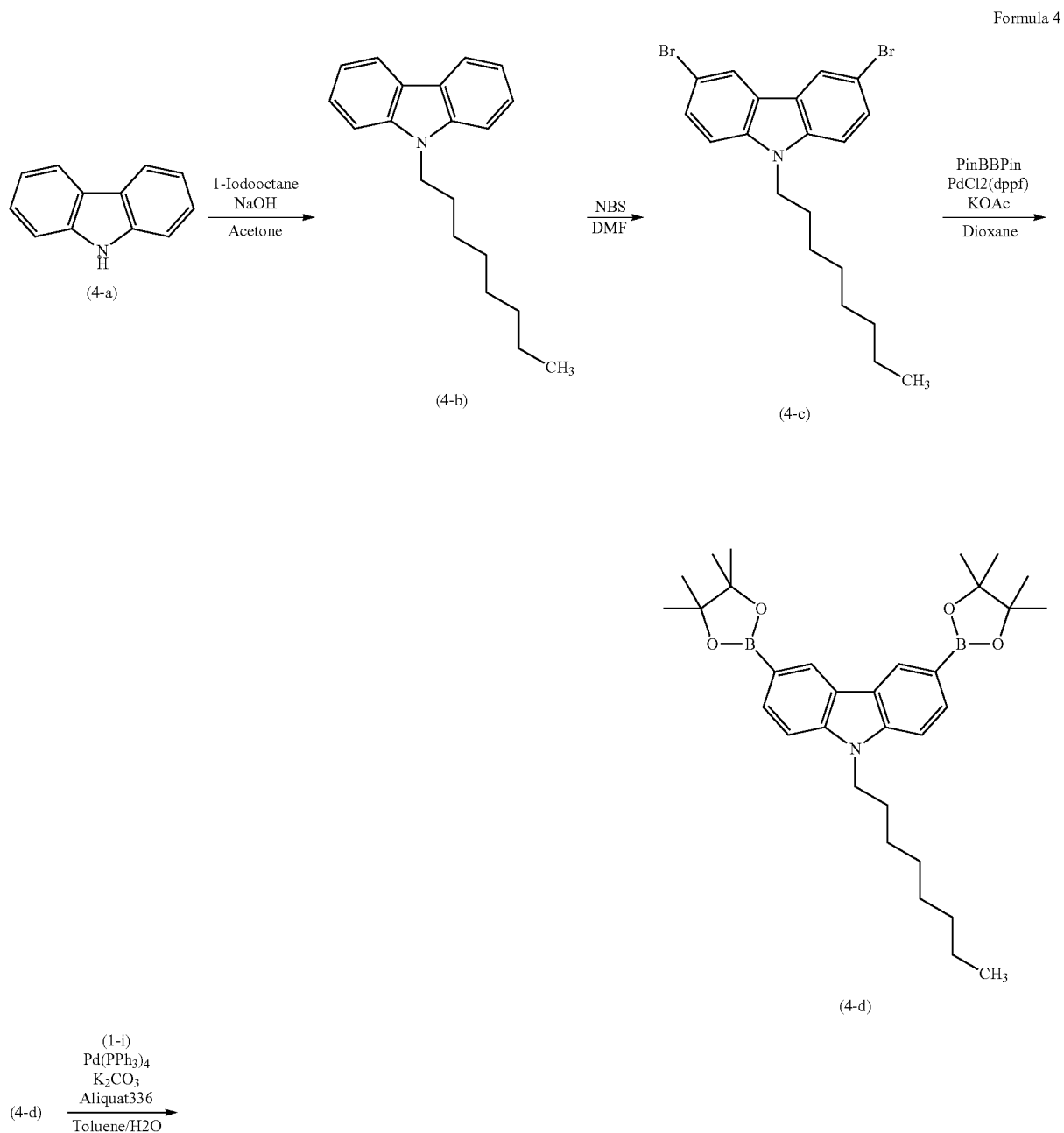

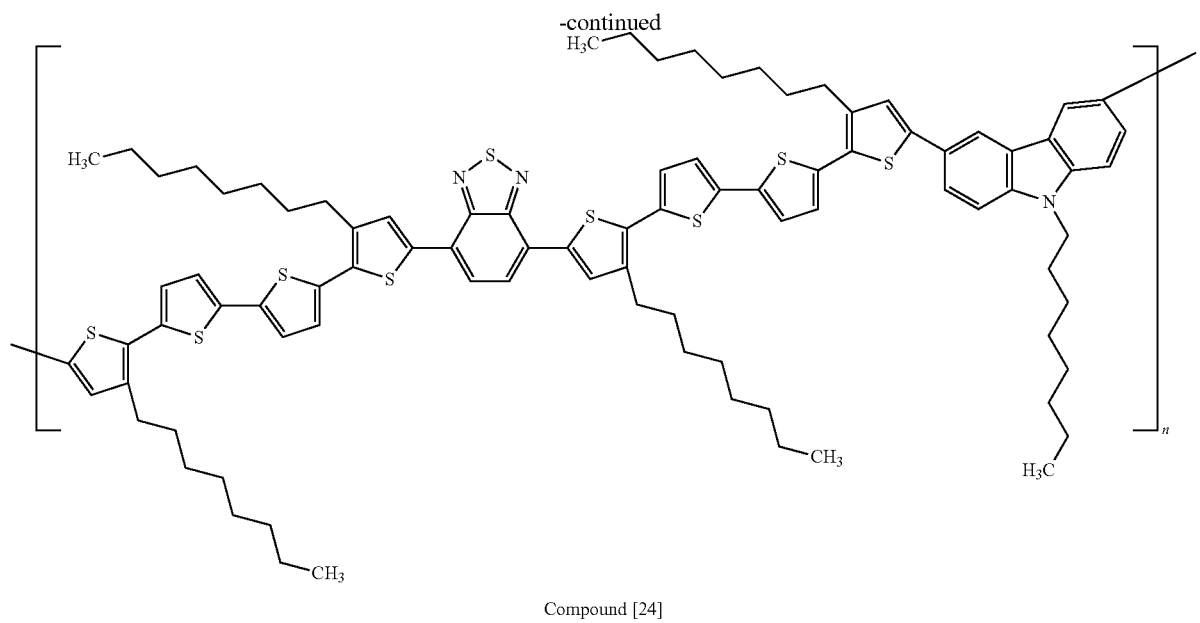

Compound [24]

To 200 ml, of acetone were added 6.33 g of a compound (4-a), 10 g of 1-iodooctane (manufactured by Wako Pure Chemical Industries, Ltd.) and 2.27 g of NaOH, and the mixture was heated to reflux for 10 hours under a nitrogen atmosphere. To the resulting solution were added water and hexane, and the organic layer was taken. The resulting organic layer was washed with water, and dried over magnesium sulfate. The resulting solution was purified by column chromatography (filler: silica gel, eluent: dichloromethane/hexane) to obtain 4.82 g of a compound (4-b).

In 120 ml of dimethylformamide was dissolved 4.82 g of the compound (4-b), 6.47 g of N-bromosuccinimide was added, and the mixture was stirred at 50° C. for 10 hours. To the resulting solution were added water and dichloromethane, and the organic layer was taken. The resulting organic layer was washed with water, and dried over magnesium sulfate. The resulting solution was purified by column chromatography (filler: silica gel, eluent: dichloromethane/hexane) to obtain 6.53 g of a compound (4-c)

To 18 ml of 1,4-dioxane were added 1.6 g of the compound (4-c), 2.32 g of bis(pinacolato)diboron and 2.2 g of potassium acetate, 0.54 g of [bis(diphenylphosphino)ferrocene]dichloropalladium was further added under a nitrogen atmosphere, and the mixture was stirred at 80° C. for 9 hours. To the resulting solution were added 100 ml of water and 100 ml of ethyl acetate, and the organic layer was taken. The resulting organic layer was washed with 100 ml of water, and dried over magnesium sulfate. The resulting solution was purified by column chromatography (filler: silica gel, eluent: dichloromethane/hexane) to obtain 1.03 g of a compound (4-d).

In 8 ml of toluene were dissolved 99 mg of the compound (1-i) and 30 mg of the compound (4-d). Three milliliter of water, 0.195 g of potassium carbonate, 8.1 mg of tetrakis(triphenylphosphine)palladium (0) and one droplet of Aliquat (R) 336 (manufactured by Aldrich) were added thereto, and the mixture was stirred at 100° C. for 92 hours under a nitrogen atmosphere. Then, 34 mg of phenylboronic acid was added, and the mixture was stirred at 100° C. for 6 hours. To the resulting solution was added 50 ml of methanol, and the produced solid was filtered, and washed sequentially with methanol, water, methanol and acetone. The resulting solid was dissolved in chloroform, passed through a silica gel short column (eluent: chloroform), and concentrated to dryness to obtain 85 mg of a compound [24]. A weight average molecular weight was 9380, a number average molecular weight was 5410, and a polymerization degree n was 6.2.

Synthesis Example 5

A compound [33] was synthesized by a method shown in the formula 5.

[Chemical formula 15]

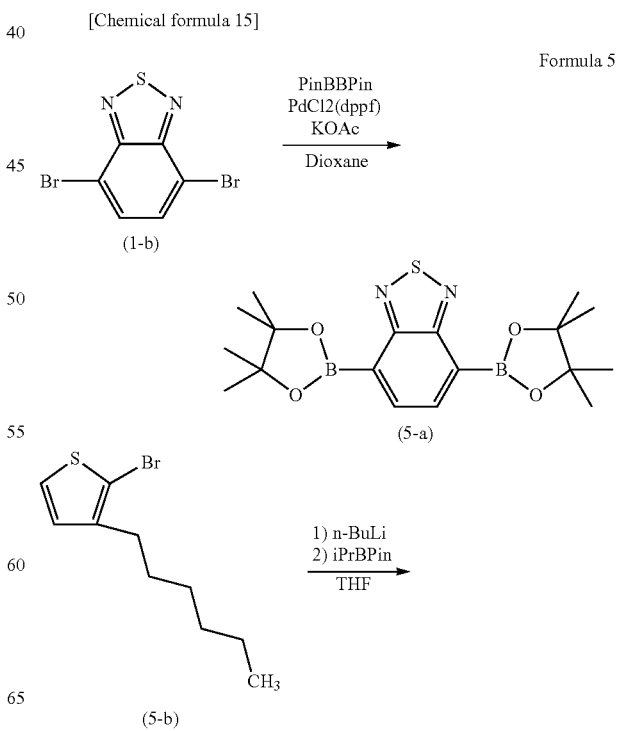

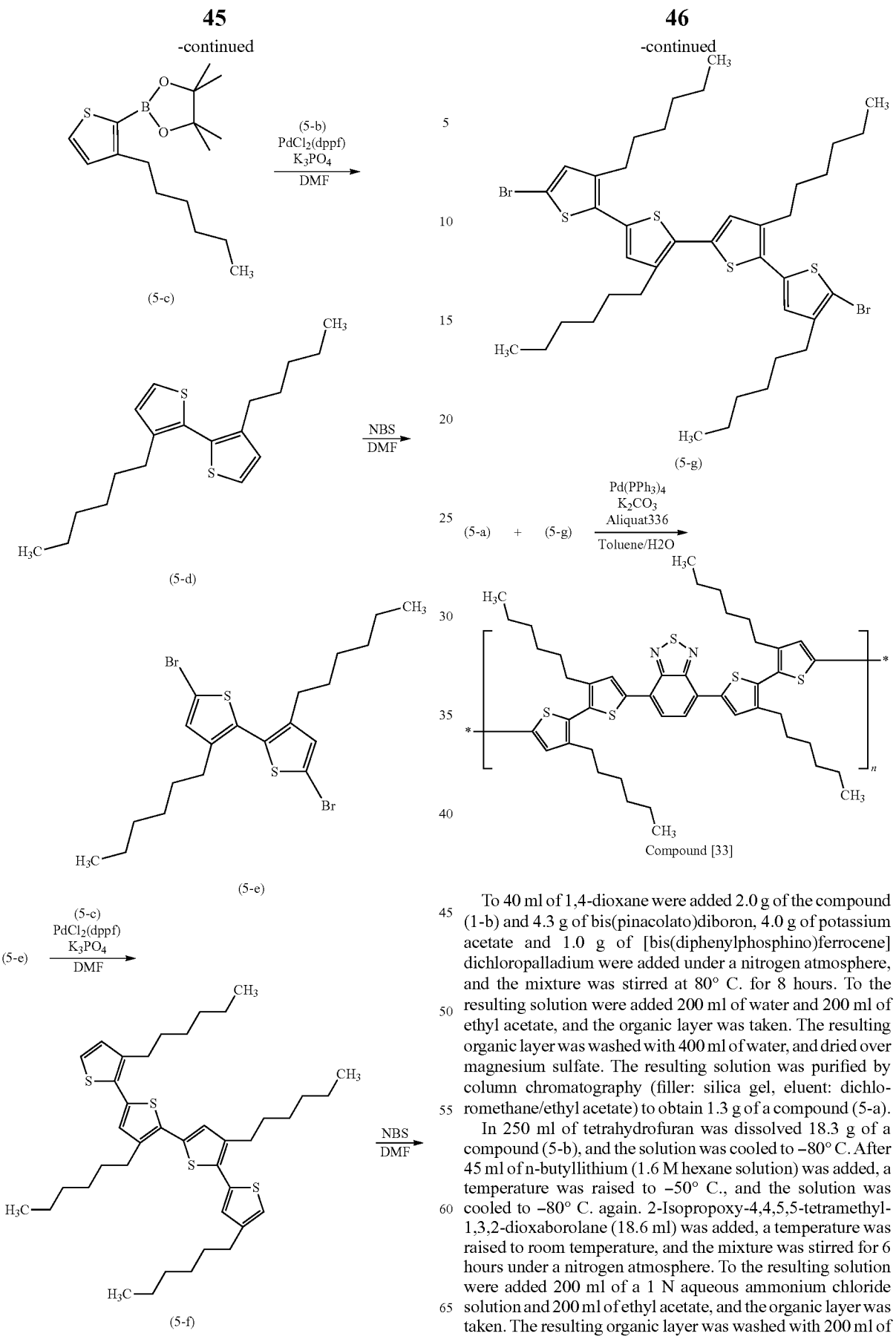

To 40 ml of 1,4-dioxane were added 2.0 g of the compound (1-b) and 4.3 g of bis(pinacolato)diboron, 4.0 g of potassium acetate and 1.0 g of [bis(diphenylphosphino)ferrocene] dichloropalladium were added under a nitrogen atmosphere, and the mixture was stirred at 80° C. for 8 hours. To the resulting solution were added 200 ml of water and 200 ml of ethyl acetate, and the organic layer was taken. The resulting organic layer was washed with 400 ml of water, and dried over magnesium sulfate. The resulting solution was purified by column chromatography (filler: silica gel, eluent: dichloromethane/ethyl acetate) to obtain 1.3 g of a compound (5-a).

In 250 ml of tetrahydrofuran was dissolved 18.3 g of a compound (5-b), and the solution was cooled to −80° C. After 45 ml of n-butyllithium (1.6 M hexane solution) was added, a temperature was raised to −50° C., and the solution was cooled to −80° C. again. 2-Isopropoxy-4,4,5,5-tetramethyl-1,3,2-dioxaborolane (18.6 ml) was added, a temperature was raised to room temperature, and the mixture was stirred for 6 hours under a nitrogen atmosphere. To the resulting solution were added 200 ml of a 1 N aqueous ammonium chloride solution and 200 ml of ethyl acetate, and the organic layer was taken. The resulting organic layer was washed with 200 ml of water, and dried over magnesium sulfate. The resulting solution was purified by column chromatography (filler: silica gel, eluent: hexane/dichloromethane) to obtain 16.66 g of a compound (5-c).

To 100 ml of dimethylformamide were added 2.52 g of the compound (5-b) and 3.0 g of the compound (5-c), 13 g of potassium phosphate and 420 mg of [bis(diphenylphosphino) ferrocene]dichloropalladiume was added under a nitrogen atmosphere, and the mixture was stirred at 90° C. for 5 hours. To the resulting solution were added 200 ml of water and 100 ml of hexane, and the organic layer was taken. The resulting organic layer was washed with 400 ml of water, and dried over magnesium sulfate. The resulting solution was purified by column chromatography (filler: silica gel, eluent: hexane) to obtain 2.71 g of a compound (5-d).

In 8 ml of dimethylformamide was dissolved 2.71 g of a compound (5-d), a solution of 2.88 g of N-bromosuccinimide in dimethylformamide (16 ml) was added, and the solution was stirred at 5° C. to 10° C. for 9 hours. To the resulting solution were added 150 ml of water and 100 ml of hexane, and the organic layer was taken. The resulting organic layer was washed with 300 ml of water, and dried over magnesium sulfate. The resulting solution was purified by column chromatography (filler: silica gel, eluent: hexane) to obtain 3.76 g of a compound (5-e).

To 70 ml of dimethylformamide were added 3.76 g of the compound (5-e) and 4.71 g of the compound (5-c), 19.4 g of potassium phosphate and 310 mg of [bis(diphenylphosphino) ferrocene]dichloropalladium were added under a nitrogen atmosphere, and the mixture was stirred at 90° C. for 9 hours. To the resulting solution were added 500 ml of water and 200 ml of hexane, and the organic layer was taken. The resulting organic layer was washed with 300 ml of water, and dried over magnesium sulfate. The resulting solution was purified by column chromatography (filler: silica gel, eluent: hexane) to obtain 4.24 g of a compound (5-f).

In 20 ml of chloroform was dissolved 520 mg of the compound (5-f), a solution of 280 mg of N-bromosuccinimide in dimethylformamide (10 ml) was added, and the solution was stirred at 5° C. to 10° C. for 5 hours. To the resulting solution were added 150 ml of water and 100 ml of dichloromethane, and the organic layer was taken. The resulting organic layer was washed with 200 ml of water, and dried over magnesium sulfate. The resulting solution was purified by column chromatography (filler: silica gel, eluent: hexane) to obtain 610 mg of a compound (5-g).

In 30 ml of toluene were dissolved 280 mg of the compound (5-a) and 596 mg of the compound (5-g). Ten milliliter of water, 1.99 g of potassium carbonate, 83 mg of tetrakis (triphenylphosphine)palladium (0) and one droplet of Aliquat (R) 336 (manufactured by Aldrich) were added thereto, and the mixture was stirred at 100° C. for 20 hours under a nitrogen atmosphere. To the resulting solution was added 100 ml of methanol, and the produced solid was filtered, and washed sequentially with methanol, water, acetone and hexane. The resulting solid was dissolved in 200 ml of chloroform, passed through a silica gel short column (eluent: chloroform), concentrated to dryness, and washed sequentially with methanol, acetone and methanol to obtain 480 mg of a compound [33]. A weight average molecular weight was 29398, a number average molecular weight was 10916, and a polymerization degree n was 36.7.

Synthesis Example 6

Synthesis of Compound [39]

The compound [39] was synthesized by a method shown in the formula 6.

[Chemical formula 16]

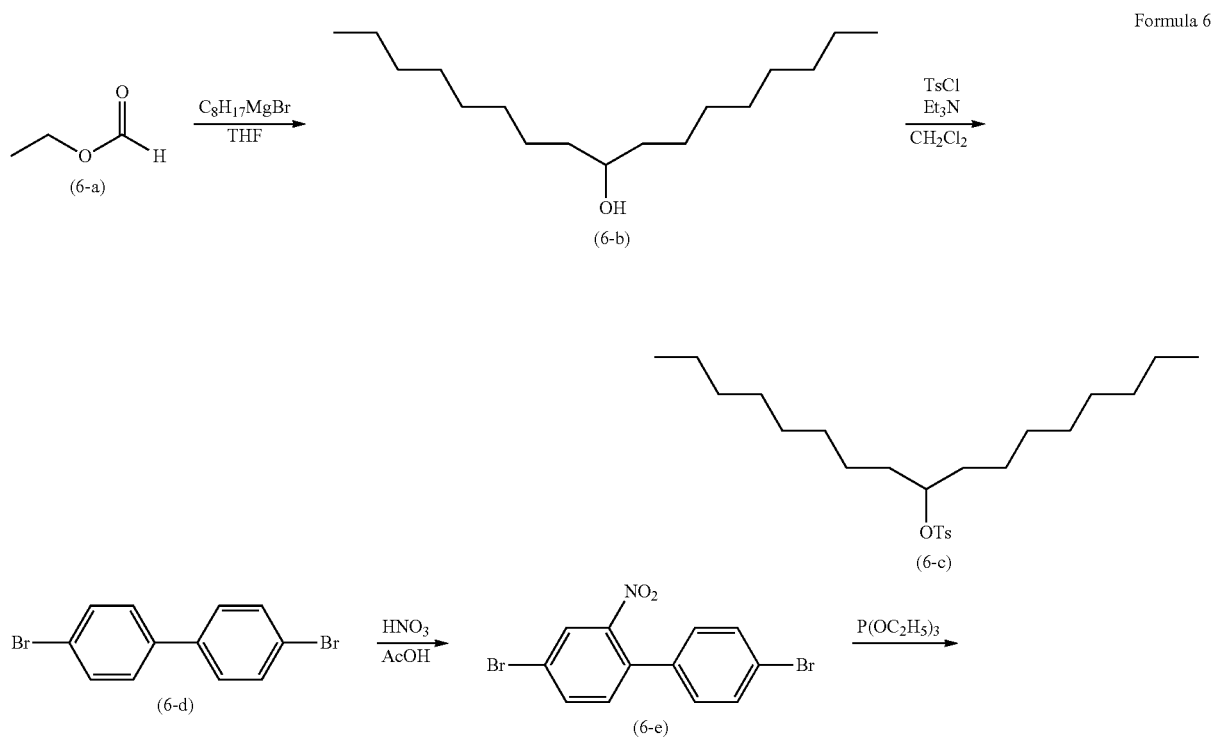

-continued
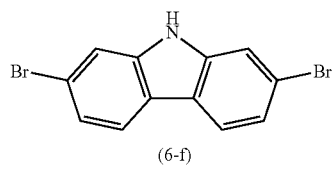
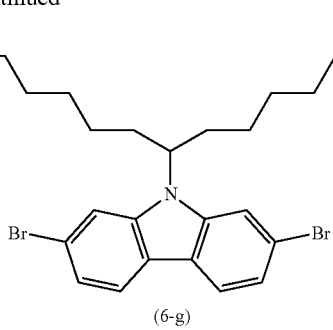
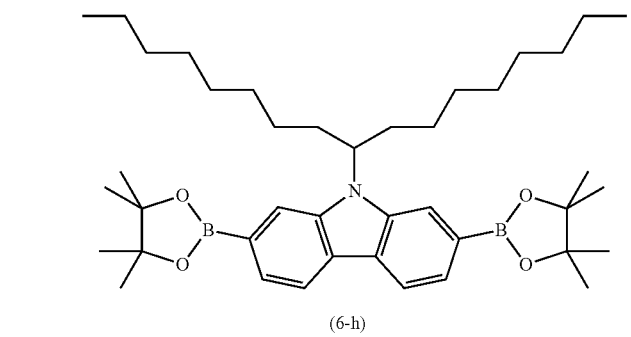
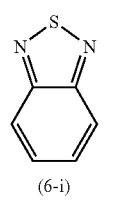
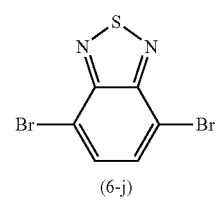
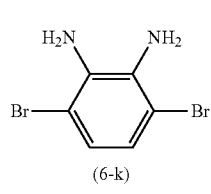
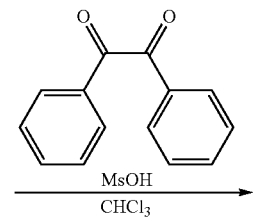
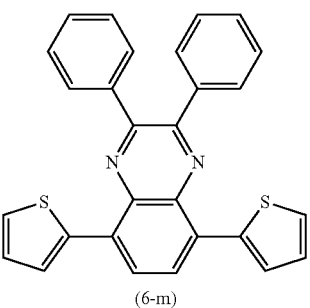
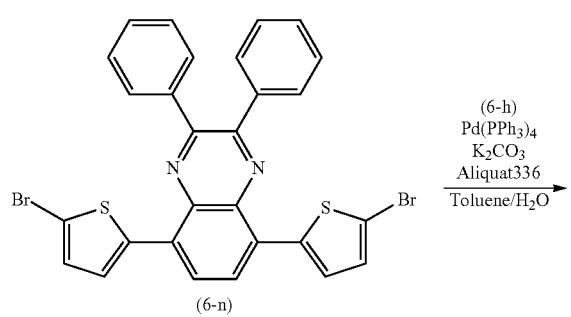

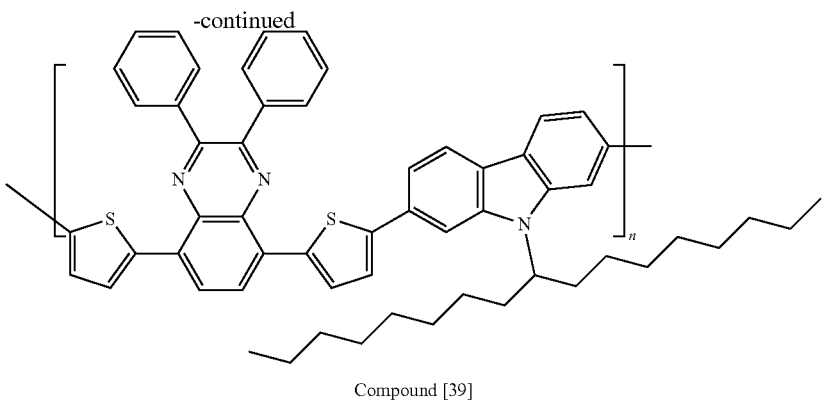

Compound [39]

To 6.15 g of ethyl formate (6-a) (manufactured by Tokyo Chemical Industry Co., Ltd.) was added 125 ml of tetrahydrofuran, the mixture was cooled to −78° C., and 250 ml of a solution of octylmagnesium bromide in tetrahydrofuran having a concentration of 1.0M (manufactured by Tokyo Chemical Industry Co., Ltd.) was added dropwise over 1 hour while a reaction solution was retained at −78° C. After completion of addition, the reaction solution was stirred at room temperature for 5 hours. Methanol (50 ml) was added to inactivate excessive octylmagnesium bromide, and tetrahydrofuran was distilled off under reduced pressure. After 120 ml of diethyl ether was added, this was washed with 100 ml of an aqueous saturated ammonium chloride solution and, then, 100 ml of an aqueous saturated sodium chloride solution. After the organic layer was dried over anhydrous magnesium sulfate, a solvent was distilled off under reduced pressure. The residue was purified by column chromatography (filler: silica gel, eluent: hexane/ethyl acetate=10/1) to obtain 16.9 g of a compound (6-b).

To 80 ml of dichloromethane were added 10.0 g of the compound (6-b), 5.1 g of triethylamine (manufactured by Wako Pure Chemical Industries, Ltd.) and 5 ml of pyridine (manufactured by Wako Pure Chemical Industries, Ltd,) and 8.92 g of paratoluenesulfonyl chloride was added while stirring at 0° C. After the reaction solution was stirred at 0° C. for 1 hour, it was stirred at room temperature for 12 hours. Fifty milliliter of water was added, and the mixture was further stirred at room temperature for 30 minutes, followed by extraction with 80 ml of dichloromethane two times. The organic layer was dried over anhydrous magnesium sulfate, and a solvent was distilled off under reduced pressure. The residue was purified by column chromatography (filler: silica gel, eluent: hexane/ethyl acetate=10/1) to obtain 9.2 g of a compound (6-c).

To 25.0 g of 4,4'-dibromodiphenyl (6-d) (manufactured by Tokyo Chemical Industry Co., Ltd.) was added 375 ml of acetic acid (manufactured by Wako Pure Chemical Industries, Ltd.) 120 ml of fuming nitric acid (manufactured by Wako Pure Chemical Industries, Ltd.) was slowly added while stirring at 100° C. and, subsequently, 10 ml of water was added to the reaction solution. The reaction solution was stirred at 100° C. for 1 hour, cooled to room temperature, and allowed to stand at room temperature for 5 hours. The precipitated solid was filtered, and washed with water and ethanol. The crude product was recrystallized from ethanol to obtain 17.0 g of a compound (6-e).

To 11.0 g of the compound (6-e) was added 40 ml of triethyl phosphite, and the mixture was stirred at 150° C. for 10 hours. After triethyl phosphite was distilled off under reduced pressure, the residue was purified by column chromatography (filler: silica gel, eluent: hexane/ethyl acetate=5/1) to obtain 2.5 g of a compound (6-f).

To 1.2 g of the compound (6-f) were added 10 ml of dimethyl sulfoxide (manufactured by Wako Pure Chemical Industries, Ltd) and 1.08 g of a powder of potassium hydroxide (manufactured by Wako Pure Chemical Industries, Ltd.), and during stirring at room temperature, a solution of 2.4 g of the compound (6-C) in dimethyl sulfoxide (6 ml) was added dropwise at room temperature over 1 hour. After completion of addition, the mixture was stirred at room temperature for 5 hours. Fifty milliliter of water was added to the reaction mixture, the mixture was extracted with 40 ml of hexane three times, and the organic layer was dried over anhydrous magnesium sulfate, and a solvent was distilled off under reduced pressure. The residue was purified by column chromatography (filler: silica gel, eluent: hexane) to obtain 540 mg of a compound (6-g).

In 10 ml of tetrahydrofuran was dissolved 530 mg of the compound (6-g), the solution was cooled to −78° C., 0.65 ml of n-butyllithium (1.6 M hexane solution) was added dropwise, and the mixture was stirred at −78° C. for 1 hour. The reaction solution was stirred at 0° C. for 30 minutes, and cooled to −78° C. again, and 440 mg of 2-isopropoxy-4,4,5,5-tetramethyl-1,3,2-dioxaborolane was added. After the reaction solution was further stirred at room temperature for 4 hours, 10 ml of water and, then, 50 ml of diethyl ether were added. The organic layer was washed with 100 ml of water and, then, 30 ml of an aqueous saturated sodium chloride solution, and dried over anhydrous magnesium sulfate, and a solvent was distilled off under reduced pressure. Recrystallization from a mixed solvent of methanol/acetone afforded 390 mg of a compound (6-h).

To 150 ml of 48% hydrobromic acid (manufactured by Wako Pure Chemical Industries, Ltd.) were added 4.3 g of a compound (6-i) (manufactured by Tokyo Chemical Industry Co., Ltd.) and 10 g of bromine (manufactured by Wako Pure Chemical Industries, Ltd.), and the mixture was stirred at 120° C. for 3 hours. The mixture was cooled to room temperature, and the precipitated solid was filtered through a glass filter, and washed with 1000 ml of water and 100 ml of acetone. The resulting solid was vacuum-dried at 60° C. to obtain 6.72 g of a compound (6-j).

To 180 ml of ethanol was added 5.56 g of the compound (6-j), 13.2 g of NaBH$_4$ (manufactured by Wako Pure Chemical Industries, Ltd.) was added at 5° C. under a nitrogen atmosphere, and the mixture was stirred at room temperature for 2 days. After a solvent was distilled off, 500 ml of water was added, and the solid was filtered, and washed with 1000 ml of water. The resulting solid was dissolved in 200 ml of diethyl ether, washed with 300 ml of water and dried over magnesium sulfate. A solvent was distilled off to obtain 2.37 g of a compound (6-k).

To 80 ml of chloroform were added 2.37 g of the compound (6-k) and 1.87 g of benzil (manufactured by Wako Pure Chemical Industries, Ltd.), three droplets of methanesulfonic acid (manufactured by Wako Pure Chemical Industries, Ltd.) was added under a nitrogen atmosphere, and the mixture was heated to reflux for 11 hours. The resulting solution was washed with an aqueous sodium bicarbonate solution, and dried over magnesium sulfate. The resulting solution was purified by column chromatography (filler: silica gel, eluent: chloroform), and washed with methanol to obtain 3.72 g of a compound (6-1).

To 20 ml of tetrahydrofuran were added 1.0 g of the compound (6-1) and 1.87 g of tributyl(2-thienyl)tin (manufactured by Tokyo Chemical Industry Co., Ltd.), 32 mg of bis(triphenylphosphine)palladium dichloride (manufactured by Tokyo Chemical Industry Co., Ltd.) was further added under a nitrogen atmosphere, and the mixture was heated to reflux for 5 hours. After cooling to room temperature, 50 ml of methanol was added, and the sedimented precipitate was filtered, and washed sequentially with methanol, water and methanol. The resulting solid was purified by column chromatography (filler: silica gel, eluent: dichloromethane) to obtain 693 mg of a compound (6-m).

In 80 ml of dimethylformamide was dissolved 693 mg of the compound (6-m), 550 mg of N-bromosuccinimide was added, and the mixture was stirred at room temperature for 4 hours. To the resulting solution was added 250 ml of water, and the sedimented precipitate was filtered, and washed sequentially with water and methanol. The resulting solid was purified by column chromatography (filler: silica gel, eluent: dichloromethane), and washed with methanol to obtain 900 mg of a compound (6-n).

In 15 ml of toluene were dissolved 91 mg of the compound (6-n) and 99 mg of the compound (6-h). Four milliliter of water, 550 mg of potassium carbonate, 17 mg of tetrakis(triphenylphosphine) palladium (0) and one droplet of Aliquat (R) 336 (manufactured by Aldrich) were added thereto, and the mixture was stirred at 90° C. for 7 hours under a nitrogen atmosphere. Then, 20 mg of bromobenzene (manufactured by Tokyo Chemical Industry Co., Ltd.) was added, and the mixture was stirred at 90° C. for 1 hour. Then, 40 mg of phenylboronic acid (manufactured by Tokyo Chemical Industry Co., Ltd.) was added, and the mixture was stirred at 90° C. for 1 hour. After completion of stirring, the reaction mixture was cooled to room temperature, and poured into 200 ml of methanol. The precipitated solid was filtered, and washed sequentially with methanol, water, and acetone. The resulting solid was dissolved in 100 ml of chloroform, passed through a silica gel short column (eluent: chloroform), concentrated, and re-precipitated into methanol to obtain 35 mg of a compound [39]. A weight average molecular weight was 12000, a number average molecular weight was 7500, and a polymerization degree n was 14.0.

Synthesis Example 7

Synthesis of Compound [53]

The compound [53] was synthesized by a method showed in the formula 7.

[Chemical formula 17]

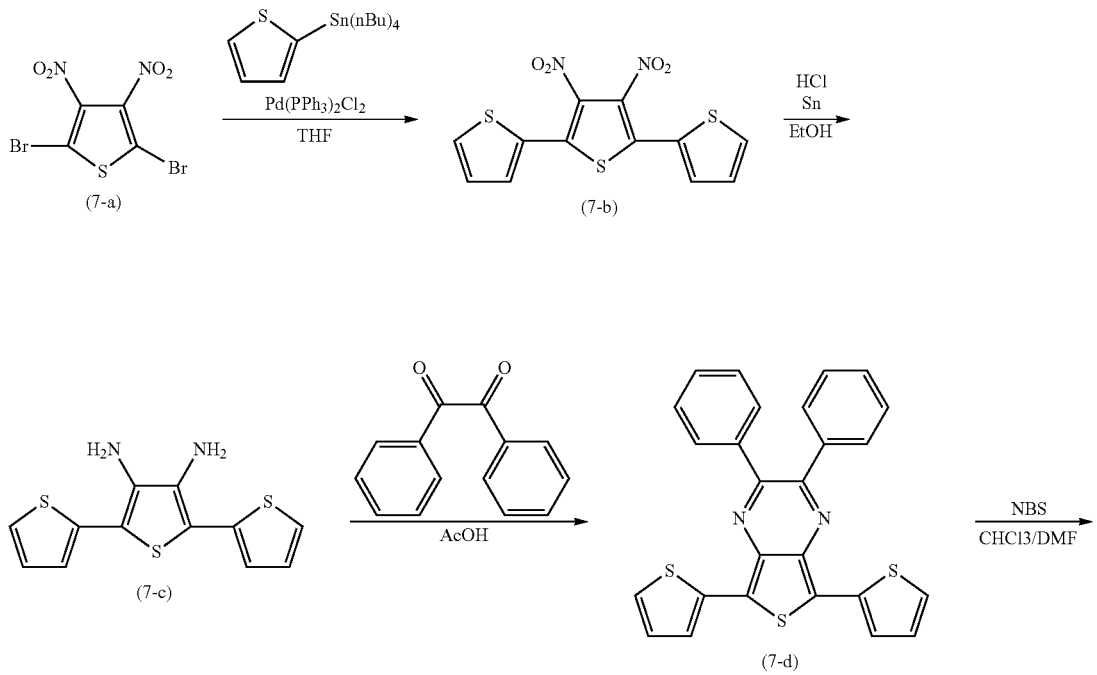

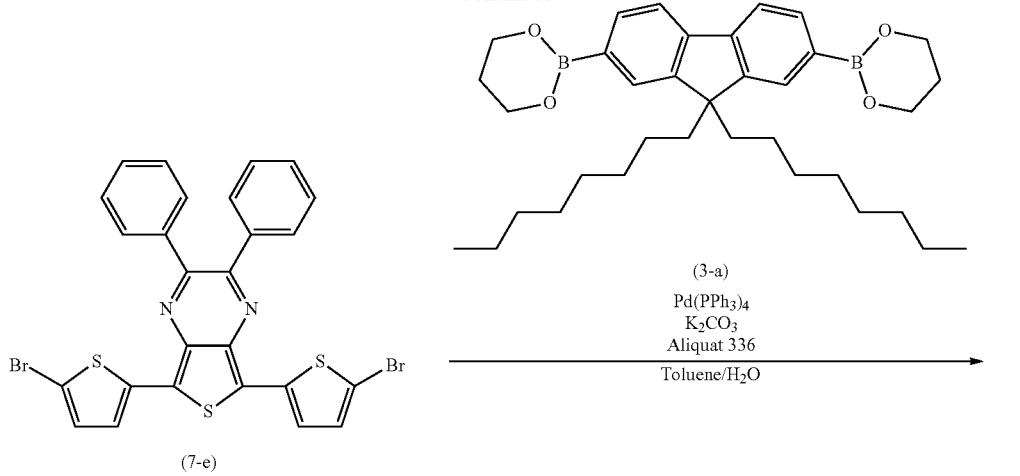

(7-e)

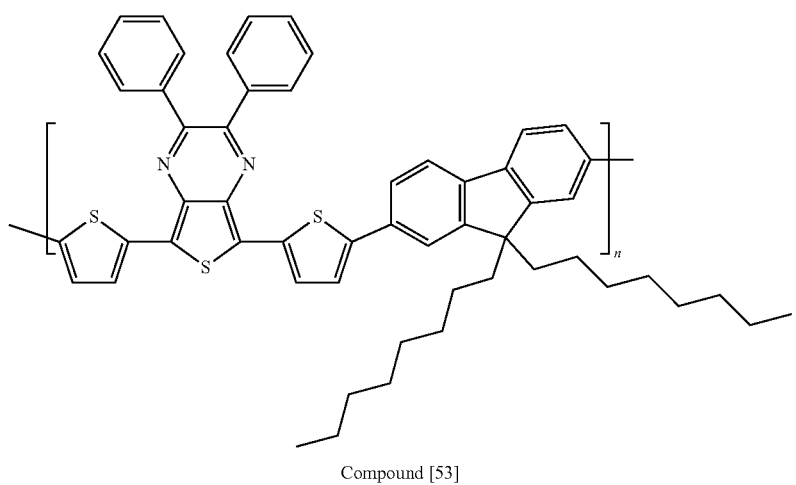

(3-a)

Pd(PPh$_3$)$_4$
K$_2$CO$_3$
Aliquat 336
Toluene/H$_2$O

Compound [53]

Compound [53]

To 50 ml of tetrahydrofuran was added 2.0 g of 2,5-dibromo-3,4-dinitrothiophene (7-a) and 5.6 g of tributyl (2-thienyl)tin, 0.21 g of bis(triphenylphosphine) palladium dichloride was added under a nitrogen atmosphere, and the mixture was heated to reflux for 5 hours. After cooling to room temperature, 50 ml of hexane was added, and the sedimented precipitate was filtered, and washed sequentially with hexane and methanol. The resulting solid was purified by column chromatography (filler: silica gel. eluent: dichloromethane), and washed with methanol to obtain 2.0 g of a compound (7-b).

To 30 ml of ethanol were added 2.0 g of the compound (7-b) and 2.8 g of a tin powder, 16 ml of 36% concentrated hydrochloric acid was added thereto, and the mixture was heated to reflux at 80° C. for 3 hours under a nitrogen atmosphere. After cooling to room temperature, the reaction solution was added to 200 ml of a 10 wt % aqueous potassium hydroxide solution, and the precipitate was filtered, and washed with water to obtain 0.89 g of a compound (7-c).

To 15 ml of acetic acid were added 0.89 g of the compound (7-c) and 0.67 g of benzil, and the mixture was stirred at 60° C. for 5 hours under a nitrogen atmosphere. The precipitated solid was filtered, and washed sequentially with acetic acid, methanol, water and methanol to obtain 1.4 g of a compound (7-d).

Then, 0.19 g of the compound (7-d) was dissolved in 15 ml of chloroform, 3 ml of a solution of 0.15 g of N-bromosuccinimide dissolved in DMF was added, and the mixture was stirred at room temperature for 22 hours. One hundred milliliter of methanol was added, and the produced solid was filtered, and washed sequentially with methanol, water and methanol. The resulting solid was purified by column chromatography (filler: silica gel, eluent, dichloromethane), and washed with methanol to obtain 0.23 g of a compound (7-e).

In 50 ml of toluene were dissolved 0.22 g of the compound (7-e) and 0.20 g of the compound (3-a). Four milliliter of water, 1.0 g of potassium carbonate, 42 mg of tetrakis (triphenylphosphine) palladium (0) and one droplet of Aliquat (R) 336 (manufactured by Aldrich) were added thereto, and the mixture was stirred at 100° C. for 3 hours under a nitrogen atmosphere. Then, 40 mg of phenylboronic acid was added, and the mixture was stirred at 100° C. for 1 hour. To the resulting solution was added 200 ml of methanol, and the produced solid was filtered, and washed sequentially with methanol, water and acetone. The resulting solid was dissolved in chloroform, passed through a silica gel short column (eluent: chloroform), and concentrated to dryness to obtain 80 mg of a compound (56). A weight average molecular weight was 9264, a number average molecular weight was 5070, and a polymerization degree n was 11.0.

Synthesis Example 8

Synthesis of Organic Semiconductor OSC1

The organic semiconductor OSC1 was synthesized by a method shown in the formula 8.

[Chemical formula 18]

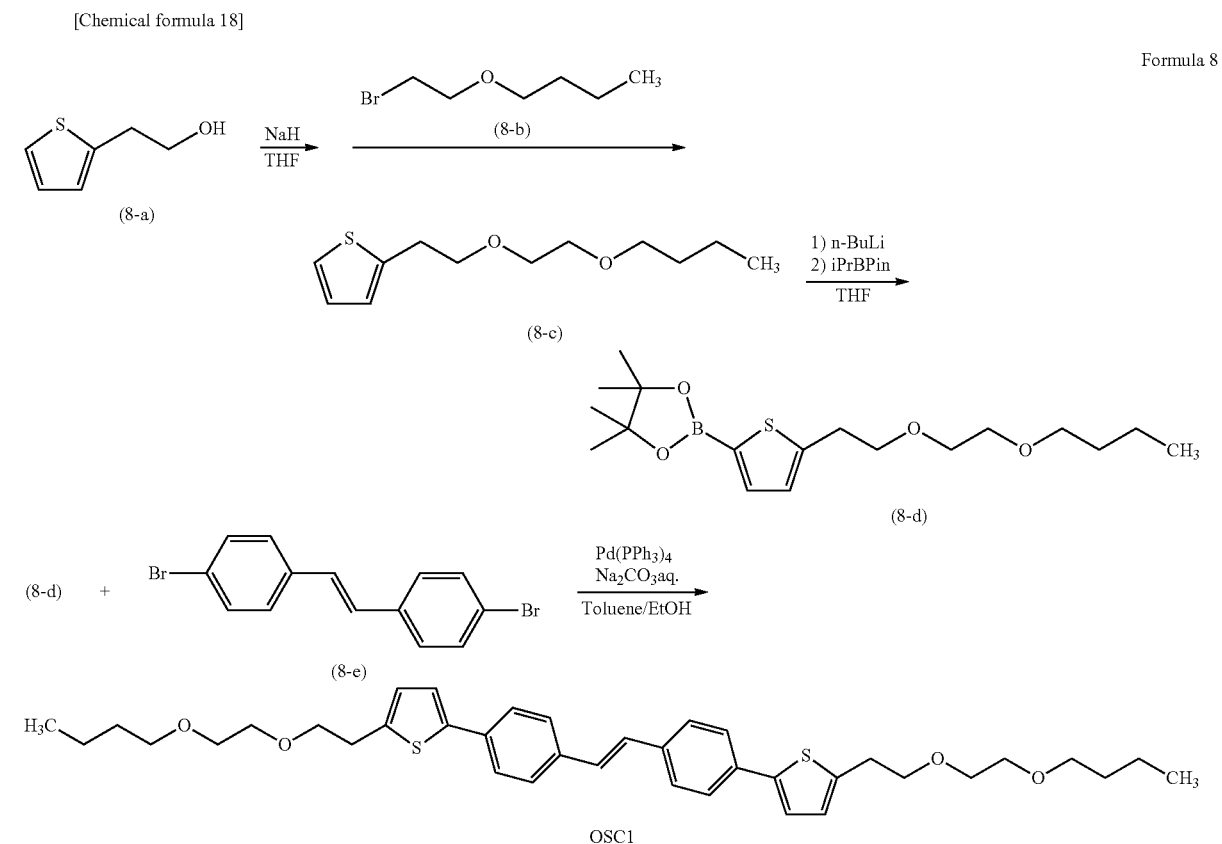

Formula 8

A compound (8-a) (17 g) was cooled to 0° C., and a suspension obtained by adding 7.1 g of sodium hydride (60% oily) to 110 ml of tetrahydrofuran was added dropwise. The mixture was stirred at 0° C. for 20 minutes under a nitrogen atmosphere, and 27 g of a compound (8-b) was added dropwise. Thereafter, a temperature was raised to 90° C., and the mixture was heated to stir for 8 hours. To the reaction solution were added 100 ml of water and 100 ml of dichloromethane, and the organic layer was taken. The resulting organic layer was washed with 300 ml of an aqueous saturated sodium chloride solution, and dried over anhydrous sodium sulfate. The resulting solution was concentrated with a rotary evaporator, and purified by column chromatography (filler: silica gel, eluent: hexane/dichloromethane) to obtain 19.7 g of a compound (8-c).

In 90 ml of tetrahydrofuran was dissolved 12 g of the compound (8-c), and the solution was cooled to −80° C. Thirty four milliliter of a butyllithium solution (1.6 M hexane solution) was added dropwise thereto, and the mixture was stirred for 6 hours. A temperature was raised to −30° C., 10 g of 2-isopropoxy-4,4,5,5-tetramethyl-[1,3,2]dioxaborolane was added dropwise, and the mixture was stirred at room temperature for 18 hours. To the resulting solution were added 100 ml of water and 100 ml of hexane, and the organic layer was taken. The resulting organic layer was washed with 300 ml of water, and dried over anhydrous magnesium sulfate. A solvent was distilled off from the resulting solution under reduced pressure using a rotary evaporator to obtain 8.8 g of a compound (8-d).

To a mixed solution of 0.21 g of 4,4'-dibromostilbene, 0.69 g of the compound (8-d), 20 ml of toluene, 4 ml of ethanol and 5 ml of a 2 M aqueous sodium carbonate solution was added 67 mg of tetrakis(triphenylphosphine)palladium (0), and the mixture was heated to stir at 100° C. for 10 hours under a nitrogen atmosphere. To the resulting solution were added 70 ml of dichloromethane and 50 ml of water, and the organic layer was taken. The resulting organic layer was washed with 150 ml of water, and dried over anhydrous magnesium sulfate. The resulting solution was concentrated with a rotary evaporator, and purified by column chromatography (filler: silica gel, eluent: hexane/dichloromethane) to obtain 80 mg of an organic semiconductor OSC1. The results of $^1$H-NMR analysis of the organic semiconductor OSC1 are shown.

$^1$H-NMR (CDCl$_3$ (d=ppm)): 0.89-0.94 (t, 6H), 1.32-1.41 (m, 4H), 1.54-1.60 (t, 4H), 3.09-3.14 (t, 4H), 3.44-3.49 (t, 4H), 3.57-3.64 (m, 8H), 3.69-3.74 (t, 4H), 6.83-6.84 (d, 2H), 7.08 (s, 2H), 7.15-7.16 (d, 2H), 7.48-7.55 (dd, 8H)

Example 1

(1) Preparation of Semiconductor Coating Solution

To 30 ml of chloroform were added 1.5 mg of CNT (manufactured by CNI, monolayer CNT, purity 95%, hereinafter referred to as monolayer CNT) and 1.5 mg of the compound [21], and the mixture was ultrasound-stirred at an output of 250 W for 30 minutes using an ultrasound homogenizer (VCX-500 manufactured by TOKYO TIKAKAI CO., LTD.) while ice-cooling. At the timepoint at which ultrasound irradiation was performed for 30 minutes, irradiation was stopped once, 1.5 mg of the compound [21] was additionally added and, further, ultrasound was irradiated for one minute, thereby, a CNT composite pre-dispersion A (CNT concentration relative to a solvent 0.05 g/l) was obtained.

In order to investigate whether the compound [21] was attached to CNT in the CNT composite pre-dispersion A or not, 5 ml of the CNT composite pre-dispersion A was filtered using a membrane filter to trap CNT on the filter. The trapped CNT was quickly transferred onto a silicon wafer before a solvent was dried, to obtain dried CNT. When this CNT was subjected to elementary analysis using X-ray photoelectron spectroscopy (XPS), a sulfur element contained in the compound [21] was detected. Therefore, it was confirmed that the compound [21] was attached to CNT in the CNT composite pre-dispersion A.

Then, a semiconductor coating solution for forming a semiconductor layer 4 was prepared. The CNT composite pre-dispersion A was filtered using a membrane filter (pore diameter 10 μm, diameter 25 mm, Omnipore Membrane manufactured by Millipore) to remove CNT having a length of 10 μm or more. The resulting filtrate was designated as CNT composite dispersion A. The CNT composite dispersion A (0.2 ml) and 0.8 ml of 1,2,3,4-tetrahydronaphthalene were mixed, 5 mg of the OSC1 as an organic semiconductor was added to prepare a semiconductor coating solution. Thereupon, concentrations were adjusted so that an OSC1 concentration became 5 g/l, and a concentration of the CNT composite became 0.2 part by weight relative to 100 parts by weight of OSC1.

(2) Preparation of Polymer Solution for Gate Insulating Layer

In 203.36 g of propylene glycol monobutyl ether (boiling point 170° C.) were dissolved 61.29 g (0.45 mol) of methyltrimethoxysilane, 12.31 g (0.05 mol) of β-(3,4-epoxycyclohexyl)ethyltrimethoxysilane, and 99.15 g (0.5 mol) of phenyltrimethoxysilane, and 54.90 g of water and 0.864 g of phosphoric acid were added thereto while stirring. The resulting solution was heated at a bath temperature of 105° C. for 2 hours, and an internal temperature was raised to 90° C. to distill off a component containing mainly methanol as a byproduct. Then this was heated at a bath temperature of 130° C. for 2.0 hours, an internal temperature was raised to 118° C. to distill off a component containing water mainly, and this was cooled to room temperature to obtain a polymer solution A having a solid matter concentration of 26.0% by weight.

Fifty gram of the resulting polymer solution A was weighed, this was mixed with 16.6 g of propylene glycol monobutyl ether (boiling point 170° C.), and the mixture was stirred at room temperature for 2 hours to obtain a polymer solution B (solid matter concentration 19.5% by weight).

(3) Preparation of FET

FET shown in FIG. 1 was manufactured. Chromium of 5 nm and gold of 50 nm were vacuum-deposited on a grass substrate 1 (film thickness 0.7 mm) through a mask by a resistance heating method, to form a gate electrode 2. Then, the polymer solution B prepared by the method described in the (2) was spin-coated (2000 rpm×30 seconds) on the grass substrate on which the gate electrode had been formed, and this was heat-treated at 200° C. for 1 hour under a nitrogen stream, thereby, a gate insulating layer 3 having a film thickness of 600 nm was formed. Then, gold was vacuum-deposited through a mask by a resistance heating method, so that a film thickness became 50 nm, to form a source electrode 5 and a drain electrode 6.

A width of these both electrodes (channel width) was 0.1 cm, and an interval between both electrodes (channel length) was 100 μm. The semiconductor coating solution (1 μL) prepared by the method described in the (1) was added dropwise to a substrate on which electrodes had been formed, and this was air-dried at 30° C. for 10 minutes, and heat-treated at 150° C. for 30 minutes on a hot plate under a nitrogen stream to obtain FET.

Then, current between source and drain (Id)-voltage between source and drain (Vsd) property when a gate voltage (Vg) of the FET was changed, was measured. For measurement, a semiconductor property assessment system, Model 4200-SCS (manufactured by Keithley Instruments Inc.) was used, and the property was measured in the atmospheric air. When mobility of a linear region was obtained from change in a value of Id at Vsd=−5 V when Vg was changed as Vg=+30∼−30 V, it was 0.48 $cm^2$/V·sec. In addition, when an on off ratio was obtained from a ratio of maximum and minimum of Id thereupon, it was $7.5 \times 10^4$. Further, hysteresis was obtained from an absolute value of a gate voltage difference between forward and reverse $|Vg^1-Vg^2|$ at $Id=10^{-8}$, it was 11 V and, when a threshold voltage was obtained from an intersection between an extension line of a linear part and a Vg axis in an Id-Vg graph, it was 10 V.

Examples 2 to 9

According to the same manner as in Example 1 except that the conjugated polymer and the organic semiconductor for forming the CNT composite were changed as shown in Table 1, a CNT composite dispersion was prepared. When this was subjected to elementary analysis using XPS, it was confirmed that the conjugated polymer was attached to CNT. Then, FET was manufactured using the CNT composite dispersion according to the same manner as in Example 1, and property was measured. The results are shown in Table 1.

Comparative Example 1

According to the same manner as in Example 1 except that poly-3-hexylthiophene (manufactured by Aldrich, Regio-regular, number average molecular weight (Mn): 13000, hereinafter referred to as P3HT) was used as the conjugated polymer for forming the CNT composite, a CNT composite dispersion E was prepared. When this was subjected to elementary analysis using XPS, it was confirmed that P3HT was attached to CNT. Then, according to the same manner as in Example 1 except that the CNT composite dispersion E was used in place of the CNT composite dispersion A, FET was manufactured, and property was measured. When Vg was changed as Vg=+30∼−30 V, mobility was 0.37 $cm^2$/V·sec, and an on off ratio was $4.30 \times 10^3$. In addition, hysteresis was 20 V, and a threshold voltage was 11 V.

Comparative Example 2

According to the same manner as in Example 1 except that poly-3-octylthiophene (manufactured by Aldrich, Regio-regular, number average molecular weight (Mn): 10000, hereinafter referred to as 23OT) was used as the conjugated polymer for forming the CNT composite, a CNT composite dispersion F was prepared. When this was subjected to elementary analysis using XPS, it was confirmed that P3OT was attached to CNT. Then, according to the same manner as in Example 1 except that the CNT composite dispersion F was used in place of the CNT composite dispersion A, FET was manufactured, and property was measured. When Vg was changed as Vg=+30~−30 V, mobility was $7.3 \times 10^{-2}$ cm$^2$/V·sec, and an on off ratio was $1.01 \times 10^4$. In addition, hysteresis was 24 V, and a threshold voltage was 13 V.

Example 10

The CNT composite dispersion G (0.2 ml) prepared in Example 7, 0.3 ml of 1,2-dichrolomenzene and 0.5 ml of tetrahydronaphthalene were mixed to prepare a semiconductor coating solution I. According to the same manner as in (3) of Example 1 except that the semiconductor coating solution I was used as a solution for forming the semiconductor layer 4, FET was manufactured, and property was measured. The results are shown Table 1.

Example 11

On a semiconductor layer 4 of FET manufactured as in Example 4 was dropping-cast 10 μl of a 20 wt % butanol solution of an acryl resin SPCR-6x(manufactured by SHOWA DENKO K.K.), to form a second insulating layer. Subsequently, the layer was air-dried at 30° C. for 5 minutes, and heat-treated at 140° C. for 30 minutes on a hot plate under a nitrogen stream to manufacture FET having a second insulating layer, and property was measured. The results are shown in Table 1.

Example 12

According to the same manner as in Example 11 except that the compound [33] was used as the conjugated polymer for forming the CNT composite, FET having a second insulating layer was manufactured, and property was measured. The results are shown in Table 1.

Example 13

According to the same manner as in Example 11 except that the compound [39] was used as the conjugated polymer for forming the CNT composite, FET having a second insulating layer was manufactured, and property was measured. The results are shown in Table 1.

Example 14

On a semiconductor layer 4 of FET manufactured as in Example 7 was dropping-cast 10 μL of a 5 wt % methyl ethyl ketone solution of poly (methyl methacrylate) (manufactured by Aldrich, weight average molecular weight (Mw): 350000, hereinafter referred to as PMMA), to form a second insulating layer. Subsequently, the layer was air-dried at 30° C. for 5 minutes, and heat-treated at 120° C. for 30 minutes on a hot plate under a nitrogen stream to manufacture FET having a second insulating layer, and property was measured. The results are shown in Table 1.

Example 15

According to the same manner as in Example 14 except that a second insulating layer was formed using the polymer solution B prepared in (2) of Example 1, FET having a second insulating layer was manufactured, and property was measured. The results are shown in Table 1.

Example 16

According to the same manner as in Example 14 except that a second insulating layer was formed using a 5 wt % butanol solution of polyvinylphenol (manufactured by Aldrich, weight average molecular weight (Mw): 20000, hereinafter referred to as PVP), FET having a second insulating layer was manufactured, and property was measured. The results are shown in Table 1.

Example 17

According to the same manner as in Example 11 except that the semiconductor layer 4 was formed as in Example 10, FET having a second insulating layer was manufactured, and property was measured. The results are shown in Table 1.

Example 18

According to the same manner as in Example 12 except that a second insulating layer was formed using a solution obtained by adding 3-aminopropyltriethoxysilane (manufactured by Aldrich, hereinafter referred to as APS) to the 20 wt % butanol solution of SPCR-6x at an amount of 5 parts by weight relative to 100 parts by weight of SPCR-6x, organic FET was manufactured, and property was measured. The results are shown in Table 1.

Example 19

According to the same manner as in Example 18 except that the compound [39] was used as the conjugated polymer for forming the CNT composite, organic FET was manufactured, and property was measured. The results are shown in Table 1.

TABLE 1

| | Conjugated polymer | CNT composite dispersion | Organic semiconductor | Second insulating layer | Mobility (cm$^2$/Vs) | On off ratio | Hysteresis (V) | Threshold voltage (V) |
|---|---|---|---|---|---|---|---|---|
| Example 1 | Compound 21 | CNT composite dispersion A | OSC 1 | — | 0.48 | $7.5 \times 10^4$ | 11 | 10 |
| Example 2 | Compound 22 | CNT composite dispersion B | OSC 1 | — | 0.34 | $4.1 \times 10^4$ | 13 | 13 |
| Example 3 | Compound 23 | CNT composite dispersion C | OSC 1 | — | 0.47 | $1.1 \times 10^5$ | 10 | 14 |
| Example 4 | Compound 24 | CNT composite dispersion D | OSC 1 | — | 0.51 | $5.8 \times 10^4$ | 12 | 10 |
| Example 5 | Compound 24 | CNT composite dispersion D | OSC 2 | — | 0.18 | $4.6 \times 10^4$ | 10 | 11 |
| Example 6 | Compound 24 | CNT composite dispersion D | OSC 3 | — | 0.15 | $3.8 \times 10^4$ | 11 | 9.5 |
| Example 7 | Compound 33 | CNT composite dispersion G | OSC 1 | — | 0.38 | $1.0 \times 10^5$ | 11 | 11 |

TABLE 1-continued

| | Conjugated polymer | CNT composite dispersion | Organic semiconductor | Second insulating layer | Mobility (cm²/Vs) | On off ratio | Hysteresis (V) | Threshold voltage (V) |
|---|---|---|---|---|---|---|---|---|
| Example 8 | Compound 39 | CNT composite dispersion H | OSC 1 | — | 0.17 | $3.8 \times 10^4$ | 11 | 13 |
| Example 9 | Compound 53 | CNT composite dispersion J | OSC 1 | — | 0.31 | $7.5 \times 10^4$ | 12 | 13 |
| Example 10 | Compound 33 | CNT composite dispersion I | — | — | 0.26 | $4.2 \times 10^5$ | 10 | 10 |
| Example 11 | Compound 24 | CNT composite dispersion D | OSC 1 | SPCR-6X | 0.19 | $4.2 \times 10^5$ | 3.8 | 1.8 |
| Example 12 | Compound 33 | CNT composite dispersion G | OSC 1 | SPCR-6X | 0.33 | $2.2 \times 10^6$ | 2.9 | 1.5 |
| Example 13 | Compound 39 | CNT composite dispersion H | OSC 1 | SPCR-6X | 0.13 | $4.4 \times 10^5$ | 4.5 | 2.1 |
| Example 14 | Compound 33 | CNT composite dispersion G | OSC 1 | PMMA | 0.25 | $8.9 \times 10^5$ | 3.1 | 2.8 |
| Example 15 | Compound 33 | CNT composite dispersion G | OSC 1 | PCC | 0.21 | $3.1 \times 10^6$ | 5.5 | 5.7 |
| Example 16 | Compound 33 | CNT composite dispersion G | OSC 1 | PVP | 25 | $5.7 \times 10^5$ | 6.7 | 4.5 |
| Example 17 | Compound 33 | CNT composite dispersion G | — | SPCR-6X | 0.34 | $5.8 \times 10^6$ | 3.3 | 1.2 |
| Example 18 | Compound 33 | CNT composite dispersion G | OSC 1 | SPCR-6X APS | 0.5 | $1.0 \times 10^5$ | 4.3 | 0.8 |
| Example 19 | Compound 39 | CNT composite dispersion H | OSC 1 | SPCR-6X APS | 0.14 | $7.3 \times 10^5$ | 3.9 | 1.3 |
| Comparative Example 1 | P3HT | CNT composite dispersion E | OSC 1 | — | 0.37 | $4.3 \times 10^3$ | 20 | 11 |
| Comparative Example 2 | P3OT | CNT composite dispersion F | OSC 1 | — | 0.073 | $1.0 \times 10^4$ | 24 | 13 |

OSC1: Organic semiconductor synthesized in Synthesis Example 8
OSC2: Poly(2,5-bis(2-thienyl)-3,6-dipentadecylthieno[3,2-b]thiophene)
OSC3: Poly(5,5'-bis(4-octylthiazol-2-yl)-2,2'-bithiophene)

Industrial Applicability

The CNT composite of the present invention is suitably used in various devices such as a field-effect transistor, a photovoltaic power element, and a switching element.

Explanation of Symbols

| 1 | Substrate |
|---|---|
| 2 | Gate electrode |
| 3 | Gate insulating layer |
| 4 | Semiconductor layer |
| 5 | Source electrode |
| 6 | Drain electrode |

The invention claimed is:

1. A carbon nanotube composite comprising a carbon nanotube and a conjugated polymer comprising repeating units containing a fused heteroaryl unit having a nitrogen-containing double bond in the ring and a thiophene unit, wherein the conjugated polymer is attached to at least a part of a surface of the carbon nanotube, the conjugated polymer comprising repeating units containing a quinoxaline unit and a thiophene unit or the conjugated polymer has a structure represented by the general formula (1):

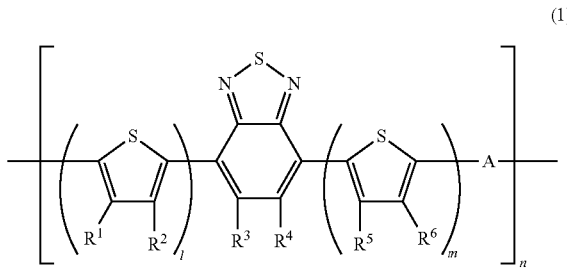

(1)

Wherein $R^1$ to $R^6$ may be the same or different, and each represent hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an arylcarbonyloxy group, or a silyl group, adjacent groups of $R^1$ to $R^6$ may form a ring structure, A is selected from a single bond, an arylene group, a heteroarylene group except for a thienylene group, an ethenylene group and an ethynylene group, l and m represent an integer of 0 to 10, and l+m≧4, n represents a range of 2 to 1000, when l, m and n are 2 or more, each $R^1$ to $R^6$ and A may be the same or different.

2. An organic semiconductor composite containing the carbon nanotube composite as defined in claim 1, and an organic semiconductor.

3. A field-effect transistor having a gate electrode, a gate insulating layer, a semiconductor layer, a source electrode and a drain electrode, wherein the semiconductor layer contains the carbon nanotube composite as defined in claim 1.

4. The field-effect transistor according to claim 3, wherein the semiconductor layer further contains an organic semiconductor.

5. The field-effect transistor according to claim 3, wherein the transistor has a second insulating layer formed on an opposite side of the gate insulating layer relative to the semiconductor layer.

6. The field-effective transistor according to claim 5, wherein the second insulating layer comprises a layer formed by a coating method.

7. The field-effective transistor according to claim 5, wherein the second insulating layer contains an organic polymer material selected from the group consisting of polyfluoroethylene, polynorbornene, polysiloxane, polyimide, polystyrene, polycarbonate and a derivative thereof, a polyacrylic acid derivative, a polymethacrylic acid derivative, and a copolymer containing them.

8. The field-effective transistor according to claim 3, wherein at least one layer of the gate insulating layer, the semiconductor layer, and the second insulating layer contains an amine compound.

9. A carbon nanotube composite in which a conjugated polymer comprising repeating units containing a fused heteroaryl unit having a nitrogen-containing double bond in the ring, and a thiophene unit is attached to at least a part of the surface of a carbon nanotube,
wherein the conjugated polymer comprising repeating units containing a quinoxaline unit and a thiophene unit or the conjugated polymer has a structure represented by the general formula (1):

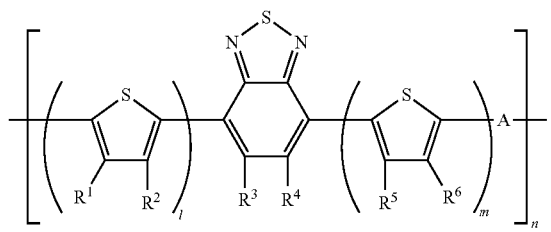

(1)

Wherein $R^1$ to $R^6$ may be the same or different, and each represent hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an arylcarbonyloxy group, or a silyl group, adjacent groups of $R^1$ to $R^6$ may form a ring structure, A is selected from a heteroarylene group except for a thienylene group, an ethenylene group and an ethynylene group, l and m represent an integer of 0 to 10, and $l+m \geq 1$, n represents a range of 2 to 1000, when l, m and n are 2 or more, each $R^1$ to $R^6$ and A may be the same or different.

10. A carbon nanotube composite in which a conjugated polymer comprising repeating units containing a fused heteroaryl unit having a nitrogen-containing double bond in the ring, and a thiophene unit is attached to at least a part of the surface of a carbon nanotube,
wherein the conjugated polymer comprising repeating units containing a quinoxaline unit and a thiophene unit or the conjugated polymer has a structure selected from following chemical formulas:

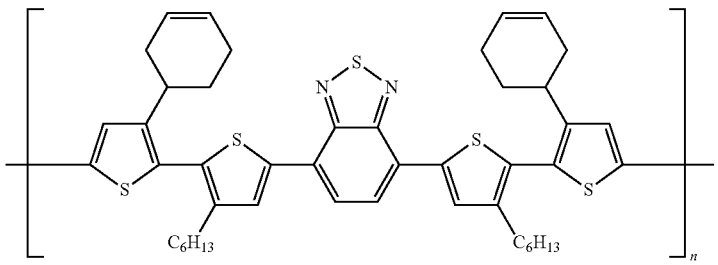

[2]

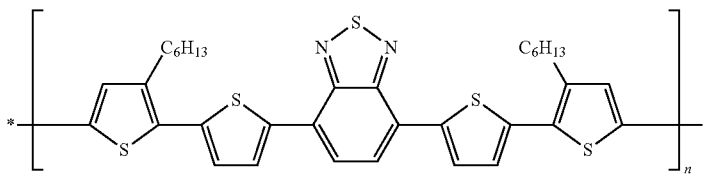

[3]

-continued
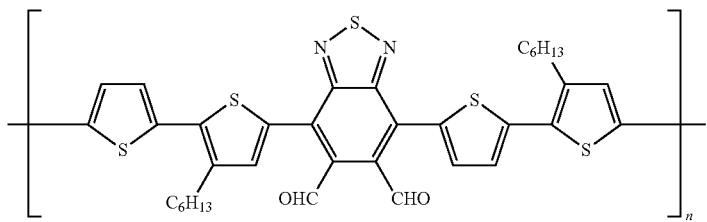
[4]
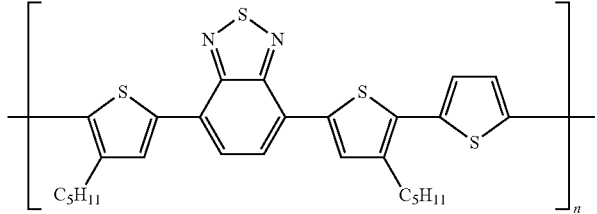
[5]
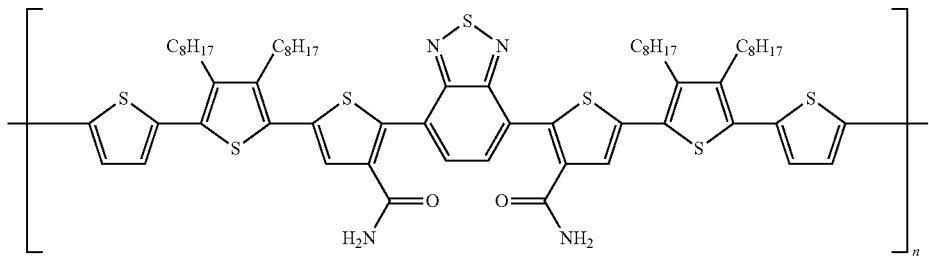
[6]
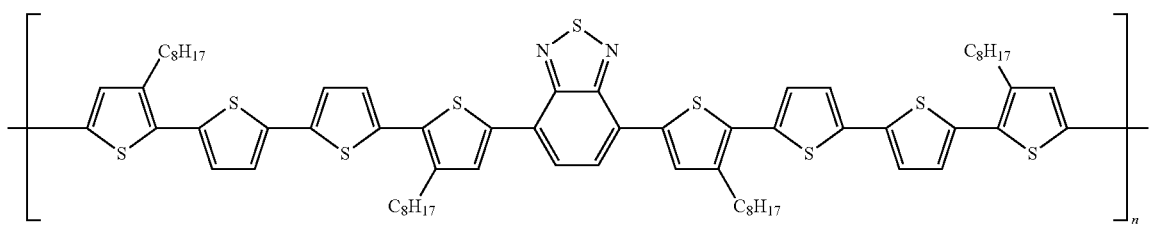
[7]
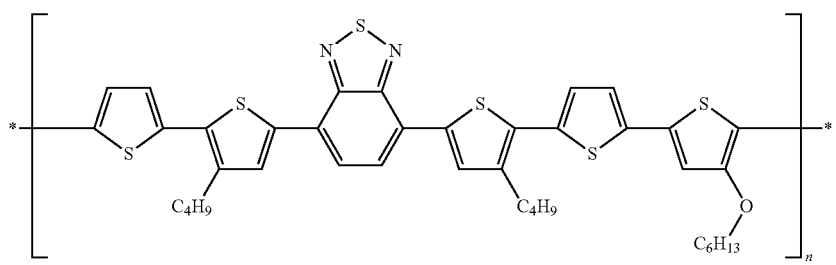
[8]
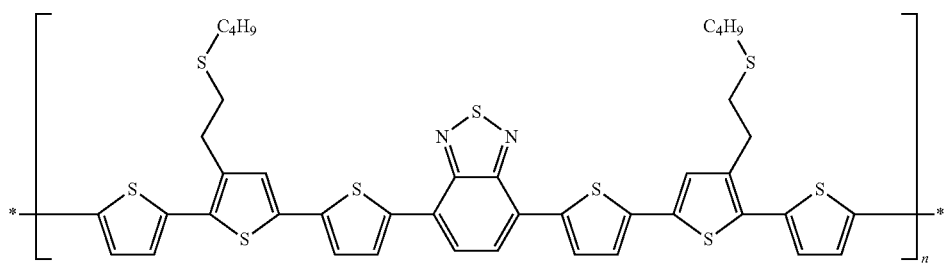
[9]

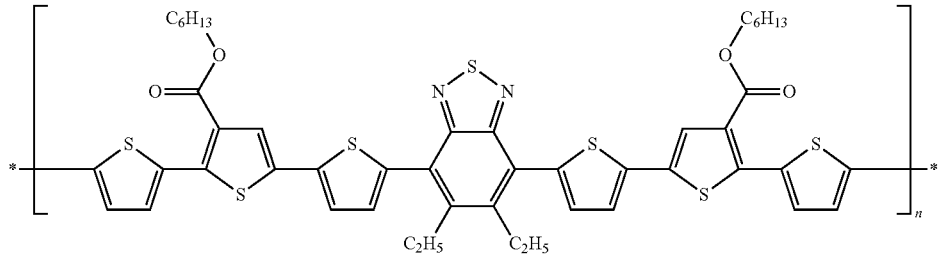
[10]
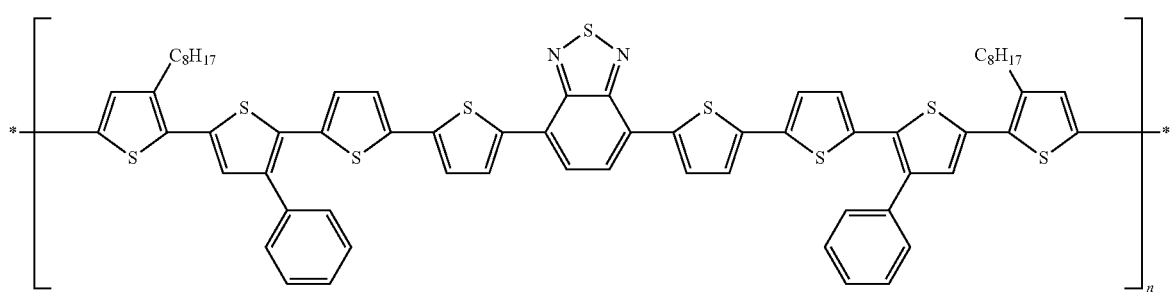
[11]
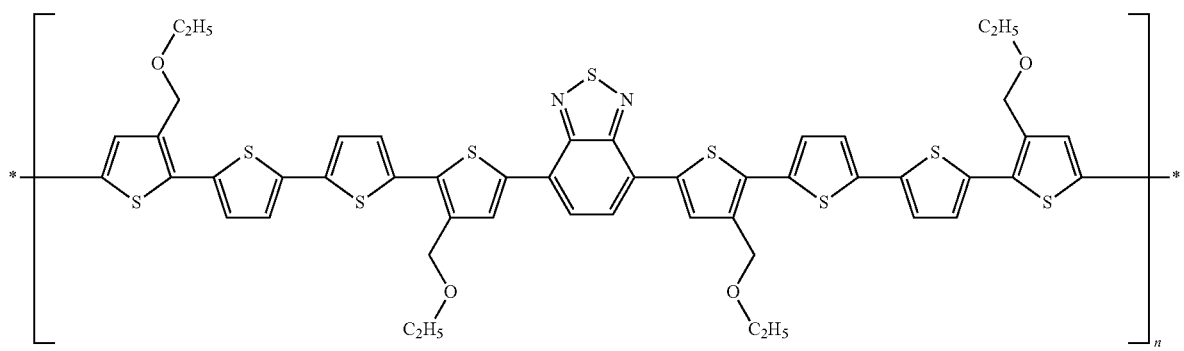
[12]
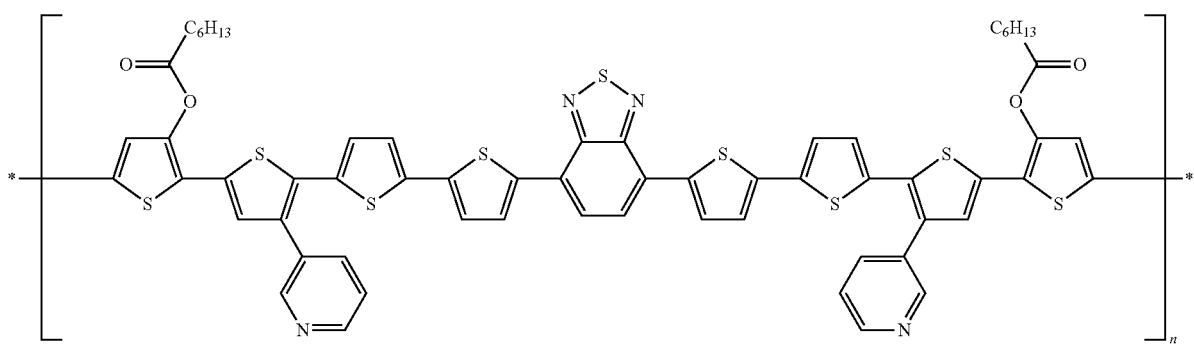
[13]
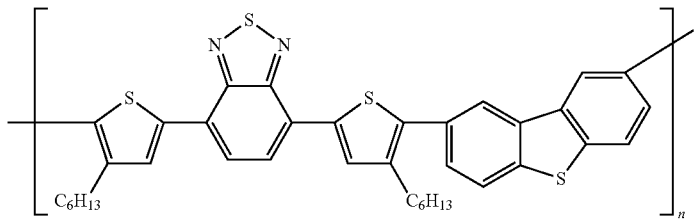
[14]

-continued
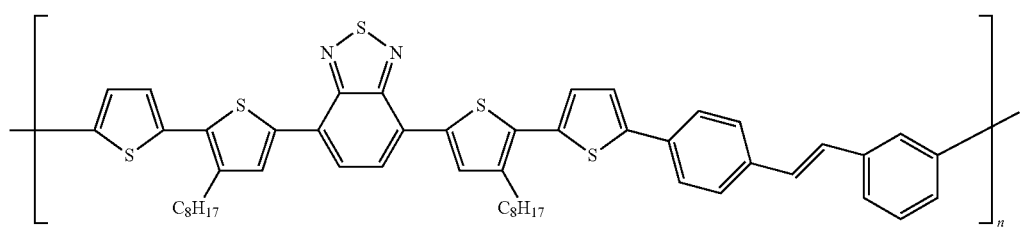
[15]
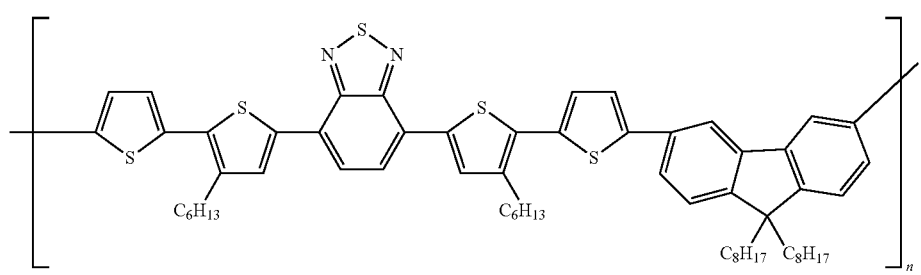
[16]
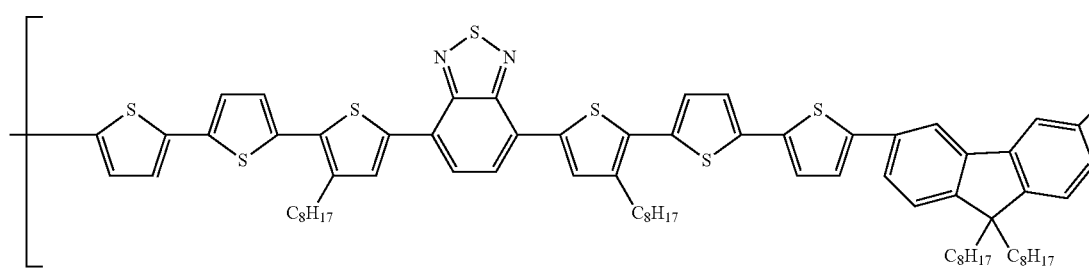
[17]
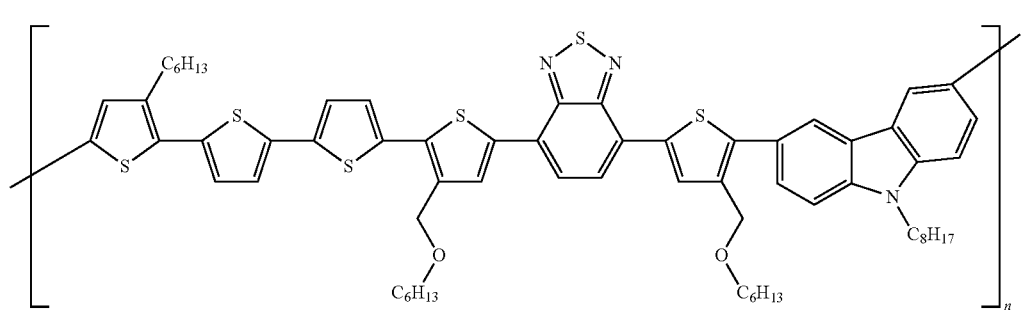
[18]
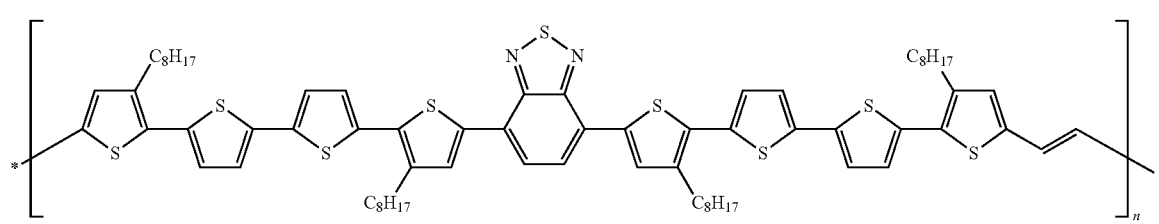
[19]
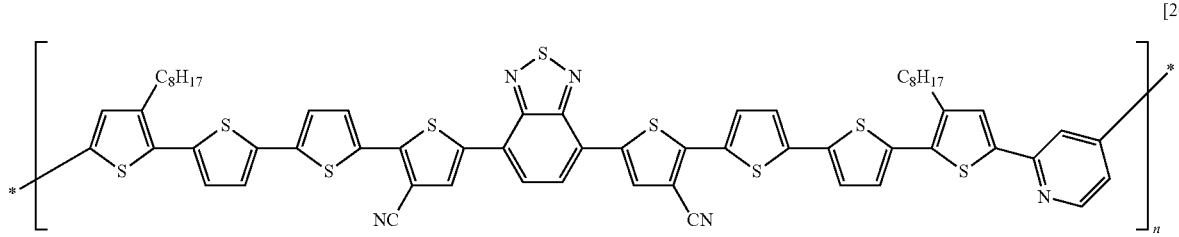
[20]

-continued
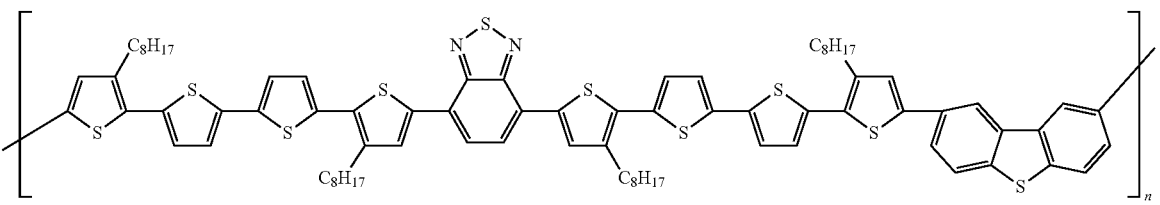
[21]
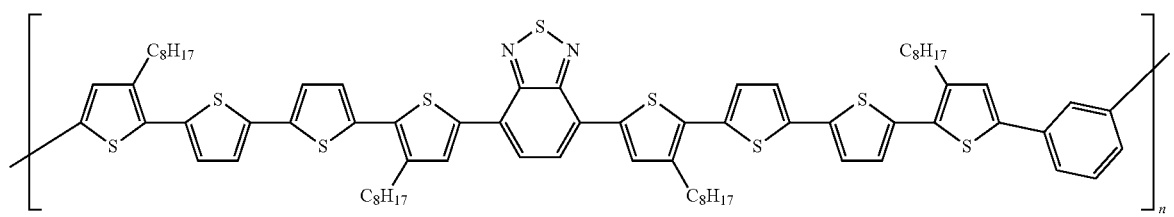
[22]
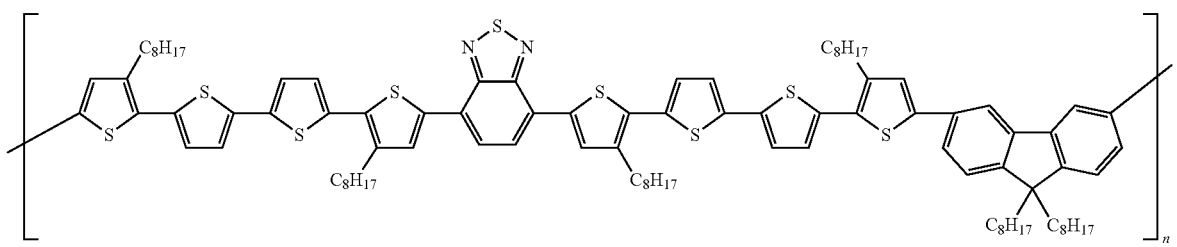
[23]
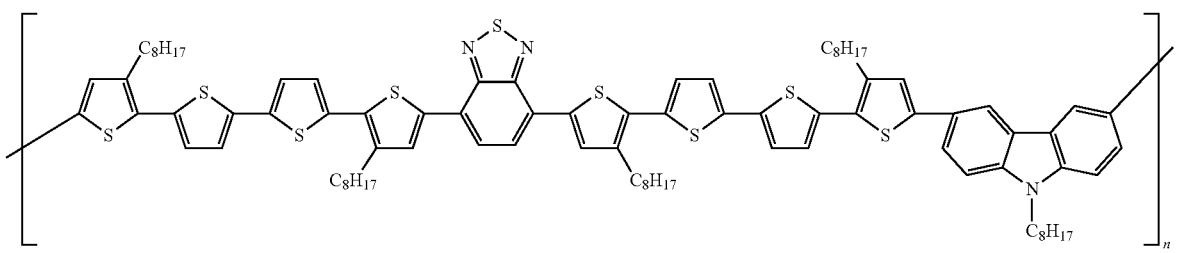
[24]
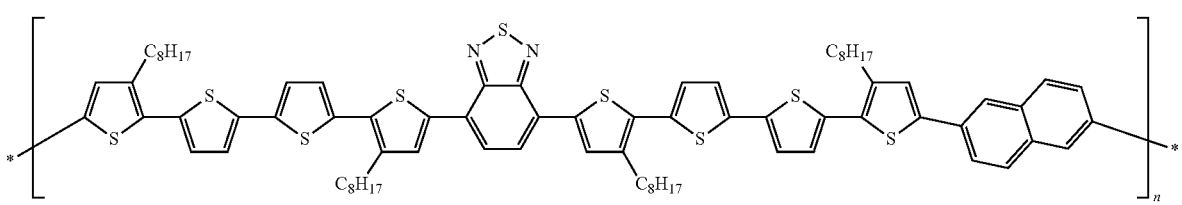
[25]
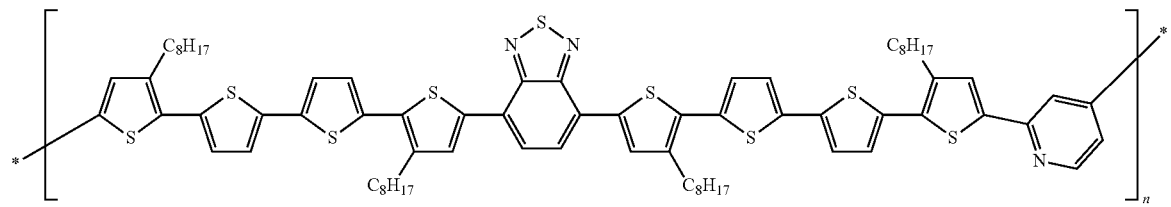
[26]

-continued
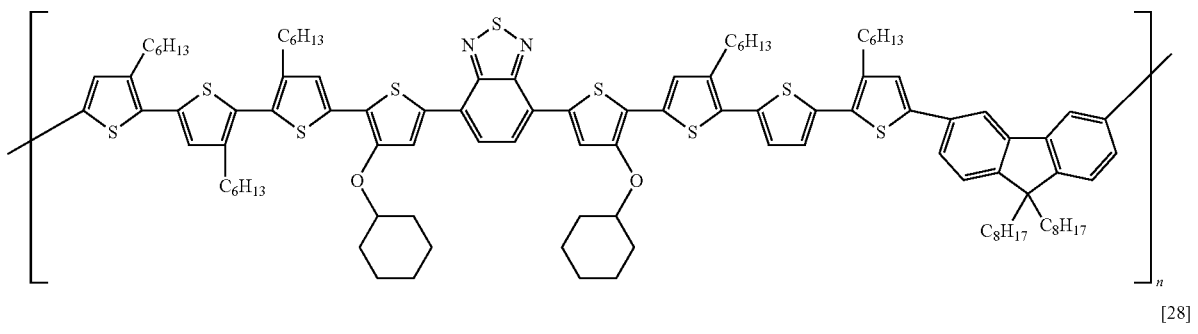
[27]
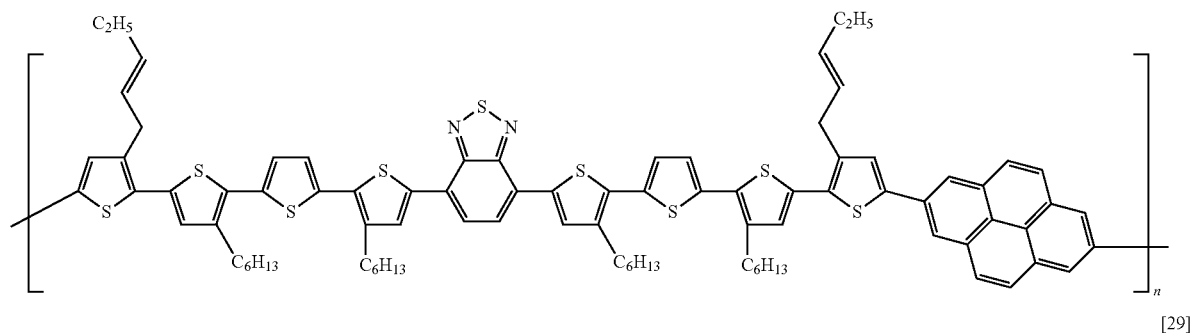
[28]
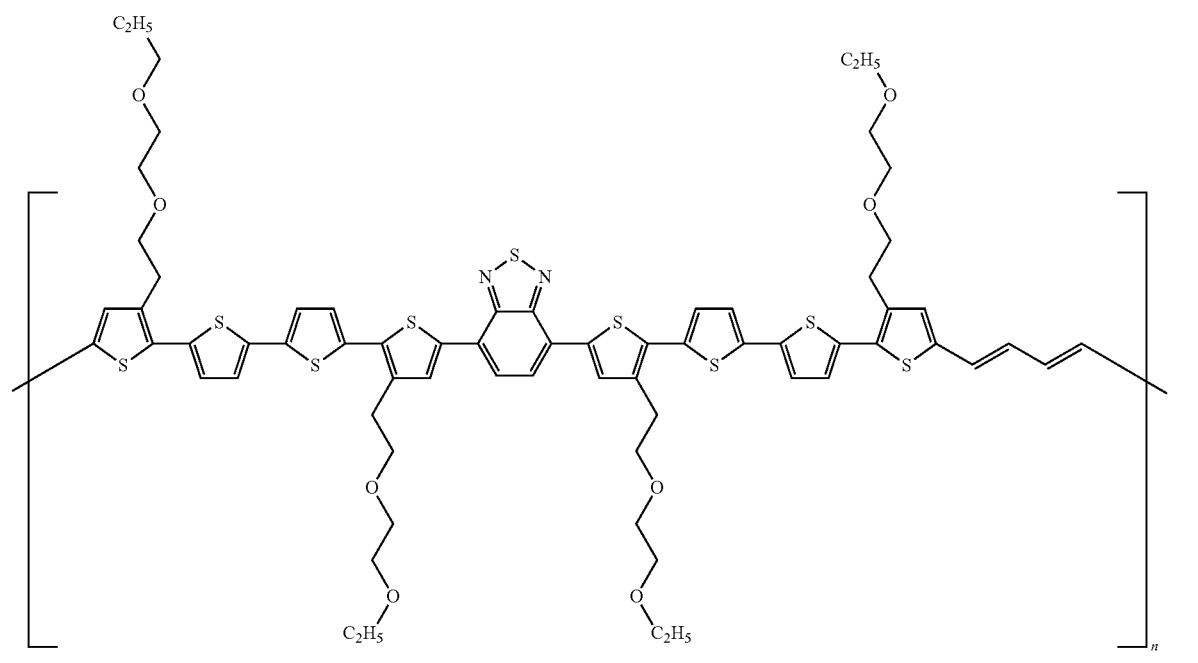
[29]
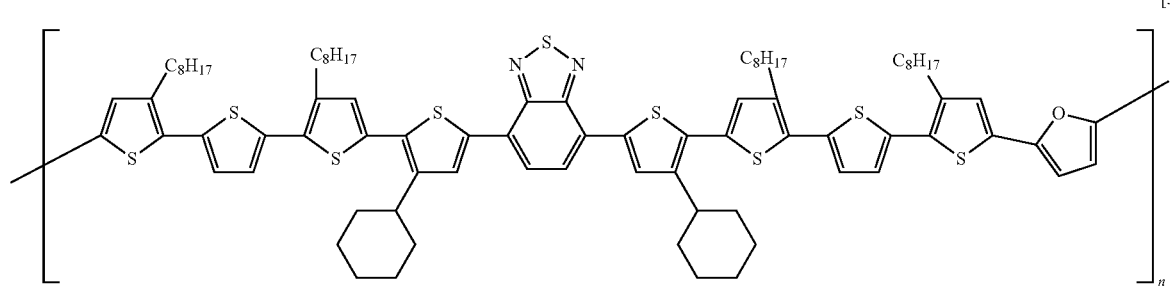
[30]

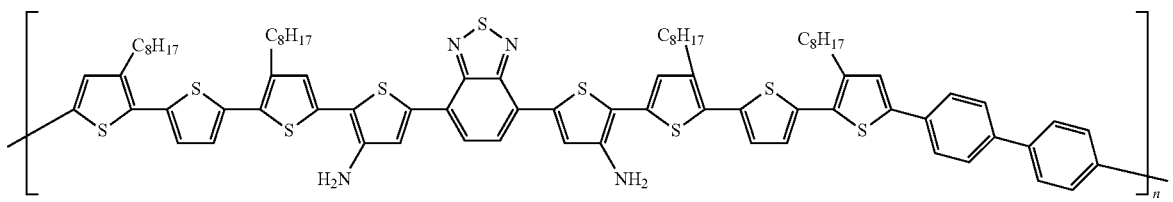
[31]
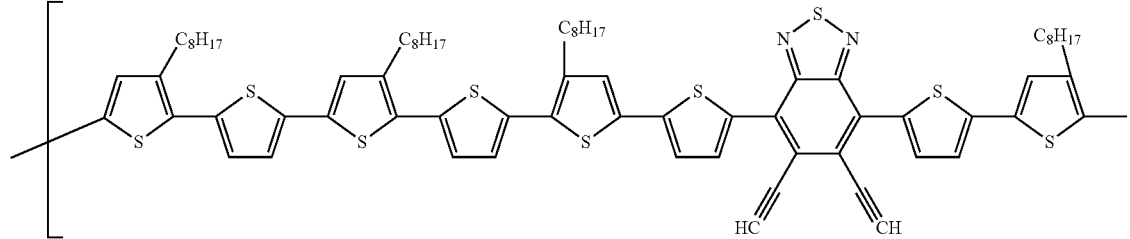
[32]
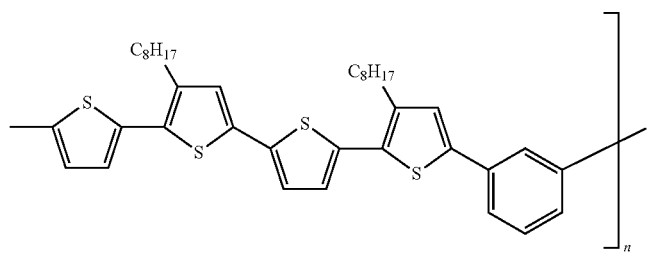
[33]
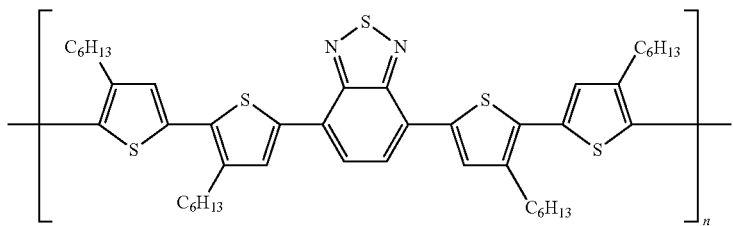
[34]
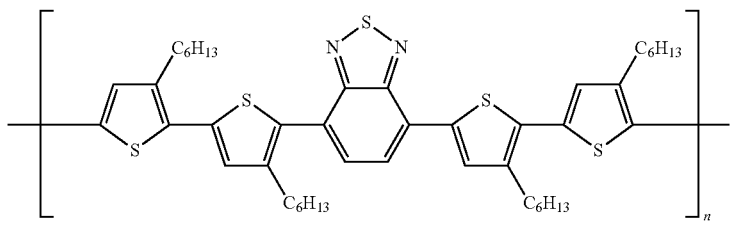
[35]
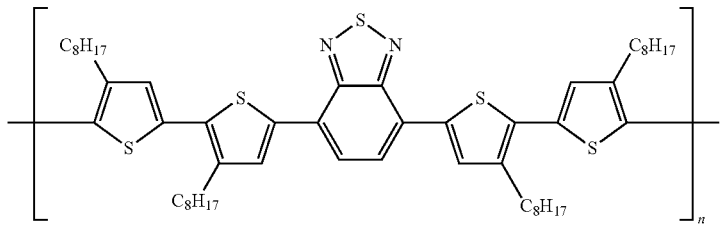

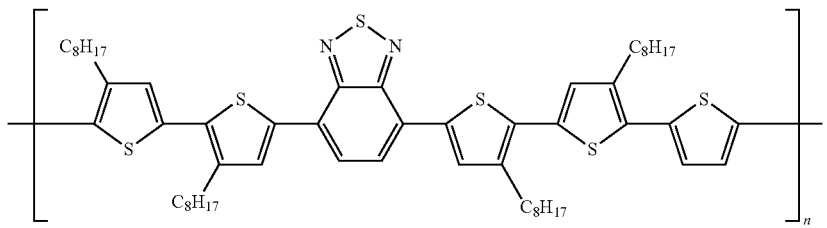
[36]
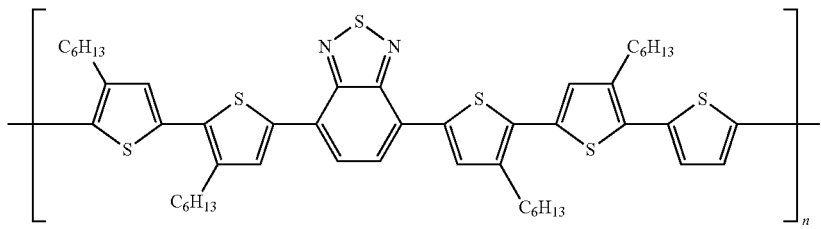
[37]
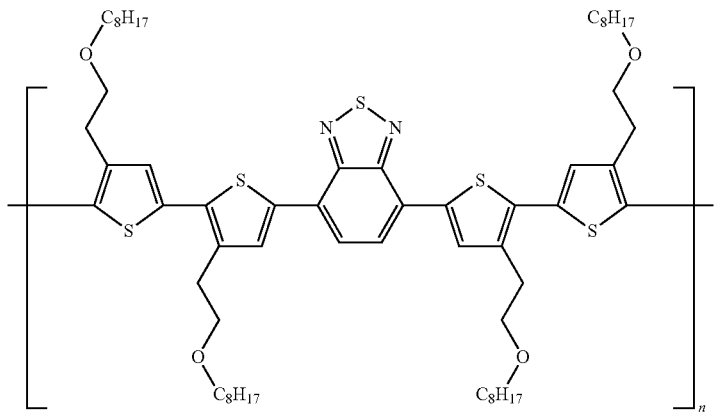
[38]
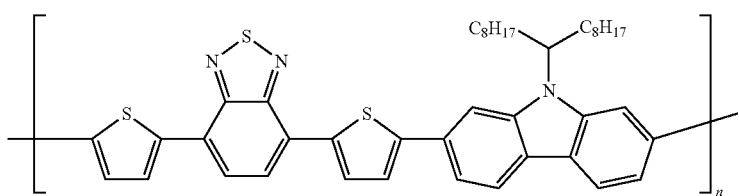
[39]
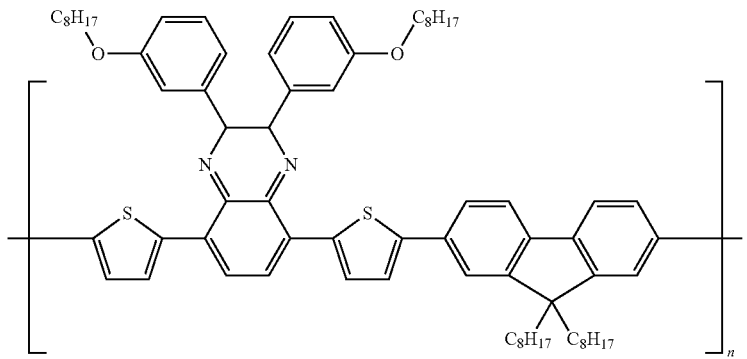
[40]

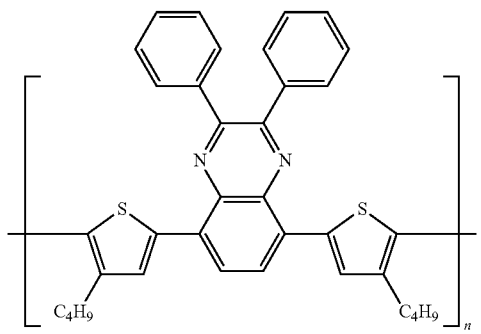
[41]
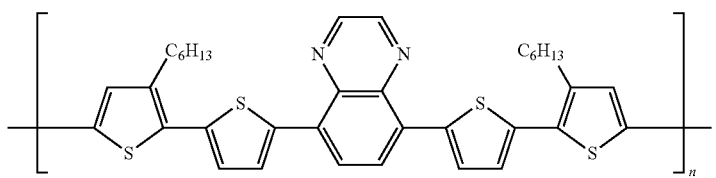
[42]
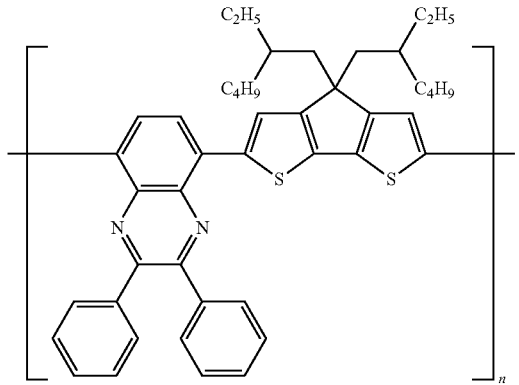
[43]
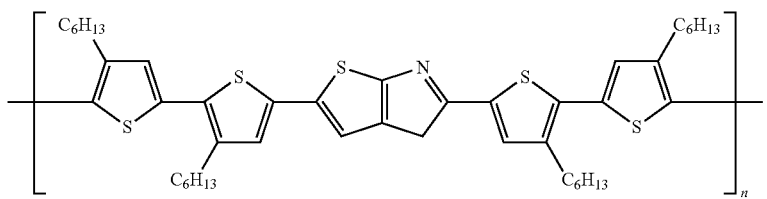
[44]
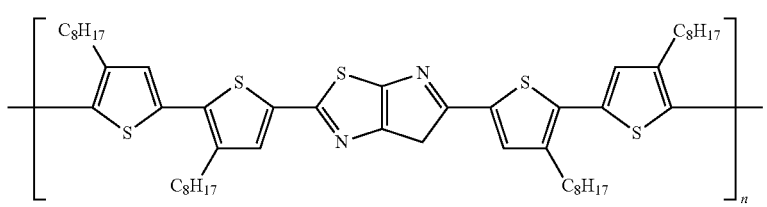
[45]
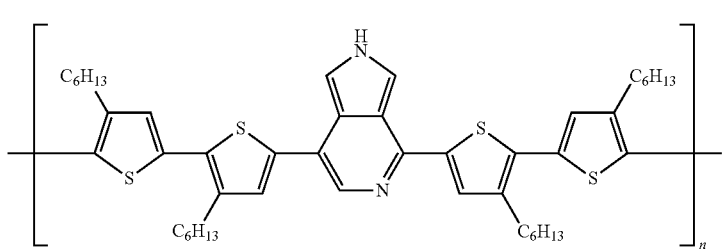
[46]

-continued
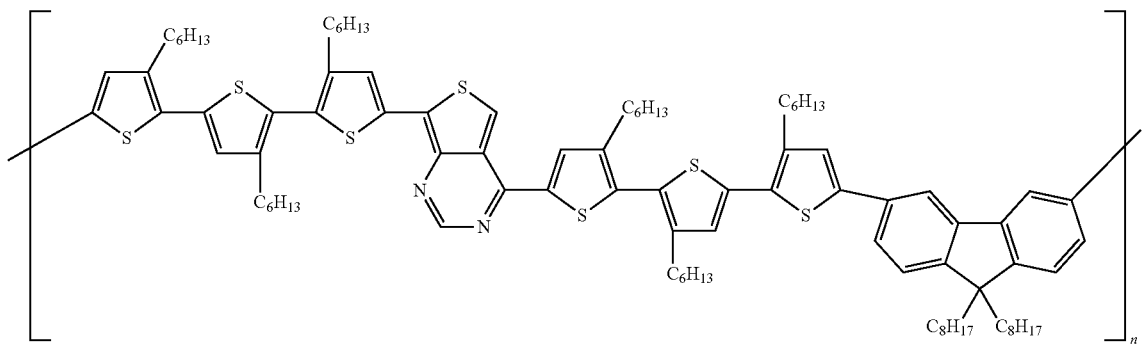
[47]
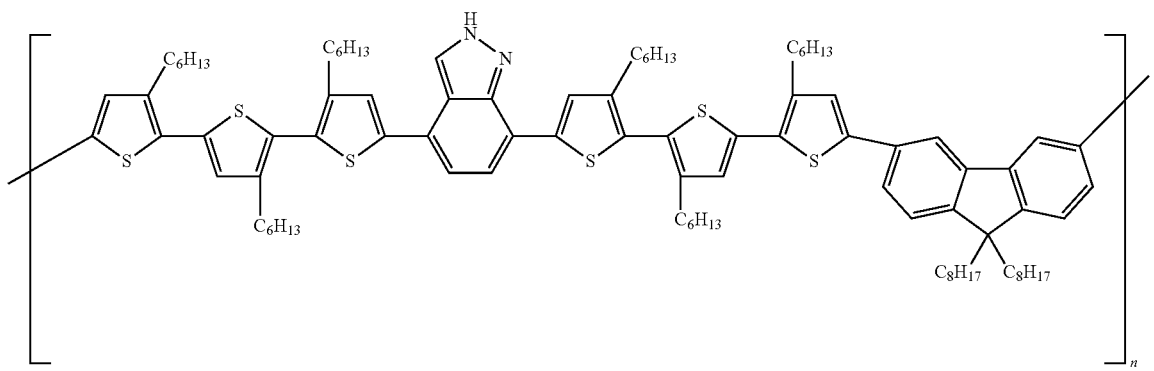
[48]
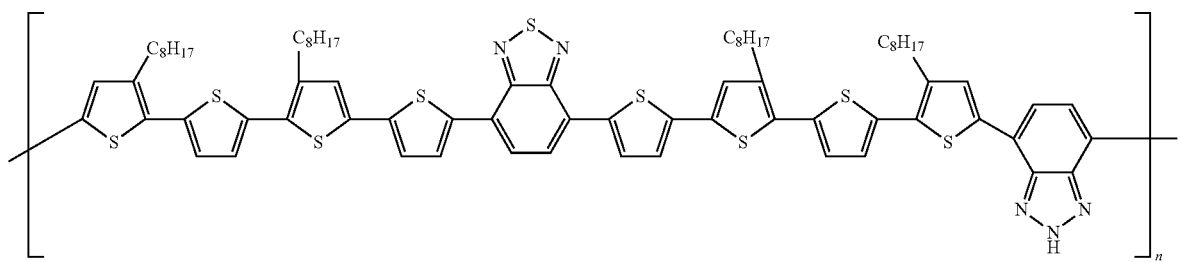
[49]
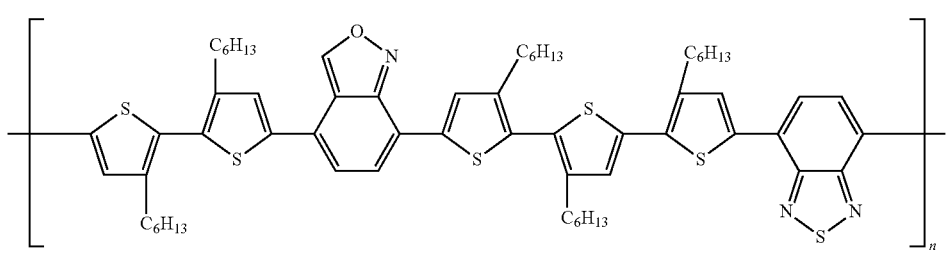
[50]
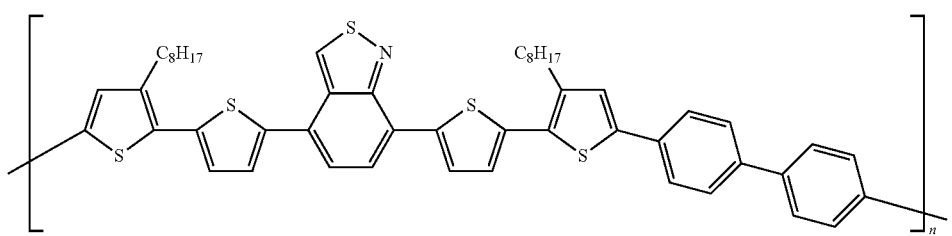
[51]

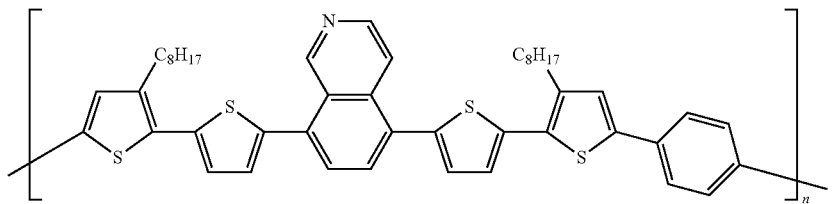
[52]
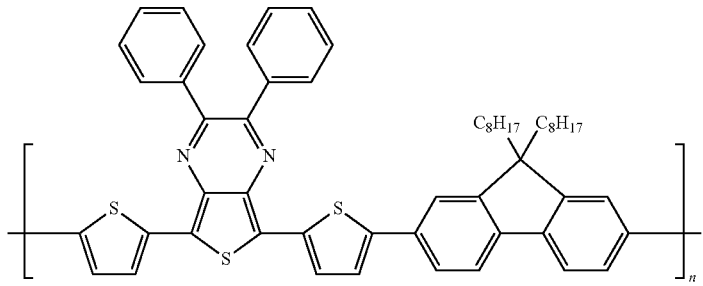
[53]
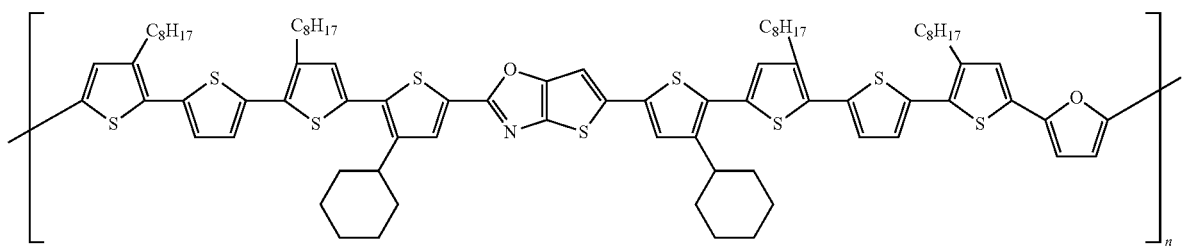
[54]
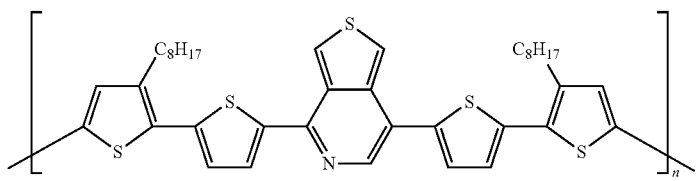
[55]
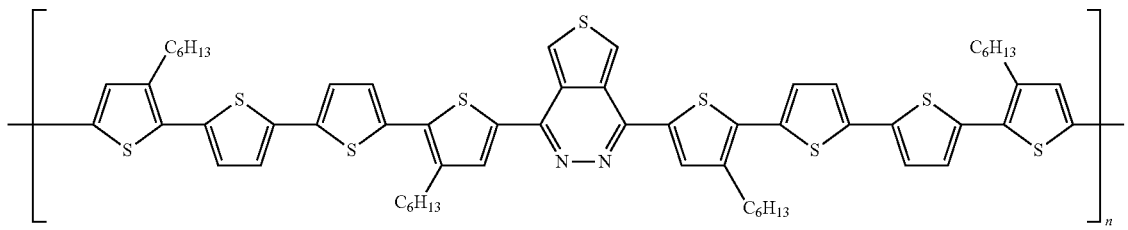
[56]
* * * * *